United States Patent
Numata et al.

(10) Patent No.: US 6,623,907 B2
(45) Date of Patent: *Sep. 23, 2003

(54) RADIATION-SENSITIVE RESIN COMPOSITION

(75) Inventors: Jun Numata, Tokyo (JP); Aki Suzuki, Tokyo (JP); Hiromichi Hara, Tokyo (JP); Norihiro Natsume, Tokyo (JP); Kiyoshi Murata, Tokyo (JP); Masafumi Yamamoto, Tokyo (JP); Akimasa Soyano, Tokyo (JP); Toru Kajita, Tokyo (JP); Tsutomu Shimokawa, Tokyo (JP)

(73) Assignee: JSR Corporation, Tokyo (JP)

( * ) Notice: Subject to any disclaimer, the term of this patent is extended or adjusted under 35 U.S.C. 154(b) by 75 days.

This patent is subject to a terminal disclaimer.

(21) Appl. No.: 09/774,714

(22) Filed: Feb. 1, 2001

(65) Prior Publication Data

US 2001/0023050 A1 Sep. 20, 2001

(30) Foreign Application Priority Data

Feb. 4, 2000 (JP) ........................................ 2000-028456
Sep. 8, 2000 (JP) ........................................ 2000-273962

(51) Int. Cl.$^7$ .............................................. G03F 7/004
(52) U.S. Cl. ................................ 430/270.1; 430/281.1; 430/326; 430/910; 430/927
(58) Field of Search ......................... 430/270.1, 326, 430/325, 927, 914, 921, 910, 281.1

(56) References Cited

U.S. PATENT DOCUMENTS 6,399,272 B1 * 6/2002 Lee et al. ................. 430/270.1
6,410,204 B1 * 6/2002 Kodama et al. .......... 430/270.1
2001/0023050 A1 * 9/2001 Numata et al. ........... 430/270.1
2002/0012872 A1 * 1/2002 Kobayashi et al. ....... 430/270.1

FOREIGN PATENT DOCUMENTS

| EP | 0 819 981 A1 | 1/1998 |
| EP | 0 849 634 A1 | 6/1998 |
| EP | 0 959 389 A1 | 11/1999 |
| EP | 1 085 379 A1 | 3/2001 |
| JP | 59-045439 | 3/1984 |
| JP | 60-052845 | 3/1985 |
| JP | 2-025850 | 1/1990 |
| JP | 8-316888 | 11/1996 |

\* cited by examiner

Primary Examiner—Janet Baxter
Assistant Examiner—Yvette C. Thornton
(74) Attorney, Agent, or Firm—Piper Rudnick LLP; Steven B. Kelber

(57) ABSTRACT

A positive-tone radiation-sensitive resin composition comprising: (A) a low molecular weight compound having at least one amino group in which the nitrogen atom has at least one hydrogen atom bonded thereto and at least one of the hydrogen atoms is replaced by a t-butoxycarbonyl group, (B) a photoacid generator, and (C-1) a resin insoluble or scarcely soluble in alkali which is protected by an acid-dissociable group and becomes soluble in alkali when the acid-dissociable group dissociates or (C-2) an alkali-soluble resin and an alkali solubility control agent is disclosed. Also disclosed is a negative-tone radiation-sensitive resin composition comprising the low molecular weight compound (A), the photoacid generator (B), an alkali-soluble resin (D), and a compound capable of crosslinking with the alkali-soluble resin in the presence of an acid(E). The composition are useful as a chemically amplified resist which effectively responds to various radiations, exhibits superior sensitivity and resolution, forms fine patterns at a high precision and in a stable manner even if the patterns are isolated line patterns.

12 Claims, No Drawings

RADIATION-SENSITIVE RESIN COMPOSITION

BACKGROUND OF THE INVENTION

1. Field of the Invention

The present invention relates to a positive-tone or negative-tone radiation-sensitive resin composition suitable as a resist for ultra-microprocessing using various types of radiation such as ultraviolet radiation, deep ultraviolet radiation, X-rays, and charged particle rays.

2. Description of Background Art

In the field of microfabrication exemplified by the manufacture of an integrated circuit device, development of a lithographic process capable of reproducing microfabrication with a line-width precision of 0.5 μm or less has been pursued in recent years to achieve higher integration. To ensure microfabrication in the order of 0.5 μm or less, a resist which can excellently reproduce patterns with a 0.5 μm or less line-width has been required. However, it is difficult to produce such a minute pattern at high precision by conventional methods using visible light (wavelength: 800–400 nm) or near ultraviolet light (wavelength: 400–300 nm). Because of this, the use of radiation with a shorter wavelength (wavelength: less than 300 nm) has been studied.

As examples of such short wavelength radiation, a bright line spectrum of a mercury lamp (wavelength: 254 nm), far ultraviolet rays typified by a KrF excimer laser (wavelength: 248 nm) and an ArF excimer laser (wavelength: 193 nm), X-rays such as synchrotron radiation, and charged particles such as electron beams can be given. Of these, lithography using an excimer laser is regarded as promising due to high output and high efficiency. Lithography using an excimer laser requires a resist which can reproduce fine patterns with a 0.5 μm or less line-width at high sensitivity and high resolution.

As a resist applicable to far ultraviolet rays such as an excimer laser, a chemically-amplified resist comprising a photoacid generator of which the sensitivity is improved by the catalytic action of an acid formed by the photoacid generator upon irradiation with radioactive rays (hereinafter referred to as "exposure") has been proposed.

As such a chemically amplified resist, Japanese Patent Application Laid-open No. 45439/1984 discloses a combination of a resin protected with a t-butyl group or a t-butoxycarbonyl group and a photoacid generator. Japanese Patent Application Laid-open No. 52845/1985 discloses a combination of a resin protected by a silyl group and a photoacid generator. In addition to these resist compositions, there are a number of reports dealing with chemically amplified resists, such as a resist which contains a resin protected by an acetal group and a photoacid generator (Japanese Patent Application Laid-open No. 25850/1990).

However, since each of these conventional chemically-amplified resists have peculiar problems, various problems in putting these resists to practical use for microfabrication with a line width of 0.25 μm or less have been pointed out. A first problem is a tendency of being affected by an optical proximity effect, which induces a dimensional difference according to pattern density, round pattern ends, and recess phenomenon. A dimensional difference according to pattern density makes it impossible to obtain a designed independent line pattern when the resist is exposed to radiation at an optimum dose for the line-and-space pattern. Such a resist cannot satisfy the requirement for one-chip memory cards in recent logic circuits. A second problem is lack of capability of providing a sufficient focusing allowance to isolated patterns, in particular, failing the resist to satisfy the requirement for logic circuits with a high specialty and commercial value.

For these reasons, a resist which not only excels in sensitivity and resolution, but also exhibits only a minimal optical proximity effect and is capable of forming fine patterns at a high precision and in a stable manner even if the patterns are isolated line patterns, thereby providing isolated line patterns with a sufficient focusing allowance is desired.

An object of the present invention is to provide a photosensitive resin composition useful as a positive-tone or negative-tone chemically amplified resist which effectively responds to various radiations, excels in sensitivity and resolution, exhibits only a minimal optical proximity effect, is capable of forming fine patterns at a high precision and in a stable manner even if the patterns are isolated line patterns, and can provide isolated line patterns with a sufficient focusing allowance.

SUMMARY OF THE INVENTION

According to the present invention, the above object can be achieved by a positive-tone radiation-sensitive resin composition comprising: (A) a low molecular weight compound having at least one amino group in which the nitrogen atom has at least one hydrogen atom bonded thereto and at least one of the hydrogen atoms is replaced by a t-butoxycarbonyl group, (B) a photoacid generator, and (C-1) a resin insoluble or scarcely soluble in alkali which is protected by an acid-dissociable group and becomes soluble in alkali when the acid-dissociable group dissociates or (C-2) an alkali-soluble resin and an alkali solubility control agent (hereinafter referred to as "first invention").

In the above positive tone radiation-sensitive resin composition, the low molecular weight compound (A) is preferably at least one compound selected from the group consisting of the compounds shown by the following formula (1),

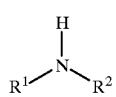

(1)

wherein $R^1$ and $R^2$ individually represent a hydrogen atom, a linear, branched, or cyclic alkyl group, aryl group, or aralkyl group which are either substituted or unsubstituted, compounds having two nitrogen atoms in the molecule, compounds having three or more nitrogen atoms in the molecule, amide group-containing compounds, urea compounds, and nitrogen-containing heterocyclic compounds.

In the above positive tone radiation-sensitive resin composition, the low molecular weight compound (A) is preferably a compound of which the conjugated acid has a pKa determined at 25° C. of 0 or more.

In the above positive tone radiation-sensitive resin composition, the photoacid generator (B) is preferably selected from the group consisting of onium salt compounds, sulfone compounds, sulfonate compounds, sulfonimide compounds, diazomethane compounds, and disulfonylmethane compounds.

The above positive tone radiation-sensitive resin composition preferably further comprises an acid diffusion control agent which is a compound other than the low molecular weight compound (A).

In the above positive tone radiation-sensitive resin composition, the acid diffusion control agent is preferably a nitrogen-containing compound.

In the above positive tone radiation-sensitive resin composition, the resin (C-1) is preferably a resin derived from an alkali-soluble resin having any recurring unit represented by the following formulas (2)–(5), in which the hydrogen atom of an acid functional group is replaced by at least one acid-dissociable group which dissociates in the presence of an acid:

(2)

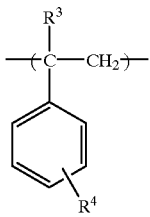

wherein $R^3$ represents a hydrogen atom or a methyl group, $R^4$ represents a hydroxyl group, a carboxyl group, $—R^5COOH$, $—OR^5COOH$, $—OCOR^5COOH$, or $—COOR^5COOH$ ($R^5$ is a group $—(CH_2)_g—$, wherein g is an integer of 1–4), (3)

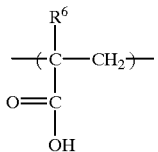

wherein $R^6$ represents a hydrogen atom or a methyl group, (4)

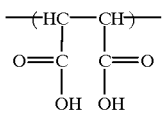

(5)

wherein $R^7$, $R^8$, $R^9$, $R^{10}$, and $R^{11}$ individually represent a hydrogen atom or an alkyl group having 1–4 carbon atoms.

In the above positive tone radiation-sensitive resin composition, the acid-dissociable group is preferably selected from the group consisting of a substituted methyl group, 1-substituted ethyl group, 1-substituted n-propyl group, 1-branched alkyl group, silyl group, germyl group, alkoxycarbonyl group, acyl group, and cyclic acid-dissociable group.

In the above positive tone radiation-sensitive resin composition, the resin (C-1) is preferably a resin having an alicyclic structure in the main chain and/or side chain and a carboxylic acid anhydride structure in the side chain.

In the above positive tone radiation-sensitive resin composition, the resin (C-1) is preferably an acid-dissociable group-containing resin having the following recurring unit (I) and recurring unit (II), which turns alkali soluble when the acid-dissociable group dissociates:

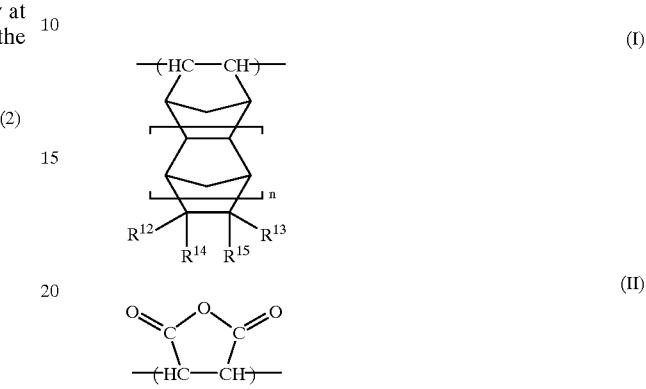

wherein $R^{12}$ and $R^{13}$ individually represent a hydrogen atom, a linear or branched alkyl group having 1–10 carbon atoms, or a linear or branched fluoroalkyl group having 1–10 carbon atoms, $R^{14}$ and $R^{15}$ individually represent a hydrogen atom, a linear or branched alkyl group having 1–10 carbon atoms, a linear or branched fluoroalkyl group having 1–10 carbon atoms, a monovalent oxygen-containing polar group, or a monovalent nitrogen-containing polar group, or $R^{14}$ and $R^{15}$ in combination form a carboxylic acid anhydride group, and n is an integer of 0–2.

In the above positive tone radiation-sensitive resin composition, the resin (C-1) is preferably an acid-dissociable group-containing resin having the above recurring unit (I) and recurring unit (II), and at least one of the following recurring unit (III) and recurring unit (IV), which turns alkali soluble when the acid-dissociable group dissociates:

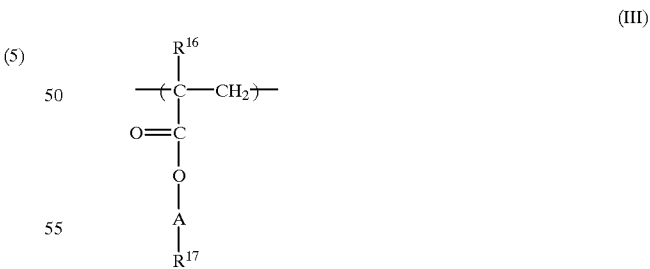

wherein $R^{16}$ represents a hydrogen atom, a linear or branched alkyl group having 1–4 carbon atoms, a linear or branched alkoxyl group having 1–4 carbon atoms, or a linear or branched hydroxyalkyl group having 1–4 carbon atoms, A represents a single bond, a methylene group, or a linear or branched alkylene group with the main chain having 2–4 carbon atoms, $R^{17}$ represents any one of the groups shown by the following formula (i), (ii), or (iii), (i)

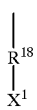

(ii)

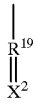

(iii)

wherein $R^{18}$ represents a divalent alicyclic hydrocarbon group having 4–20 carbon atoms, $X^1$ represents a monovalent oxygen-containing polar group or a monovalent nitrogen-containing polar group, $R^{19}$ represents a trivalent alicyclic hydrocarbon group having 4–20 carbon atoms, $X^2$ represents a divalent oxygen-containing polar group or a divalent nitrogen-containing polar group, $R^{20}$ represents a tetravalent alicyclic hydrocarbon group having 4–20 carbon atoms, and $X^3$ represents a trivalent oxygen-containing polar group or a trivalent nitrogen-containing polar group, (IV)

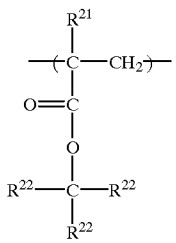

wherein $R^{21}$ represents a hydrogen atom, a linear or branched alkyl group having 1–4 carbon atoms, a linear or branched alkoxyl group having 1–4 carbon atoms, or a linear or branched hydroxyalkyl group having 1–4 carbon atoms, and $R^{22}$s individually represent a monovalent alicyclic hydrocarbon group having 4–20 carbon atoms, its derivative, or a linear or branched alkyl group having 1–4 carbon atoms, with at least one $R^{22}$ being an alicyclic hydrocarbon group or its derivative, or any two of the $R^{22}$s bond to each other to form a divalent alicyclic hydrocarbon group having 4–20 carbon atoms or its derivative, with the remaining $R^{22}$s being a monovalent alicyclic hydrocarbon group having 4–20 carbon atoms, its derivative, or a linear or branched alkyl group having 1–4 carbon atoms.

In the above positive tone radiation-sensitive resin composition, the resin (C-1) is preferably a resin containing the above recurring unit (III) in which $R^{17}$ is a group shown by the above formula (i) wherein $R^{18}$ representing an alicyclic hydrocarbon group is a group having a skeleton selected from the group consisting of an adamantane skeleton, norbornane skeleton, tricyclodecane skeleton, and tetracyclododecane skeleton, and $X^1$ is a hydroxyl group, or a resin containing the above recurring unit (IV) in which $R^{22}$s representing an alicyclic hydrocarbon group or its derivative are independently a group having a skeleton selected from the group consisting of an adamantane skeleton, norbornane skeleton, tricyclodecane skeleton, and tetracyclododecane skeleton.

The above positive tone radiation-sensitive resin composition preferably further comprises an alicyclic additive selected from the group consisting of adamantane derivatives, deoxycholates, and lithocholates.

The above object can be further achieved in the present invention by a negative-tone radiation-sensitive resin composition comprising: (A) a low molecular weight compound having at least one amino group in which the nitrogen atom has at least one hydrogen atom bonded thereto and at least one of the hydrogen atoms is replaced by a t-butoxycarbonyl group, (B) a photoacid generator, (D) an alkali-soluble resin, and (E) a compound capable of crosslinking with the alkali-soluble resin in the presence of an acid (hereinafter referred to as "second invention").

In the above negative tone radiation-sensitive resin composition, the low molecular weight compound (A) is preferably at least one compound selected from the group consisting of the compounds shown by the above formula (1), compounds having two nitrogen atoms in the molecule, compounds having three or more nitrogen atoms in the molecule, amide group-containing compounds, urea compounds, and nitrogen-containing heterocyclic compounds.

In the above negative tone radiation-sensitive resin composition, the low molecular weight compound (A) is preferably a compound of which the conjugated acid has a pKa determined at 25° C. of 0 or more.

In the above negative tone radiation-sensitive resin composition, the photoacid generator (B) is preferably selected from the group consisting of onium salt compounds, sulfone compounds, sulfonate compounds, sulfonimide compounds, diazomethane compounds, and disulfonylmethane compounds.

The above negative tone radiation-sensitive resin composition preferably further comprises an acid diffusion control agent which is a compound other than the low molecular weight compound (A).

In the above negative tone radiation-sensitive resin composition, the acid diffusion control agent is preferably a nitrogen-containing compound.

In the above negative tone radiation-sensitive resin composition, the alkali-soluble resin is preferably a resin having any recurring unit represented by the above formulas (2)–(5), in which the hydrogen atom of an acid functional group is replaced by at least one acid-dissociable group which dissociates in the presence of an acid.

In the above negative tone radiation-sensitive resin composition, the compound (E) capable of crosslinking with the alkali-soluble resin in the presence of an acid is preferably a compound having at least one group represented by the following formulas (6)–(10):

(6)

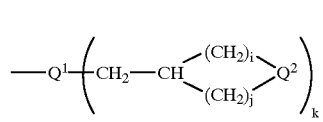

wherein k is an integer 1 or 2, $Q^1$ indicates a single bond, —O—, —S—, —COO—, or —NH— when k=1 and a trivalent nitrogen atom when k=2, $Q^2$ is —O— or —S—, i is an integer of 0–3, and j is an integer of 1–3, provided that i+j=1–4,

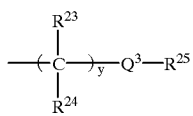

(7)

wherein $Q^3$ is —O—, —CO—, or —COO—, $R^{23}$ and $R^{24}$ individually represent a hydrogen atom or alkyl group having 1–4 carbon atoms, $R^{25}$ represents an alkyl group having 1–5 carbon atoms, aryl group having 6–12 carbon atoms, or aralkyl group having 7–14 carbon atoms, and y is an integer of 1 or more,

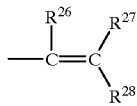

(8)

wherein $R^{26}$, $R^{27}$, and $R^{28}$ individually represent a hydrogen atom or an alkyl group having 1–4 carbon atoms,

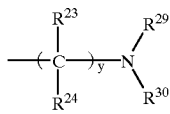

(9)

wherein $R^{23}$ and $R^{24}$ are the same as defined in the formula (7), $R^{29}$ and $R^{30}$ individually represent an alkyl group having 1–5 carbon atoms or an alkylol group having 1–5 carbon atoms, and y is an integer of 1 or more, and

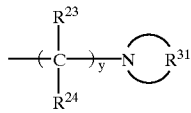

(10)

wherein $R^{23}$ and $R^{24}$ are the same as defined in the formula (7), $R^{31}$ represents a divalent organic group having a hetero atom selected from oxygen atom, sulfur atom, and nitrogen atom, and y is an integer of 1 or more.

Other objects, features and advantages of the invention will herein after become more readily apparent from the following description.

DETAILED DESCRIPTION OF THE INVENTION AND PREFERRED EMBODIMENTS

Component (A)

The component (A) in the first and second invention is a compound having at least one amino group with a nitrogen atom having at least one hydrogen atom bonded thereto (hereinafter referred to as "amino compound (a)"), wherein at least one of the hydrogen atoms bonded to the nitrogen atom is replaced by a t-butoxycarbonyl group (hereinafter referred to as "Compound (A)").

The "amino group" in the amino compound (a) includes an amino group bonded to a carbonyl group. When the amino compound (a) in Compound (A) has two or more amino groups with a nitrogen atom having at least one hydrogen atom bonded thereto and two or more t-butoxycarbonyl groups, these t-butoxycarbonyl groups may be bonded to either the same or different nitrogen atom.

In the radiation-sensitive resin composition used as a chemically-amplified resist, it is known that an acid diffusion control agent which controls diffusion of acid produced from a radiation-sensitive acid generator in the resist coating and suppresses undesired chemical reactions in non-exposure regions can not only improve storage stability of the resin composition and resolution as a resist, but also prevent the line width of the resist pattern from changing due to variation of post-exposure delay (PED) from exposure to development, whereby a composition with remarkably superior process stability can be obtained.

The present inventors have conducted extensive studies about the acid diffusion control agent used in a radiation-sensitive resin composition containing a radiation-sensitive acid generator. As a result, the inventors have found that various performances of the radiation-sensitive resin composition as a resist are remarkably improved by using a low molecular weight compound having a basic amino acid protected by an acid dissociable t-butoxycarbonyl group. This finding has led to the completion of the present invention.

As examples of the amino compound (a), a compound shown by the following formula (1) (hereinafter referred to as "nitrogen-containing compound (I)"), a compound having two nitrogen atoms in the molecule (hereinafter referred to as "nitrogen-containing compound (II)"), a compound having three or more nitrogen atoms in the molecule (hereinafter referred to as "nitrogen-containing compound (III)"), an amide group-containing compound, urea compound, nitrogen-containing heterocyclic compound, and the like can be given:

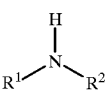

(1)

wherein $R^1$ and $R^2$ individually represent a hydrogen atom, a linear, branched, or cyclic alkyl group, aryl group, or aralkyl group which are either substituted or unsubstituted.

Examples of the nitrogen-containing compound (I) include monoalkylamines such as n-hexylamine, n-heptylamine, n-octylamine, n-nonylamine, n-decylamine, and cyclohexylamine; dialkylamines such as di-n-butylamine, di-n-pentylamine, di-n-hexylamine, di-n-heptylamine, di-n-octylamine, di-n-nonylamine, di-n-decylamine, cyclohexyl methylamine, and dicyclohexylamine; aromatic amines such as aniline, N-methylaniline, 2-methylaniline, 3-methylaniline, 4-methylaniline, 4-nitroaniline, diphenylamine, 1-naphthylamine, 2-(4-aminophenyl)-2-(3-hydroxyphenyl)propane, and 2-(4-aminophenyl)-2-(4-hydroxyphenyl)propane; alkanolamines such as ethanolamine and diethanolamine; 1-adamantylamine, N-methyl-1-adamantylamine, and the like.

Examples of the nitrogen-containing compound (II) include ethylenediamine, tetramethylenediamine, hexamethylenediamine, 1,7-diaminoheptane, 1,8-diaminooctane, 1,9-diaminononane, 1,10-diaminodecane, 1,12-diaminododecane, 4,4'-diaminodiphenylmethane, 4,4'-diaminodiphenylether, 4,4'-diaminobenzophenone, 2,2-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, and the like.

As examples of the nitrogen-containing compound (III), 4,4'-diaminodiphenylamine, polyallylamine, polymethacrylamine, a polymer of N-(2-aminoethyl) acrylamide, and the like can be given.

Examples of the amide group-containing compound include formamide, N-methylformamide, acetamide, N-methylacetamide, propionamide, benzamide, pyrrolidone, and the like.

Examples of the urea compound include urea, methylurea, 1,1-dimethylurea, 1,3-dimethylurea, 1,3-diphenylurea, tri-n-butylthiourea, and the like.

Examples of the nitrogen-containing heterocyclic compound include imidazoles such as imidazole, benzimidazole, 2-methylimidazole, 4-methylimidazole, 2-phenylimidazole, 4-phenylimidazole, 2-phenyl-4-methlimidazole, 2-methl-4-phenylimidazole, 2-methylbenzimidazole, 2-phenylbenzimidazole; indole, pyrrole, pyrazole, adenine, guanine, purine, pyrrolidine, piperidine, morpholine, piperazine, and the like.

Of these amino compounds (a), the nitrogen-containing compounds (I), the nitrogen-containing compounds (II) and the nitrogen-containing heterocyclic compounds are preferable. Of the nitrogen-containing compounds (I), dialkylamines and 1-adamantylamines are particularly preferable, with ideal compounds being di-n-octylamine, di-n-nonylamine, di-n-decylamine, dicyclohexylamine, 1-adamantylamine, N-methyl-1-adamantylamine, and the like. Of the nitrogen-containing compounds (II), hexamethylenediamine, 1,7-diaminoheptane, 1,8-diaminooctane, 1,9-diaminononane, 1,10-diaminodecane, 1,12-diaminododecane, 4,4'-diaminodiphenylmethane, and the like are particularly preferable. Imidazoles are particularly preferable nitrogen-containing heterocyclic compounds, with benzimidazole, 2-methylimidazole, 2-phenylbenzimidazole, and the like being ideal compounds.

The conjugated acid of the amino acid (a) has a pKa (determined at 25° C., hereinafter the same) preferably of 0 or more. If a compound of which the conjugated acid has a pKa of less than 0 such as an imide compound is used, resolution and pattern configuration of the resulting resist may be impaired.

Examples of particularly preferable compound (A) used in the present invention include N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole.

The molecular weight of the compound (A) is usually 100–3,000, preferably 200–2,000, and particularly preferably 250–1,000.

In the present invention, the compounds (A) may be used either individually or in combination of two or more.

Component (B)

The component (B) of the present invention is a photoacid generator which generates an acid upon exposure (hereinafter referred to as "acid generator (B)").

As examples of the acid generator (B), (1) onium salt compounds, (2) sulfone compounds, (3) sulfonate compounds, (4) sulfonimide compounds, (5) diazomethane compounds, and (6) disulfonylmethane compound can be given.

Examples of these acid generators (B) are as follows:
(1) Onium salt compounds:

As examples of onium salts, iodonium salts, sulfonium salts (including tetrahydrothiophenium salts), phosphonium salts, diazonium salts, ammonium salt, pyridinium salts, and the like can be given.

Specific examples of onium salts include:

bis(4-t-butylphenyl)iodonium trifluoromethanesulfonate,
bis(4-t-butylphenyl)iodonium nonafluoro-n-butanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium p-toluenesulfonate,
bis(4-t-butylphenyi)iodonium benzenesulfonate,
bis(4-t-butylphenyl)iodonium 10-camphorsulfonate,
bis(4-t-butylphenyl)iodonium n-octanesulfonate,
bis(4-t-butylphenyl)iodonium 2-trifluoromethylbenzenesulfonate,
bis(4-t-butylphenyl)iodonium 4-trifluoromethyl-benzenesulfonate,
bis(4-t-butylphenyl)iodonium 2,4-difluorobenzenesulfonate,
diphenyliodonium trifluoromethanesuifonate,
diphenyliodonium nonafluoro-n-butanesulfonate,
diphenyliodonium pyrenesulfonate,
diphenyliodonium n-dodecylbenzenesulfonate,
diphenyliodonium p-toluenesulfonate,
diphenyliodonium benzenesulfonate,
diphenyliodonium 10-camphorsulfonate,
diphenyliodonium n-octanesulfonate,
diphenyliodonium 2-trifluoromethylbenzenesulfonate,
diphenyliodonium 4-trifiuoromethylbenzenesulfonate,
diphenyliodonium 2,4-difluorobenzenesulfonate,
triphenyisulfonium trifluoromethanesulfonate,
triphenylsulfonium nonafluoro-n-butanesulfonate,
triphenylsulfonium pyrenesulfonate,
triphenylsulfonium n-dodecylbenzenesulfonate,
triphenylsulfonium p-toluenesulfonate,
triphenylsulfonium benzenesulfonate,
triphenylsulfonium 10-camphorsulfonate,
triphenylsulfonium n-octanesulfonate,
triphenylsulfonuium 2-trifluoromethylbenzenesulfonate,
triphenylsulfonium 4-trifluorobenzenesulfonate,
triphenylsulfonium 2,4-difluorobenzenesulfonate,
triphenylsulfonium hexafluoroantimonate,
triphenylsulfonium 1-naphthalenesulfonate,
4-t-butylphenyl.diphenylsulfonium trifluoromethanesulfonate,
4-t-butylphenyl.diphenylsulfonium nonafluoro-n-butanesulfonate, 4-t-butylphenyl.diphenylsulfonium pyrenesulfonate,
4-t-butylphenyl.diphenylsulfonium n-dodecylbenzenesulfonate,
4-t-butylphenyl.diphenylsulfonium p-toluenesulfonate,
4-t-butylphenyl.diphenylsulfonium benzenesulfonate,
4-t-butylphenyl.diphenylsulfonium 10-camphorsulfonate,
4-t-butylphenyl.diphenylsulfonium n-octanesulfonate,
4-t-butylphenyl-diphenylsulfonium 2-trifluoromethylbenzenesulfonate, 4-t-butylphenyl.diphenylsulfonium
4-trifluoromethyl-benzenesulfonate,
4-t-butylphenyl.diphenylsulfonium 2,4-difluorobenzenesulfonate,
4-t-butoxyphenyl.diphenylsulfonium nonafluoro-n-butanesulfonate, and 4-hydroxyphenyl-benzyl-methylsulfonium p-toluenesulfonate.

(2) Sulfone compounds:

As examples of sulfone compounds, β-ketosulfone, β-sulfonylsulfone, and α-diazo compounds of these compounds, and the likes can be given.

As specific examples of sulfone compounds, phenacylphenylsulfone, mesitylphenacylsulfone, bis(phenylsulfonyl)methane, 4-trisphenacylsulfone, and the like can be given.

(3) Sulfonate compounds:

As examples of sulfonate compounds, alkyl sulfonate, haloalkyl sulfonate, aryl sulfonate, imino sulfonate, and the like can be given.

As specific examples of sulfonate compounds, benzointosylate, pyrogallol tris(trifluoromethanesulfonate), pyrogallol tris(nonafluoro-n-butanesufonate), pyrogallol tris(methanesulfonate), nitrobenzyl-9,10-diethoxyanthracene-2-sulfonate, α-methylolbenzointosylate, α-methylolbenzoin n-octanesulfonate, α-methylolbenzoin trifluoromethanesulfonate, α-methylolbenzoin n-dodecylsulfonate, and the like can be given.

(4) Sulfonimide compounds:

As examples of sulfonimide compounds, compounds shown by the following formula (11) and the like can be given:

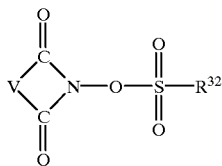

(11)

wherein V represents a divalent group such as an alkylene group, arylene group, or alkoxylene group, and $R^{32}$ represents a monovalent group such as an alkyl group, aryl group, halogenated alkyl group, or halogenated allyl group.

Specific examples of sulfonimide compounds include:
N-(trifluoromethanesulfonyloxy)succinimide,
N-(trifluoromethanesulfonyloxy)phthalimide,
N-(trifluoromethanesulfonyloxy)diphenylimaleimide,
N-(trifluoromethanesulfonyloxy)bicyclo[2.2.1]hept-5-ene-2,3-dicarboxyimide,
N-(trifluoromethanesulfonyloxy)-7-oxabicyclo [2.2.1]hept-5-ene-2,3-dicarboxyimide,
N-(trifluoromethanesulfonyloxy)bicyclo[2.2.1]heptan-5,6-oxy-2,3-dicarboxyimide,
N-(trifluoromethanesulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide,
N-(p-toluenesulfonyloxy)bicyclo[2.2.1]heptane-5,6-oxy-2,3-dicarboxyimide,
N-(p-toluenesulfonyloxy)naphthylimide,
N-(2-trifluororethylbenzenesulfonyloxy)succinimide,
N-(2-trifluoromethylbenzenesulfonyloxy)phthalimide,
N-(2-trifluoromethylbenzenesulfonyloxy)diphenylmaleimide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo[2.2.1]hept-5-ene-2,3-dicarboxyimide,
N-(2-trifluoromethylbenzenesulfonyloxy)bicyclo[2.2.1]heptan-5,6-oxy-2,3-dicarboxyimide,
N-(2-trifluoromethylbenzenesulfonyloxy)naphthylimide,
N-(4-trifluoromethylbenzenesulfonyloxy)succinimide,
N-(4-trifluoromethylbenzenesulfonyloxy)phthalimide,
N-(4-trifluoromethylbenzenesulfonyloxy)diphenylmaleimide,
N-(4-trifluoromethylbenzenesulfonyloxy)bicyclo[2.2.1]hept-5-ene-2,3-dicarboxyimide,
N-(4-trifluoromethylbenzenesulfonyloxy)-7-oxabicyclo[2.2.1]hept-5-ene-2,3-dicarboxyimide,
N-(4-trifluoromethylbenzenesulfonyloxy)bicyclo[2.2.1]heptane-5,6-oxy-2,3-dicarboxyimide,
N-(4-trifluoromethylbenzenesulfonyloxy)naphthylimide,
N-(nonafluoro-n-butanesulfonyloxy)succinimide,
N-(nonafluoro-n-butanesulfonyloxy)phthalimide,
N-(nonafluoro-n-butanesulfonyloxy)diphenylmaleimide,
N-(nonafluoro-n-butanesulfonyloxy)bicyclo[2.2.1]hept-5-ene-2,3-dicarboxyimide,
N-(nonafluoro-n-butanesulfonyloxy)-7-oxabicyclo[2.2.1]hept-5-ene-2,3-dicarboxyimide,
N-(nonafluoro-n-butanesulfonyloxy)bicyclo[2.2.1]heptan-5,6-oxy-2,3-dicarboxyimide,
N-(nonafluoro-n-butanesulfonyloxy)naphthylimide,
N-(pentafluorobenzenesulfonyloxy)succinimide,
N-(pentafluorobenzenesulfonyloxy)phthalimide,
N-(pentafluorobenzenesulfonyloxy)diphenylmaleimide,
N-(pentafluorobenzenesulfonyloxy)bicyclo[2.2.1]hept-5-ene-2,3-dicarboxyimide,
N-(pentafluorobenzenesulfonyloxy)-7-oxabicyclo[2.2.1]hept-5-ene-2,3-dicarboxyimide, N-(pentafluorobenzenesulfonyloxy)bicyclo[2.2.1]heptan-5,6-oxy-2,3-dicarboxyimide, N-(pentafluorobenzenesulfonyloxy)naphthylimide, N-(perfluoro-n-octanesulfonyloxy)succinimide, N-(perfluoro-n-octanesulfonyloxy)phthalimide, N-(perfluoro-n-octanesulfonyloxy)diphenylmaleimide, N-(perfluoro-n-octanesulfonyloxy)bicyclo[2.2.1]hept-5-ene-2,3-dicarboxyimide, N-(perfluoro-n-octanesulfonyloxy)-7-oxabicyclo[2.2.1]hept-5-ene-2,3-dicarboxyimide, N-(perfluoro-n-octanesulfonyloxy)bicyclo[2.2.1]heptane-5,6-oxy-2,3-dicarboxyimide, N-(perfluoro-n-octanesulfonyloxy)naphthylimide, and N-{(5-methyl-5-carboxymethanebicyclo[2.2.1]hept-2-yl)-sulfonyloxy}succinimide.

(5) Diazomethane compounds:

As examples of diazomethane compounds, compounds shown by the following formula (12) and the like can be given:

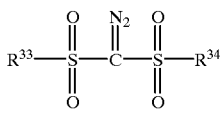

(12)

wherein $R^{33}$ and $R^{34}$ individually represent a monovalent group such as an alkyl group, aryl group, halogenated alkyl group, and halogenated allyl group.

As specific examples of diazomethane compounds, bis(trifluoromethanesulfonyl)diazomethane, bis(cyclohexanesulfonyl)diazomethane, bis(benzenesulfonyl)diazomethane, bis(p-toluenesulfonyl)diazomethane, methanesulfonyl-p-toluenesulfonyldiazomethane, cyclohexanesulfonyl-1,1-dimethylethylsulfonyldiazomethane, bis(1,1-dimethyletanesulfonyl)diazomethane, bis(3,3-dimethyl-1,5-dioxaspiro[5.5]dodecane-8-sulfonyl)-diazomethane, bis(1,4-dioxaspiro[4.5]decane-7-sulfonyl)diazomethane, and the like can be given.

(6) Disulfonylmethane compounds

As examples of disulfonylmethane compounds, a compound shown by the following formula (13) can be given:

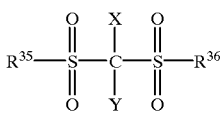

(13)

wherein $R^{35}$ and $R^{36}$ individually represent a linear or branched monovalent aliphatic hydrocarbon group, a cycloalkyl group, aryl group, aralkyl group, or other monovalent organic groups having a hetero atom, X and Y individually represent an aryl group, a hydrogen atom, a linear or branched monovalent aliphatic hydrocarbon group, or other monovalent organic groups having a hetero atom, provided that at least one of X and Y represents an aryl group, or X and Y bond to form a monocyclic or polycyclic ring having at least one unsaturated bond, or X and Y bond to form a group shown by the following formula:

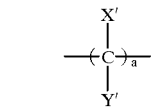

wherein X's and Y's individually represent a hydrogen atom, halogen atom, a linear or branched alkyl group, cycloalkyl group, aryl group, or aralkyl group, or X' and Y' each bonded to the same or different carbon atoms to form a monocyclic carbon structure, and a is an integer from 2 to 10.

As an acid generator (B), (1) onium salt compounds and (4) sulfonimide compounds are preferable. It is particularly preferable to use at least one compound selected from the group consisting of:

bis(4-t-butylphenyl)iodonium trifluoromethanesulfonate, bis(4-t-butylphenyl)iodonium perfluoro-n-butanesulfonate, bis(4-t-butylphenyl)iodonium p-toluenesulfonate, bis(4-t-butylphenyl)iodonium 10-camphorsulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl)iodonium 2,4-difluorobenzenesulfonate, triphenylsulfonium trifluoromethanesulfonate, triphenylsulfonium perfluoro-n-butanesulfonate, triphenylsulfonium p-toluenesulfonate, triphenylsulfonium 10-camphorsulfonate, triphenylsulfonium 2-trifluoromethylbenzenesulfonate, triphenylsulfonium 4-trifluorobenzenesulfonate, triphenylsulfonium 2,4-difluoromethylbenzensulfonate, N-(trifluoromethylsulfonyloxy)succinimide, N-(trifluoromethylsulfonyloxy)bicyclo[2.2.1]hept-5-ene-2,3-dicarboxyimide, N-(10-camphorsulfonyloxy)succinimide, N-(10-camphorsulfonyloxy)bicyclo[2.2.1]hept-5-ene-2,3-dicarboxyimide, and N-{(5-methyl-5-carboxymethanebicyclo[2.2.1]hept-2-yl)sulfonyloxy}succinimide.

Acid-dissociable Group-containing Resin

The resin insoluble or scarcely soluble in alkali (C-1) which is protected by an acid-dissociable group and becomes alkali soluble when the acid-dissociable group dissociates used in the first invention (hereinafter referred to as "acid-dissociable group-containing resin") is a resin containing at least one acidic functional group, such as a phenolic hydroxyl group, carboxyl group, or the like, of which at least one hydrogen atom is replaced by an acid-dissociable group which dissociates in the presence of an acid. Such a resin is insoluble or scarcely soluble in alkali by itself. The term "insoluble or scarcely soluble in alkali" used herein refers to characteristics in which 50% or more of the initial thickness of a resin film remains after development under alkaline development conditions employed when forming a resist pattern using a resist coating formed from the radiation-sensitive resin composition comprising other acid-dissociable group-containing resins.

As the acid-dissociable group-containing resin used in the first invention, (i) an alkali soluble resin having any recurring unit represented by the formulas (2)–(5) described above of which the hydrogen atom of an acid functional group is replaced by an acid-dissociable group (hereinafter referred to as "resin (i)"), (ii) an acid-dissociable group-containing resin having an alicyclic structure in the main chain and/or side chain and a carboxylic acid anhydride structure in the side chain (hereinafter referred to as "resin (ii)"), and the like can be given. The resin (ii) is responsive not only to a KrF excimer laser (wavelength: 248 nm), but also to an ArF excimer laser (wavelength: 193 nm), and excels in transparency.

As examples of the acid-dissociable group in the resin (i), a substituted methyl group, 1-substituted ethyl group, 1-substituted n-propyl group, 1-branched alkyl group, silyl group, germyl group, alkoxycarbonyl group, acyl group, cyclic acid-dissociable group, and the like can be given.

As examples of a substituted methyl group, a methoxymethyl group, methylthiomethyl group, ethoxymethyl group, ethylthiomethyl group, methoxyethoxymethyl group, benzyloxymethyl group, benzylthiomethyl group, phenacyl group, 4-bromophenacyl group, 4-methoxyphenacyl group, 4-methylthiophenacyl group, a-methylphenacyl group, cyclopropylmethyl group, benzyl group, diphenylmethyl group, triphenylmethyl group, 4-bromobenzyl group, 4-nitrobenzyl group, 4-methoxybenzyl group, 4-methylthiobenzyl group, 4-ethoxybenzyl group, 4-ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of a 1-substituted ethyl group, 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropyloxyethyl group, 1-cyclohexyloxyethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, 1-t-butoxycarbonylethyl group, and the like can be given.

As examples of 1-substituted n-propyl group, 1-methoxy-n-propyl group, 1-ethoxy-n-propyl group, and the like can be given.

As examples of 1-branched alkyl group, an i-propyl group, sec-butyl group, t-butyl group, 1,1-dimethylpropyl group, 1-methylbutyl group, 1,1-dimethylbutyl group, and the like can be given.

As examples of the silyl group, a trimethylsilyl group, ethyldimethylsilyl group, methyldiethylsilyl group, triethylsilyl group, i-propyldimethylsilyl group, methyldi-i-propyl silyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of the germyl group, a trimethylgermyl group, ethyldimethylgermyl group, methyldiethylgermyl group, triethylgermyl group, i-propyldimethylgermyl group, methyldi-i-propylgermyl group, tri-i-propygermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of the alkoxycarbonyl group, methoxycarbonyl group, ethoxycarbonyl group, n-propoxycarbonyl group, i-propoxycarbonyl group, n-butoxycarbonyl group, 2-methylpropoxy carbonyl group, 1-methylpropoxycarbonyl group, t-butoxycarbonyl group, and the like can be given.

As examples of the acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the cyclic acid-dissociable group, a cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, and the like can be given.

Of these acid-dissociable groups, the benzyl group, t-butoxycarbonylmethyl group, 1-methoxyethyl group, 1-ethoxyethyl group, 1-cyclohexyloxyethyl group, 1-ethoxy-n-propyl group, t-butyl group, 1,1-dimethylpropyl group, trimethylsilyl group, t-butoxycarbonyl group, tetrahydropyranyl group, tetrahydrofuranyl group, tetrahydrothiopyranyl group, tetrahydrothiofuranyl group, and the like are preferable.

The amount of the acid-dissociable group introduced into the resin (i) (the amount of the number of acid-dissociable groups in the total number of acidic functional groups and acid-dissociable groups in the acid-dissociable group-containing resin) is preferably 5–100%, and still more preferably 10–100%, although the amount varies depending on types of acid-dissociable group and the alkali-soluble resin into which the acid-dissociable group is introduced.

The resin (i) can be prepared by, for example, a method of introducing one or more acid-dissociable groups into an alkali-soluble resin which has previously been manufactured, a method of (co)polymerizing polymerizable unsaturated monomers having an acid-decomposable group, optionally together with one or more other polymerizable unsaturated monomers, a method of (co)condensing polycondensation components having an acid-decomposable group, optionally together with one or more other polymerizable unsaturated monomers, and the like.

As an example of the polymerizable unsaturated monomers having an acid-dissociable group, a compound having a recurring unit shown by the above-described formulas (2) to (4) of which the hydrogen atom in a phenolic hydroxyl group or carboxyl group is replaced by an acid-dissociable group can be given. As the other polymerizable unsaturated monomers, the same compounds as the other polymerizable unsaturated monomers which will be mentioned later in connection with the alkali-soluble resin can be given. As an example of the polycondensation component having an acid-dissociable group, a compound having a recurring unit shown by the above-described formula (5) in which the hydrogen atom in a phenolic hydroxyl group is replaced by an acid-dissociable group can be given.

The (co)polymerization of the polymerizable unsaturated monomers having an acid-dissociable group in the manufacture of the acid-dissociable group-containing resin is carried out by block polymerization, solution polymerization, precipitation polymerization, emulsion polymerization, suspension polymerization, block-suspension polymerization, or the like using an appropriate polymerization initiator or catalyst such as a radical polymerization initiator, anionic polymerization catalyst, conjugated anionic polymerization catalyst, cationic polymerization catalyst, or the like according to the type of monomers or reaction media. The (co)condensation of polycondensation components having an acid-dissociable group can be carried out in the presence of an acid catalyst using an aqueous medium or a mixture of water and a hydrophilic solvent.

A branched structure may be introduced into the resin (i) using a polyfunctional monomer having two or more polymerizable unsaturated bonds, as required. As examples of such a polyfunctional monomer, polyfunctional (meth)acrylates disclosed in Japanese Patent Application Laid-open No. 316888/1996, polyfunctional aromatic vinyl compounds such as divinylbenzene and diisopropenylbenzene, and the like can be given.

The above polyfunctional monomers may be used either individually or in combination of two or more.

When using di(meth)acrylate of 1,1-dimethyl ethylene glycol as the polyfunctional monomer, an acid-dissociable branched structure shown by the following formula (14) may be introduced into the acid-dissociable group-containing resin.

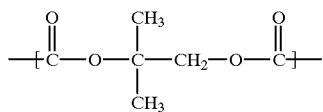

(14)

When the resin (i) has a phenolic hydroxyl group, a branched structure formed by an acetal crosslinking group may be introduced into the acid-dissociable group-containing resin by reacting the phenolic hydroxyl group and one or more divinyl ether compounds. As examples the divinyl ether compound which provides such a branched structure, ethylene glycol divinyl ether, diethylene glycol divinyl ether, cyclohexane-1,4-dimethanol divinyl ether, and the like can be given.

As specific examples of the branched structure formed from an acetal crosslinking group, an acid-dissociable branched structure shown by the following formula (15) can be given:

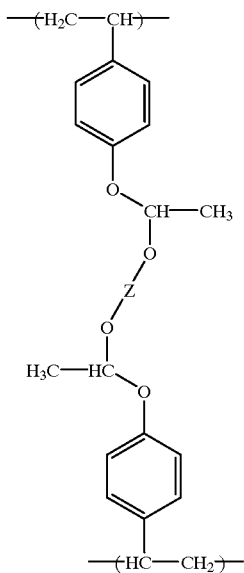

(15)

wherein Z represents a divalent organic group.

The amount of the branched structure introduced into the resin (i) by the polyfunctional monomer and/or acetal crosslinking group is preferably 10 mol % or less of the total amount of recurring units, although such an amount varies depending on the type of branched structure and the type of acid-dissociable group-containing resin into which the branched structure is introduced.

Examples of particularly preferable resin (i) include a poly(p-hydroxystyrene) in which part or all of the hydrogen atoms in the phenolic hydroxyl groups are replaced by the above-mentioned acid-dissociable groups, a copolymer of p-hydroxystyrene and/or p-hydroxy-α-methylstyrene and (meth)acrylic acid in which part or all of the hydrogen atoms in the phenolic hydroxyl groups and/or carboxyl groups are replaced by the above-mentioned acid-dissociable groups, and a resin produced by introducing the above-described branched structure into these resins.

As the alicyclic structure in the resin (ii), an alicyclic structure having a bridged skeleton containing 4–20 carbon atoms such as an adamantane skeleton, norbornane skeleton, tricyclodecane skeleton, or tetracyclododecane skeleton; an alicyclic structure containing 4–20 carbon atoms derived from a cycloalkane such as cyclobutane, cyclopentane, cyclohexane, cycloheptane, or cyclooctane; and the like can be given.

Of these alicyclic structures, the alicyclic structure having a bridged skeleton, particularly the alicyclic structure having an adamantane skeleton, norbornane skeleton, tricyclodecane skeleton, or tetracyclododecane skeleton is preferable.

The carboxylic acid anhydride structure in the resin (ii) indicates a —CO—O—CO—structure which is formed from two carboxyl groups with deletion of one $H_2O$ molecule. This structure bonds either directly or via an appropriate organic group to carbon atoms in the main chain of the resin (ii). The carboxylic acid anhydride groups may be present either in the alicyclic structure or other structures, or in both structures of the resin (ii).

The following resins can be given as specific examples of the resin (ii) preferably used in the present invention.

(ii-1) An acid-dissociable group-containing resin insoluble or scarcely soluble in alkali and turning alkali soluble when the acid-dissociable group dissociates, containing the following recurring unit (I) or recurring unit (II) (hereinafter referred to as "resin (ii-1)"):

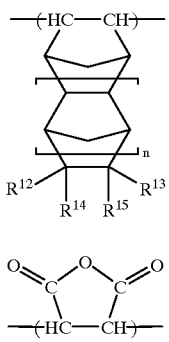
(I)

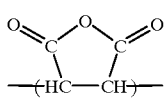
(II)

wherein $R^{12}$ and $R^{13}$ individually represent a hydrogen atom, a linear or branched alkyl group having 1–10 carbon atoms, or a linear or branched fluoroalkyl group having 1–10 carbon atoms, $R^{14}$ and $R^{15}$ individually represent a hydrogen atom, a linear or branched alkyl group having 1–10 carbon atoms, a linear or branched fluoroalkyl group having 1–10 carbon atoms, a monovalent oxygen-containing polar group, or a monovalent nitrogen-containing polar group, or $R^{14}$ and $R^{15}$ in combination form a carboxylic acid anhydride group, and n is an integer of 0–2.

(ii-2) An acid-dissociable group-containing resin insoluble or scarcely soluble in alkali and turning alkali soluble when the acid-dissociable group dissociates, containing the above recurring unit (I) and recurring unit (II), and the following recurring unit (III) and/or recurring unit (IV) (hereinafter referred to as "resin (ii-2)"):

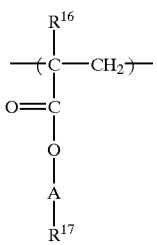
(III)

wherein $R^{16}$ represents a hydrogen atom, a linear or branched alkyl group having 1–4 carbon atoms, a linear or branched alkoxyl group having 1–4 carbon atoms, or a linear or branched hydroxyalkyl group having 1–4 carbon atoms, A represents a single bond, a methylene group, or a linear or branched alkylene group with the main chain having 2–4 carbon atoms, $R^{17}$ represents any one of the groups shown by the following formula (i), (ii), or (iii),

(i)

(ii)

(iii)

wherein $R^{18}$ represents a divalent alicyclic hydrocarbon group having 4–20 carbon atoms, $X^1$ represents a monovalent oxygen-containing polar group or a monovalent nitrogen-containing polar group, $R^{19}$ represents a trivalent alicyclic hydrocarbon group having 4–20 carbon atoms, $X^2$ represents a divalent oxygen-containing polar group or a divalent nitrogen-containing polar group, $R^{20}$ represents a tetravalent alicyclic hydrocarbon group having 4–20 carbon atoms, and $X^3$ represents a trivalent oxygen-containing polar group or a trivalent nitrogen-containing polar group,

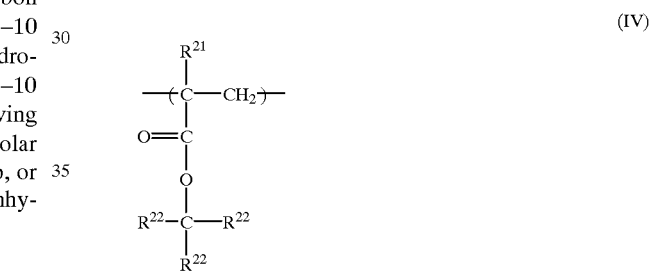
(IV)

wherein $R^{21}$ represents a hydrogen atom, a linear or branched alkyl group having 1–4 carbon atoms, a linear or branched alkoxyl group having 1–4 carbon atoms, or a linear or branched hydroxyalkyl group having 1–4 carbon atoms, and $R^{22}$s individually represent a monovalent alicyclic hydrocarbon group having 4–20 carbon atoms, its derivative, or a linear or branched alkyl group having 1–4 carbon atoms, with at least one $R^{22}$ being an alicyclic hydrocarbon group or its derivative, or any two of the $R^{22}$s bond to each other to form a divalent alicyclic hydrocarbon group having 4–20 carbon atoms or its derivative, with the remaining $R^{22}$s being a monovalent alicyclic hydrocarbon group having 4–20 carbon atoms, its derivative, or a linear or branched alkyl group having 1–4 carbon atoms.

The preferable resins (ii) will be described below.

In the recurring unit (I) of the resin (ii-1) or resin (ii-2), given as examples of the linear or the branched alkyl group having 1–10 carbon atoms represented by $R^{12}$, $R^{13}$, $R^{14}$, or $R^{15}$ are a methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, n-decyl group, and the like.

Of these, a methyl group, ethyl group, n-propyl group, n-butyl group, and n-hexyl group are preferable.

Given as examples of the linear or the branched fluoro alkyl group having 1–10 carbon atoms represented by $R^{12}$, $R^{13}$, $R^{14}$, or $R^{15}$ are a fluoromethyl group, difluoromethyl group, trifluoromethyl group, 1-fluoroethyl group, 1,1-difluoroethyl group, 2, 2, 2-trifluoroethyl group, pentafluoroethyl group, 1-fluoro-n-propyl group, 1,1-difluoro-n-propyl group, 3,3,3-trifluoro-n-propyl group, 3,3,3,2,2-pentafluoro-n-propyl group, perfluoro-n-propyl group, 1-fluoro-i-propyl group, 2-trifluoro-i-propyl group, perfluoro-i-propyl group, 1-fluoro-n-butyl group, 1,1-difluoro-n-butyl group, 4,4,4-trifluoro-n-butyl group, 4,4,4,3,3-pentafluoro-n-butyl group, 4,4,4,3,3,2,2-heptafluoro-n-butyl group, perfluoro-n-butyl group, 2-fluoro-2-methylpropyl group, 1-fluoro-1-methylpropyl group, 1-fluoro-n-pentyl group, 1,1-difluoro-n-pentyl group, 5,5,5-trifluoro-n-pentyl group, 1-fluoro-n-hexyl group, 1,1-difluoro-n-hexyl group, 6,6,6-trifluoro-n-hexyl group, 1-fluoro-n-heptyl group, 1,1-difluoro-n-heptyl group, 7,7,7-trifluoro-n-heptyl group, 1-fluoro-n-octyl group, 1,1-difluoro-n-octyl group, 8,8,8-trifluoro-n-octyl group, 2-fluoro-2-ethylhexyl group, 1-fluoro-n-nonyl group, 1,1-difluoro-n-nonyl group, 9,9,9-trifluoro-n-nonyl group, 1-fluoro-n-decyl group, 1,1-difluoro-n-decyl group, and 10,10,10-trifluoro-n-decyl group.

Of these fluoroalkyl groups, a fluoromethyl group, difluoromethyl group, trifluoromethyl group, 1,1-difluoroethyl group, 2,2,2-trifluoroethyl group, and 1-fluoro-i-propyl are preferable.

The following groups are given as examples of the monovalent oxygen-containing polar group represented by $R^3$ or $R^4$.

The above-described acid-dissociable groups and aryloxy carbonyl groups having 7–11 carbon atoms such as a phenoxycarbonyl group, 4-t-butylphenoxycarbonyl group, and 1-naphthyloxycarbonyl group; aralkyloxycarbonyl groups having 8–12 carbon atoms such as a benzyloxycarbonyl group, 4-t-butylbenzyloxycarbonyl group, phenethyloxycarbonyl group, and 4-t-butylphenethyloxycarbonyl group; linear, branched, or cyclic 1-alkyloxyethoxycarbonyl groups having 4–13 carbon atoms such as a 1-methoxyethoxycarbonyl group, 1-ethoxyethoxycarbonyl group, 1-n-propoxyethoxycarbonyl group, 1-i-propoxyethoxycarbonyl group, 1-n-butoxyethoxycarbonyl group, 1-(2-methylpropoxy)ethoxycarbonyl group, 1-(1-methylpropoxy)ethoxycarbonyl group, 1-t-butoxyethoxycarbonyl group, 1-cyclohexyloxyethoxycarbonyl group, and 1-(4-t-butylcyclohexyloxy)ethoxycarbonyl group; 1-aryloxyethoxycarbonyl groups having 9–13 carbon atoms such as such as a 1-phenoxyethoxycarbonyl group, 1-(4-t-butylphenoxy)ethoxycarbonyl group, and 1-(1-naphthyloxy)ethoxycarbonyl group; 1-aralkyloxyethoxycarbonyl groups having 10–14 carbon atoms such as a 1-benzyloxyethoxycarbonyl group, 1-(4-t-butylbenzyloxy)ethoxycarbonyl group, 1-phenethyloxyethoxycarbonyl group, and 1-(4-t-butylphenethyloxy)ethoxycarbonyl group; linear, branched, or cyclic alkoxycarbonylmethoxycarbonyl groups having 4–14 carbon atoms such as a methoxycarbonylmethoxycarbonyl group, ethoxycarbonylmethoxycarbonyl group, n-propoxycarbonylmethoxycarbonyl group, i-propoxycarbonylmethoxycarbonyl group, n-butoxycarbonylmethoxycarbonyl group, 2-methylpropoxycarbonylmethoxycarbonyl group, 1-methylpropoxycarbonylmethoxycarbonyl group, t-butoxycarbonylmethoxycarbonyl group, cyclohexyloxycarbonylmethoxycarbonyl group, and 4-t-butylcyclohexyloxycarbonylmethoxycarbonyl group; linear, branched, or cyclic alkoxycarbonylmethyl groups having 3–12 carbon atoms such as a methoxycarbonylmethyl group, ethoxycarbonylmethyl group, n-propoxycarbonylmethyl group, i-propoxycarbonylmethyl group, n-butoxycarbonylmethyl group, 2-methylpropoxycarbonylmethyl group, 1-methylpropoxycarbonylmethyl group, t-butoxycarbonylmethyl group, cyclohexyloxycarbonylmethyl group, and 4-t-butylcyclohexyloxycarbonylmethyl group; aryloxycarbonylmethyl groups having 8–12 carbon atoms such as a phenoxycarbonylmethyl group, 4-t-butylphenoxycarbonylmethyl group, and 1-naphthyloxycarbonylmethyl group; aralkyloxycarbonylmethyl groups having 9–18 carbon atoms such as abenzyloxycarbonylmethyl group, 4-t-butylbenzyloxycarbonylmethyl group, phenethyloxycarbonylmethyl group, and 4-t-butylphenethyloxycarbonylmethyl group; 2-aryloxycarbonylethyl groups having 9–17 carbon atoms such as a 2-phenoxycarbonylethyl group, 2-(4-t-butylphenoxycarbonyl)ethyl group, and 2-(1-naphthyloxycarbonyl)ethyl group; 2-aralkyloxycarbonylethyl groups having 10–19 carbon atoms such as a 2-benzyloxycarbonylethyl group, 2-(4-t-butylbenzyloxycarbonyl)ethyl group, 2-phenethyloxycarbonylethyl group, and 2-(4-t-butylphenethyloxycarbonyl)ethyl group; a tetrahydrofuranyloxycarbonyl group; a tetrahydropyranyloxycarbonyl group; linear, branched, or cyclic alkoxycarbonyloxy groups having 2–9 carbon atoms such as a methoxycarbonyloxy group, ethoxycarbonyl oxy group, n-propoxycarbonyloxy group, i-propoxycarbonyloxy group, n-butoxycarbonyloxy group, and cyclohexyloxy carbonyloxy group; linear, branched, or cyclic alkoxycarbonyloxyalkyl groups having 3–10 carbon atoms such as a methoxycarbonyloxymethyl group, ethoxycarbonyloxymethyl group, n-propoxycarbonyloxymethyl group, i-propoxycarbonyloxymethl group, n-butoxycarbonyloxymethl group, and cyclohexyloxycarbonyloxymethyl group; a hydroxyl group; acarboxyl group; linear, branched, orcyclichydroxyalkyl groups having 1–8 carbon atoms such as a 1-hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, 4-hydroxybutyl group, 3-hydroxycyclopentyl group, and 4-hydroxycyclohexyl group; linear, branched, or cyclic alkoxyl groups having 1–8 carbon atoms such as methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group; linear, branched, orcyclicalkoxyalkyl groups having 2–10 carbon atoms such as a methoxymethyl group, ethoxymethyl group, n-propoxymethyl group, i-propoxymethyl group, n-butoxymethyl group, t-butoxymethyl group, cyclopentyloxymethyl group, cyclohexyloxymethyl group; linear or branched 1-alkoxyalkoxy groups having 2–10 carbon atoms such as a 1-methoxyethoxy group, 1-ethoxyethoxy group, 1-n-propoxyethoxy group, 1-n-butoxyethoxy group, 1-cyclopentyloxyethoxy group, 1-cyclohexyloxyethoxy group, 1-methoxypropoxy group, and 1-ethoxypropoxy group; linear or branched (1-alkoxyalkoxy)alkyl groups having 3–11 carbon atoms such as a (1-methoxyethoxy)methyl group, (1-ethoxyethoxy)methyl group, (1-n-propoxyethoxy)methyl group, (1-n-butoxyethoxy)methyl group, (1-cyclopentyloxyethoxy)methyl group, (1-cyclohexyloxyethoxy)methyl group, (1-methoxypropoxy)methyl group, and (1-ethoxypropoxy) methyl group; a tetrahydrofuranyloxy group, tetrahydropyranyloxy group, tetrahydrofuranyloxymethyl group, tetrahydropyranyloxymethyl group; groups represented by the following formula (16) (hereinafter referred to as "oxygen containing polar group (16)");

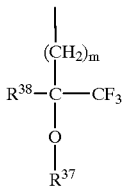

(16)

wherein $R^{37}$ represents a hydrogen atom, a monovalent acid-dissociable group, a linear, branched, orcyclicalkyl group having 1–6 carbon atoms which does not have an acid-dissociable group, a linear, branched, or cyclic alkylcarbonyl group having 2–7 carbon atoms which does not have an acid-dissociable group, $R^{38}$ represents a linear, branched, or cyclic alkyl group having 1–10 carbon atoms or a linear, branched, or cyclic fluoroalkyl group having 1–10 carbon atoms, and m is an integer of 0–3.

As the above acid-dissociable groups, groups which form a carboxyl group in the recurring unit (I) by dissociation with an acid are preferable, such as a group having the formula —COOR' (wherein R' represents a linear, branched, or cyclic alkyl group having 1–19 carbon atoms) or the formula —COOCH$_2$COOR" (wherein R' represents a linear, branched, or cyclic alkyl group having 1–17 carbon atoms). Particularly preferable groups are a 1-methylpropoxycarbonyl group, t-butoxycarbonyl group, and t-butoxycarbonylmethoxycarbonyl group.

Particularly preferable groups for $R^{37}$ in the oxygen containing polar group (16) are a hydrogen atom, preferable acid-dissociable groups in the above-mentioned resin (i), a methyl group, ethyl group, methylcarbonyl group, ethylcarbonyl group, and the like.

As examples of linear or branched alkyl groups having 1–10 carbon atoms for $R^{38}$, a methyl group, ethyl group, n-propyl group, i-propyl group, n-butyl group, i-butyl group, sec-butyl group, t-butyl group, n-pentyl group, neopentyl group, n-hexyl group, n-heptyl group, n-octyl group, 2-ethylhexyl group, n-nonyl group, n-decyl group, and the like can be given.

Of these, a methyl group, ethyl group, n-propyl group, and n-hexyl group are preferable.

Given as examples of the linear or the branched fluoro alkyl group having 1–10 carbon atoms represented $R^{38}$ are a fluoromethyl group, difluoromethyl group, trifluoromethyl group, 1-fluoroethyl group, 1,1-difluoroethyl group, 2,2,2-trifluoroethyl group, pentafluoroethyl group, 1-fluoro-n-propyl group, 1,1-difluoro-n-propyl group, 3,3,3-trifluoro-n-propyl group, 3,3,3,2,2-pentafluoro-n-propyl group, perfluoro-n-propyl group, 1-fluoro-i-propyl group, 2-trifluoro-i-propyl group, perfluoro-i-propyl group, 1-fluoro-n-butyl group, 1,1-difluoro-n-butyl group, 4,4,4-trifluoro-n-butyl group, 4,4,4,3,3-pentafluoro-n-butyl group, 4,4,4,3,3,2,2-heptafluoro-n-butyl group, perfluoro-n-butyl group, 2-fluoro-2-methylpropyl group, 1-fluoro-1-methylpropyl group, 1-fluoro-n-pentyl group, 1,1-difluoro-n-pentyl group, 5,5,5-trifluoro-n-pentyl group, 1-fluoro-n-hexyl group, 1,1-difluoro-n-hexyl group, 6,6,6-trifluoro-n-hexyl group, 1-fluoro-n-heptyl group, 1,1-difluoro-n-heptyl group, 7,7,7-trifluoro-n-heptyl group, 1-fluoro-n-octyl group, 1,1-difluoro-n-octyl group, 8,8,8-trifluoro-n-octyl group, 2-fluoro-2-ethylhexyl group, 1-fluoro-n-nonyl group, 1,1-difluoro-n-nonyl group, 9,9,9-trifluoro-n-nonyl group, 1-fluoro-n-decyl group, 1,1-difluoro-n-decyl group, and 10,10,10-trifluoro-n-decyl group.

Of these fluoroalkyl groups, a fluoromethyl group, difluoromethyl group, trifluoromethyl group, 1,1-difluoroethyl group, 2,2,2-trifluoroethyl group, and 1-fluoro-1-methylethyl group are preferable.

Particularly preferable groups for $R^{38}$ in the oxygen containing polar group (16' are a hydrogen atom, methyl group, trifluoromethyl group, and the like.

m in the oxygen containing polar group (16) is preferably either 0 or 1.

n in the recurring unit (I) is preferably either 0 or 1.

As examples of monomers which provide the recurring unit (I), compounds shown by the following formula (17) (hereinafter referred to as "norbornene derivatives (I)") can be given:

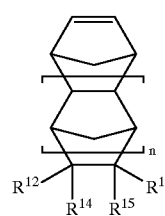

(17)

wherein $R^{12}$, $R^{13}$, $R^{14}$, and $R^{15}$ and n are the same as defined for the formula of the recurring unit (I).

Examples of the norbornene derivatives (I) include:
bicyclo[2.2.1]hept-2-ene and its derivatives such as norbornene (e.g. bicyclo[2.2.1]hept-2-ene),
5-methylbicyclo[2.2.1]hept-2-ene,
5-ethylbicyclo[2.2.1]hept-2-ene,
5-fluoromethylbicyclo[2.2.1]hept-2-ene,
5-difluoromethylbicyclo[2.2.1]hept-2-ene,
5-trifluoromethylbicyclo[2.2.1]hept-2-ene,
5-methyl-5-trifluoromethylbicyclo[2.2.1]hept-2-ene,
5,5-bis(trifluoromethyl)bicyclo[2.2.1]hept-2-ene,
5,6-bis(trifluoromethyl)bicyclo[2.2.1]hept-2-ene,
5,5,6-tris(trifluoromethyl)bicyclo[2.2.1]hept-2-ene,
5,5,6,6-tetrakis(trifluoromethyl)bicyclo[2.2.1]hept-2-ene,
5-methoxycarbonylbicyclo[2.2.1]hept-2-ene,
5-ethoxycarbonyibicyclo[2.2.1]hept-2-ene,
5-n-propoxycarbonylbicyclo[2.2.1]hept-2-ene,
5-i-propoxycarbonylbicyclo[2.2.1]hept-2-ene,
5-n-butoxycarbonylbicyclo[2.2.1]hept-2-ene,
5-(2-methylpropoxy)carbonylbicyclo[2.2.1]hept-2-ene,
5-(1-methylpropoxy)carbonylbicyclo[2.2.1]hept-2-ene,
5-t-butoxycarbonylbicyclo[2.2.1]hept-2-ene,
5-cyclohexyloxycarbonylbicyclo[2.2.1]hept-2-ene,
5-4-t-butylcyclohexyloxy)carbonylbicyclo[2.2.1]hept-2-ene,
5-phenoxycarbonylbicyclo[2.2.1]hept-2-ene,
5-(1-ethoxyethoxy)carbonylbicyclo[2.2.1]hept-2-ene,
5-(1-cyclohexyloxyethoxy)carbonylbicyclo[2.2.1]hept-2-ene,
5-t-butoxycarbonylmethoxycarbonylbicyclo[2.2.1]hept-2-ene, 5-tetrahydrofuranyloxycarbonylbicyclo[2.2.1]hept-2-ene,
5-tetrahydropyranyloxycarbonylbicyclo[2.2.1]hept-2-ene,
5-methoxycarbonyloxybicyclo[2.2.1]hept-2-ene,
5-ethoxycarbonyloxybicyclo[2.2.1]hept-2-ene,
5-n-propoxycarbonyloxybicyclo[2.2.1]hept-2-ene,
5-n-butoxycarbonyloxybicyclo[2.2.1]hept-2-ene,
5-methoxycarbonyloxymethylbicyclo[2.2.1]hept-2-ene,
5-ethoxycarbonyloxymethylbicyclo[2.2.1]hept-2-ene,
5-n-propoxycarbonyloxymethylbicyclo[2.2.1]hept-2-ene,
5-n-butoxycarbonyloxymethylbicyclo[2.2.1]hept-2-ene,
5-methyl-5-methoxycarbonylbicyclo[2.2.1]hept-2-ene,
5-methyl-5-ethoxycarbonylbicyclo[2.2.1]hept-2-ene,
5-methyl-5-n-propoxycarbonylbicyclo[2.2.1]hept-2-ene,
5-methyl-5-i-propoxycarbonylbicyclo[2.2.1]hept-2-ene,
5-methyl-5-n-butoxycarbonylbicyclo[2.2.1]hept-2-ene,
5-methyl-5-(2-methylpropoxy)carbonylbicyclo[2.2.1]hept-2-ene,
5-methyl-5-(1-methylpropoxy)carbonylbicyclo[2.2.1]hept-2-ene,
5-methyl-5-t-butoxycarbonylbicyclo[2.2.1]hept-2-ene,
5-methyl-5-cyclohexyloxycarbonylbicyclo[2.2.1]hept-2-ene,
5-methyl-5-(4-t-butylcyclohexyloxy)carbonylbicyclo[2.2.1]hept-2-ene,
5-methyl-5-phenoxycarbonylbicyclo[2.2.1]hept-2-ene,
5-methyl-5-(1-ethoxyethoxy)carbonylbicyclo[2.2.1]hept-2-ene,
5-methyl-5-(1-cyclohexyloxyethoxy)carbonylbicyclo[2.2.1]hept-2-ene,
5-methyl-5-t-butoxycarbonylmethoxycarbonylbicyclo[2.2.1]hept-2-ene,
5-methyl-5-tetrahydrofuranyloxycarbonylbicyclo[2.2.1]hept-2-ene,
5-methyl-5-tetrahydropyranyloxycarbonylbicyclo[2.2.1]hept-2-ene,
5-methyl-5-methoxycarbonyloxybicyclo[2.2.1]hept-2-ene,
5-methyl-5-ethoxycarbonyloxybicyclo[2.2.1]hept-2-ene,
5-methyl-5-n-propoxycarbonyloxybicyclo[2.2.1]hept-2-ene,
5-methyl-5-n-butoxycarbonyloxybicyclo[2.2.1]hept-2-ene,
5-methyl-5-methoxycarbonyloxymethylbicyclo[2.2.1]hept-2-ene,
5-methyl-5-ethoxycarbonyloxymethylbicyclo[2.2.1]hept-2-ene,
5-methyl-5-n-propoxycarbonyloxymethylbicyclo[2.2.1]hept-2-ene,
5-methyl-5-n-butoxycarbonyloxymethylbicyclo[2.2.1]hept-2-ene,
5,6-di(methoxycarbonyl)bicyclo[2.2.1]hept-2-ene,
5,6-di(ethoxycarbonyl)bicyclo[2.2.1]hept-2-ene,
5,6-di(n-propoxycarbonyl)bicyclo[2.2.1]hept-2-ene,
5,6-di(i-propoxycarbonyl)bicyclo[2.2.1]hept-2-ene,
5,6-di(n-butoxycarbonyl)bicyclo[2.2.1]hept-2-ene,
5,6-di(2-methylpropoxycarbonyl)bicyclo[2.2.1]hept-2-ene,
5,6-di(1-methylpropoxycarbonyl)bicyclo[2.2.1]hept-2-ene,
5,6-di(t-butoxycarbonyl)bicyclo[2.2.1]hept-2-ene,
5,6-di(cyclohexyloxycarbonyl)bicyclo[2.2.1]hept-2-ene,
5,6-di(4-t-butylcyclohexyloxycarbonyl)bicyclo[2.2.1]hept-2-ene,
5,6-di(phenoxycarbonyl)bicyclo[2.2.1]hept-2-ene,
5,6-di(1-ethoxyethoxycarbonyl)bicyclo[2.2.1]hept-2-ene,
5,6-di(1-cyclohexyloxyethoxycarbonyl)bicyclo[2.2.1]hept-2-ene,
5,6-di(t-butoxycarbonylmethoxycarbonyl)bicyclo[2.2.1]hept-2-ene,
5,6-di(tetrahydrofuranyloxycarbonyl)bicyclo[2.2.1]hept-2-ene,
5,6-di(tetrahydropyranyloxycarbonyl)bicyclo[2.2.1]hept-2-ene,
5,6-dimethoxycarbonyloxybicyclo[2.2.1]hept-2-ene,
5,6-diethoxycarbonyloxybicyclo[2.2.1]hept-2-ene,
5,6-di-n-propoxycarbonyloxybicyclo[2.2.1]hept-2-ene,
5,6-di-n-butoxycarbonyloxybicyclo[2.2.1]hept-2-ene,
5,6-di(methoxycarbonyloxymethyl)bicyclo[2.2.1]hept-2-ene,
5,6-di(ethoxycarbonyloxymethyl)bicyclo[2.2.1]hept-2-ene,
5,6-di(n-propoxycarbonyloxymethyl)bicyclo[2.2.1]hept-2-ene,
5,6-di(n-butoxycarbonyloxymethyl)bicyclo [2.2.1]hept-2-ene,
5-hydroxybicyclo[2.2.1]hept-2-ene,
5-carboxybicyclo[2.2.1]hept-2-ene,
5-hydroxymethylbicyclo[2.2.1]hept-2-ene,
5-(2-hydroxyethyl)bicyclo[2.2.1]hept-2-ene,
5-methoxybicyclo[2.2.1]hept-2-ene,
5-ethoxybicyclo[2.2.1]hept-2-ene,
5-(1-methoxyethoxy)bicyclo[2.2.1]hept-2-ene,
5-(1-ethoxyethoxy)bicyclo[2.2.1]hept-2-ene,
5-(1-n-propoxyethoxy)bicyclo[2.2.1]hept-2-ene,
5-(1-n-butoxyethoxy)bicyclo[2.2.1]hept-2-ene,
5-(1-cyclohexyloxyethoxy)bicyclo[2.2.1]hept-2-ene,
5-(1-methoxyethoxy)methylbicyclo[2.2.1]hept-2-ene,
5-(1-ethoxyethoxy)methylbicyclo[2.2.1]hept-2-ene,
5-(1-n-propoxyethoxy)methylbicyclo[2.2.1]hept-2-ene,
5-(1-n-butoxyethoxy)methylbicyclo[2.2.1]hept-2-ene,
5-(1-cyclohexyloxyethoxy)methylbicyclo[2.2.1]hept-2-ene,
5-tetrahydrofuranyloxybicyclo[2.2.1]hept-2-ene,
5-tetrahydropyranyloxybicyclo[2.2.1]hept-2-ene,
5-tetrahydrofuranyloxymethylbicyclo[2.2.1]hept-2-ene,
5-tetrahydropyranyloxymethylbicyclo[2.2.1]hept-2-ene,
5-methyl-5-hydroxyblcyclo[2.2.1]hept-2-ene,
5-methyl-5-carboxybicyclo[2.2.1]hept-2-ene,
5-methyl-5-hydroxymethylbicyclo[2.2.1]hept-2-ene,
5-methyl-5-(2-hydroxyethyl)bicyclo[2.2.1]hept-2-ene,
5-methyl-5-methoxybicyclo[2.2.1]hept-2-ene,
5-methyl-5-ethoxybicyclo[2.2.1]hept-2-ene,
5-methyl-5-(1-methoxyethoxy)bicyclo[2.2.1]hept-2-ene,
5-methyl-5-(1-ethoxyethoxy)bicyclo[2.2.1]hept-2-ene,
5-methyl-5-(1-n-propoxyethoxy)bicyclo[2.2.1]hept-2-ene,
5-methyl-5-(1-n-butoxyethoxy)bicyclo[2.2.1]hept-2-ene, 5-methyl-5-(1-cyclohexyloxyethoxy)bicyclo[2.2.1]hept-2-ene,
5-methyl-5-(1-methoxyethoxy)methylbicyclo[2.2.1]hept-2-ene,
5-methyl-5-(1-ethoxyethoxy)methylbicyclo[2.2.1]hept-2-ene,
5-methyl-5-(1-n-propoxyethoxy)methylbicyclo[2.2.1]hept-2-ene,
5-methyl-5-(1-n-butoxyethoxy)methylbicyclo[2.2.1]hept-2-ene,
5-methyl-5-(1-cyclohexyloxyethoxy)methylbicyclo[2.2.1]hept-2-ene,
5-methyl-5-tetrahydrofuranyloxybicyclo[2.2.1]hept-2-ene,
5-methyl-5-tetrahydropyranyloxybicyclo[2.2.1]hept-2-ene,
5-methyl-5-tetrahydrofuranyloxymethylbicyclo[2.2.1]hept-2-ene,
5-methyl-5-tetrahydropyranyloxymethylbicyclo[2.2.1]hept-2-ene, 5-hydroxy-6-methylbicyclo[2.2.1]hept-2-ene,
5-carboxy-6-methylbicyclo[2.2.1]hept-2-ene,
5-hydroxymethyl-6-methylbicyclo[2.2.1]hept-2-ene,
5-(2-hydroxyethyl)-6-methylbicyclo[2.2.1]hept-2-ene,
5-methoxy-6-methylbicyclo[2.2.1]-hept-2-ene,
5-ethoxy-6-methylbicyclo[2.2.1]hept-2-ene,
5,6-dihydroxybicyclo[2.2.1]hept-2-ene,
5,6-dicarboxybicyclo[2.2.1]hept-2-ene,
5,6-di(hydroxymethyl)bicyclo[2.2.1]hept-2-ene,
5,6-di(2-hydroxyethyl)bicyclo[2.2.1]hept-2-ene,
5,6-dimethoxybicyclo[2.2.1]hept-2-ene,
5,6-diethoxybicyclo[2.2.1]hept-2-ene,
5,6-di(1-methoxyethoxy)bicyclo[2.2.1]hept-2-ene,
5,6-di(1-ethoxyethoxy)bicyclo[2.2.1]hept-2-ene,
5,6-di(1-n-propoxyethoxy)bicyclo[2.2.1]hept-2-ene,
5,6-di(1-n-butoxyethoxy)bicyclo[2.2.1]hept-2-ene,
5,6-di(1-cyclohexyloxyethoxy)bicyclo[2.2.1]hept-2-ene,
5,6-di[(1-methoxyethoxy)methyl]bicyclo[2.2.1]hept-2-ene,
5,6-di[(1-ethoxyethoxy)methyl]bicyclo[2.2.1]hept-2-ene,
5,6-di[(1-n-propoxyethoxy)methyl]bicyclo[2.2.1]hept-2-ene,
5,6-di[(1-n-butoxyethoxy)methyl]bicyclo[2.2.1]hept-2-ene,
5,6-di[(1-cyclohexyloxyethoxy)methyl]bicyclo[2.2.1]hept-2-ene,
5,6-di(tetrahydrofuranyloxy)bicyclo[2.2.1]hept-2-ene,
5,6-di(tetrahydropyranyloxy)bicyclo[2.2.1]hept-2-ene,
5,6-di(tetrahydrofuranyloxymethyl)bicyclo[2.2.1]hept-2-ene,
5,6-di(tetrahydropyranyloxymethyl)bicyclo[2.2.1]hept-2-ene,
5-(2,2,2-trifluoro-1-hydroxyethyl)bicyclo[2.2.1]hept-2-ene,
5-(2,2,2-trifluoro-1-methyl-1-hydroxyethyl)bicyclo[2.2.1]hept-2-ene,
5-(2,2,2-trifluoro-1-trifluoromethyl-1-hydroxyethyl)bicyclo[2.2.1]hept-2-ene,
5-(2,2,2-trifluoro-1-methoxyethyl)bicyclo[2.2.1]hept-2-ene,
5-(2,2,2-trifluoro-1-methyl-1-methoxyethyl)bicyclo[2.2.1]hept-2-ene,
5-(2,2,2-trifluoro-1-trifluoromethyl-1-methoxyethyl)bicyclo[2.2.1]hept-2-ene,
5-(2,2,2-trifluoro-1-methylcarbonyloxyethyl)bicyclo[2.2.1]hept-2-ene,
5-(2,2,2-trifluoro-1-methyl-1-methylcarbonyloxyethyl)bicyclo[2.2.1]hept-2-ene,
5-(2,2,2-trifluoro-1-trifluoromethyl-1-methylcarbonyloxyethyl)bicyclo[2.2.1]hept-2-ene,
5-(2,2,2-trifluoro-1-t-butoxycarbonyloxyethyl)bicyclo[2.2.1]hept-2-ene,
5-(2,2,2-trifluoro-1-methyl-1-t-butoxycarbonyloxyethyl)bicyclo[2.2.1]hept-2-ene,
5-(2,2,2-trifluoro-1-trifluoromethyl-1-t-butoxycarbonyloxyethyl)bicyclo[2.2.1]hept-2-ene,
5-(2-trifluoromethyl-2-hydroxyethyl)bicyclo[2.2.1]hept-2-ene,
5-(2-trifluoromethyl-2-methyl-2-hydroxyethyl)bicyclo[2.2.1]hept-2-ene,
5-[2,2-di(trifluoromethyl)-2-hydroxyethyl]bicyclo[2.2.1]hept-2-ene,
5-(2-trifluoromethyl-2-methoxyethyl)bicyclo[2.2.1]hept-2-ene,
5-(2-trifluoromethyl-2-methyl-2-methoxyethyl)bicyclo[2.2.1]hept-2-ene,
5-[2,2-di(trifluoromethyl)-2-methoxyethyl]bicyclo[2.2.1]hept-2-ene,
5-[2-trifluoromethyl-2-methylcarbonyloxyethyl]bicyclo[2.2.1]hept-2-ene,
5-(2-trifluoromethyl-2-methyl-2-methylcarbonyloxyethyl)bicyclo[2.2.1]hept-2-ene,
5-[2,2-di(trifluoromethyl)-2-methylcarbonyloxyethyl]bicyclo[2.2.1]hept-2-ene,
5-[2-trifluoromethyl-2-t-butoxycarbonyloxyethyl]bicyclo[2.2.1]hept-2-ene,
5-(2-trifluoromethyl-2-methyl-2-t-butoxycarbonyloxyethyl)bicyclo[2.2.1]hept-2-ene,
5-[2,2-di(trifluoromethyl)-2-t-butoxycarbonyloxyethyl]bicyclo[2.2.1]hept-2-ene,
5-cyanobicyclo[2.2.1]hept-2-ene,
5-cyanomethylbicyclo[2.2.1]hept-2-ene,
5-(2-cyanoethyl)bicyclo[2.2.1]hept-2-ene,
5,6-dicyanoicyclo[2.2.1]hept-2-ene,
5,6-di(cyanomethyl)bicyclo[2.2.1]hept-2-ene,
5,6-di(2-cyanoethyl)bicyclo[2.2.1]hept-2-ene,
5-cyano-5-methylbicyclo[2.2.1]hept-2-ene,
5-cyano-5-ethylbicyclo[2.2.1]hept-2-ene,
5-cyanomethyl-5-methylbicyclo[2.2.1]hept-2-ene,
5-cyanomethyl-5-ethylbicyclo[2.2.1]hept-2-ene,
5-(2-cyanoethyl)-5-methylbicyclo[2.2.1]hept-2-ene,
5-(2-cyanoethyl)-5-ethylbicyclo[2.2.1]hept-2-ene,
5-cyano-6-methylbicyclo[2.2.1]hept-2-ene,
5-cyanomethyl-6-methylbicyclo[2.2.1]hept-2-ene, and
5-(2-cyanoethyl)-6-methylbicyclo[2.2.1]hept-2-ene;
5,6-dicarboxybicyclo[2.2.1]hept-2-ene anhydride (hymic acid anhydride);
tetracyclo[4.4.0.1$^{2,5}$.1$^{7,10}$]dodec-3-ene and its derivatives such as tetracyclo[4.4.0.1$^{2,5}$.1$^{7,10}$]dodec-3-ene,
8-methyltetracyclo[4.4.0.1$^{2,5}$.1$^{7,10}$]dodec-3-ene, 8-ethyltetracyclo[4.4.0.1$^{2,5}$.1$^{7,10}$]dodec-3-ene,
8-fluoromethyltetracyclo[4.4.0.1$^{2,5}$.1$^{7,10}$]dodec-3-ene,
8-difluoromethyltetracyclo[4.4.0.1$^{2,5}$.1$^{7,10}$]dodec-3-ene,
8-trifluoromethyltetracyclo[4.4.0.1$^{2,5}$.1$^{7,10}$]dodec-3-ene,
8-methyl-8-trifluoromethyltetracyclo[4.4.0.1$^{2,5}$.1$^{7,10}$]dodec-3-ene,
8,8-bis(trifluoromethyl)tetracyclo[4.4.0.1$^{2,5}$.1$^{7,10}$]dodec-3-ene,
8,9-bis(trifluoromethyl)tetracyclo[4.4.0.1$^{2,5}$.1$^{7,10}$]dodec-3-ene,
8,8,9-tris(trifluoromethyl)tetracyclo[4.4.0.1$^{2,5}$.1$^{7,10}$]dodec-3-ene,
8,8,9,9-tetrakis(trifluoromethyl)tetracyclo[4.4.0.1$^{2,5}$.1$^{7,10}$]dodec-3-ene,
8-methoxycarbonyltetracyclo[4.4.0.1$^{2,5}$.1$^{7,10}$]dodec-3-ene,
8-ethoxycarbonyltetracyclo[4.4.0.1$^{2,5}$.1$^{7,10}$]dodec-3-ene,
8-n-propoxycarbonyltetracyclo[4.4.0.1$^{2,5}$.1$^{7,10}$]dodec-3-ene,
8-i-propoxycarbonyltetracyclo[4.4.0.1$^{2,5}$.1$^{7,10}$]dodec-3-ene,
8-n-butoxycarbonyltetracyclo[4.4.0.1$^{2,5}$.1$^{7,10}$]dodec-3-ene,
8-(2-methylpropoxy)carbonyltetracyclo[4.4.0.1$^{2,5}$.1$^{7,10}$]dodec-3-ene,
8-(1-methylpropoxy)carbonyltetracyclo[4.4.0.1$^{2,5}$.1$^{7,10}$]dodec-3-ene,
8-t-butoxycarbonyltetracyclo[4.4.0.1$^{2,5}$.1$^{7,10}$]dodec-3-ene,
8-cyclohexyloxycarbonyltetracyclo[4.4.0.1$^{2,5}$.1$^{7,10}$]dodec-3-ene,
8-(4-t-butylcyclohexyloxy)carbonyltetracyclo[4.4.0.1$^{2,5}$.1$^{7,10}$]dodec-3-ene,
8-phenoxycarbonyltetracyclo[4.4.0.1$^{2,5}$.1$^{7,10}$]dodec-3-ene,
8-(1-ethoxyethoxy)carbonyltetracyclo[4.4.0.1$^{2,5}$.1$^{7,10}$]dodec-3-ene,
8-(1-cyclohexyloxyethoxy)carbonyltetracyclo[4.4.0.1$^{2,5}$.1$^{7,10}$]dodec-3-ene,
8-t-butoxycarbonylmethoxycarbonyltetracyclo[4.4.0.1$^{2,5}$.1$^{7,10}$]dodec-3-ene,
8-tetrahydrofuranyloxycarbonyltetracyclo[4.4.0.1$^{2,5}$.1$^{7,10}$]dodec-3-ene,
8-tetrahydropyranyloxycarbonyltetracyclo[4.4.0.1$^{2,5}$.1$^{7,10}$]dodec-3-ene,
8-methoxycarbonyloxytetracyclo[4.4.0.1$^{2,5}$.1$^{7,10}$]dodec-3-ene,
8-ethoxycarbonyloxytetracyclo[4.4.0.1$^{2,5}$.1$^{7,10}$]dodec-3-ene,
8-n-propoxycarbonyloxytetracyclo[4.4.0.1$^{2,5}$.1$^{7,10}$]dodec-3-ene,
8-N-butoxycarbonyloxytetracyclo[4.4.0.1$^{2,5}$.1$^{7,10}$]dodec-3-ene,
8-methoxycarbonyloxymethyltetracyclo[4.4.0.1$^{2,5}$.1$^{7,10}$]dodec-3-ene,
8-ethoxycarbonyloxymethyltetracyclo[4.4.0.1$^{2,5}$.1$^{7,10}$]dodec-3-ene,
8-n-propoxycarbonyloxymethyltetracyclo[4.4.0.1$^{2,5}$.1$^{7,10}$]dodec-3-ene,
8-n-butoxycarbonyloxymethyltetracyclo[4.4.0.1$^{2,5}$.1$^{7,10}$]dodec-3-ene,
8-methyl-8-methoxycarbonyltetracyclo[4.4.0.1$^{2,5}$.1$^{7,10}$]dodec-3-ene,
8-methyl-8-ethoxycarbonyltetracyclo[4.4.0.1$^{2,5}$.1$^{7,10}$]dodec-3-ene,
8-methyl-8-n-propoxycarbonyltetracyclo[4.4.0.1$^{2,5}$.1$^{7,10}$]dodec-3-ene,
8-methyl-8-i-propoxycarbonyltetracyclo[4.4.0.1$^{2,5}$.1$^{7,10}$]dodec-3-ene,
8-methyl-8-n-butoxycarbonyltetracyclo-[4.4.0.1$^{2,5}$.1$^{7,10}$]dodec-3-ene,
8-methyl-8-(2-methylpropoxy)carbonyltetracyclo[4.4.0.1$^{2,5}$.1$^{7,10}$]dodec-3-ene,
8-methyl-8-(1-methylpropoxy)carbonyltetracyclo[4.4.0.1$^{2,5}$.1$^{7,10}$]dodec-3-ene,
8-methyl-8-t-butoxycarbonyltetracyclo[4.4.0.1$^{2,5}$.1$^{7,10}$]dodec-3-ene,
8-methyl-8-cyclohexyloxycarbonyltetracyclo[4.4.0.1$^{2,5}$.1$^{7,10}$]dodec-3-ene,
8-methyl-8-(4-t-butylcyclohexyloxy)carbonyltetracyclo[4.4.0.1$^{2,5}$.1$^{7,10}$]dodec-3-ene,
8-methyl-8-phenoxycarbonyltetracyclo[4.4.0.1$^{2,5}$.1$^{7,10}$]dodec-3-ene,
8-methyl-8-(1-ethoxyethoxy)carbonyltetracyclo[4.4.0.1$^{2,5}$.1$^{7,10}$]dodec-3-ene,
8-methyl-8-(1-cyclohexyloxyethoxy)carbonyltetracyclo[4.4.0.1$^{2,5}$.1$^{7,10}$]dodec-3-ene,
8-methyl-8-t-butoxycarbonylmethoxycarbonyltetracyclo[4.4.0.1$^{2,5}$.1$^{7,10}$]dodec-3-ene,
8-methyl-8-tetrahydrofuranyloxycarbonyltetracyclo[4.4.0.1$^{2,5}$.1$^{7,10}$]dodec-3-ene,
8-methyl-8-tetrahydropyranyloxycarbonyltetracyclo[4.4.0.1$^{2,5}$.1$^{7,10}$]dodec-3-ene,
8-methyl-8-methoxycarbonyloxytetracyclo[4.4.0.1$^{2,5}$.1$^{7,10}$]dodec-3-ene,
8-methyl-8-ethoxycarbonyloxytetracyclo[4.4.0.1$^{2,5}$.1$^{7,10}$]dodec-3-ene,
8-methyl-8-n-propoxycarbonyloxymethyltetracyclo[4.4.0.1$^{2,5}$.1$^{7,10}$]dodec-3-ene,
8-methyl-8-n-butoxycarbonyloxytetracyclo[4.4.0.1$^{2,5}$.1$^{7,10}$]dodec-3-ene,
8-methyl-8-methoxycarbonyloxymethyltetracyclo[4.4.0.1$^{2,5}$.1$^{7,10}$]dodec-3-ene,
8-methyl-8-ethoxycarbonyloxymethyltetracyclo-[4.4.0.1$^{2,5}$.1$^{7,10}$]dodec-3-ene,
8-methyl-8-n-propoxycarbonyloxymethyltetracyclo[4.4.0.1$^{2,5}$.1$^{7,10}$]dodec-3-ene,
8-methyl-8-n-butoxycarbonyloxymethyltetracyclo[4.4.0.1$^{2,5}$.1$^{7,10}$]dodec-3-ene
8,9-di(methoxycarbonyl)tetracyclo[4.4.0.1$^{2,5}$.1$^{7,10}$]dodec-3-ene,
8,9-di(ethoxycarbonyl)tetracyclo[4.4.0.1$^{2,5}$.1$^{7,10}$]dodec-3-ene,
8,9-di(n-propoxycarbonyl)tetracyclo[4.4.0.1$^{2,5}$.1$^{7,10}$]dodec-3-ene,
8,9-di(i-propoxycarbonyl)tetracyclo[4.4.0.1$^{2,5}$.1$^{7,10}$]dodec-3-ene,
8,9-di(n-butoxycarbonyl)tetracyclo[4.4.0.1$^{2,5}$.1$^{7,10}$]dodec-3-ene,
8,9-di(2-methylpropoxycarbonyl)tetracyclo[4.4.0.1$^{2,5}$.1$^{7,10}$]dodec-3-ene,
8,9-di(1-methylpropoxycarbonyl)tetracyclo[4.4.0.1$^{2,5}$.1$^{7,10}$]dodec-3-ene, 8,9-di(t-butoxycarbonyl)tetracyclo[4.4.0.1$^{2,5}$.1$^{7,10}$]dodec-3-ene,
8,9-di(cyclohexyloxycarbonyl)tetracyclo[4.4.0.1$^{2,5}$.1$^{7,10}$]dodec-3-ene,
8,9-di(4-t-butylcyclohexyloxycarbonyl)tetracyclo[4.4.0.1$^{2,5}$.1$^{7,10}$]dodec-3-ene,
8,9-di(phenoxycarbonyl)tetracyclo[4.4.0.1$^{2,5}$.1$^{7,10}$]dodec-3-ene,
8,9-di(1-ethoxyethoxycarbonyl)tetracyclo[4.4.0.1$^{2,5}$.1$^{7,10}$]dodec-3-ene,
8,9-di(1-cyclohexyloxyethoxycarbonyl)tetracyclo[4.4.0.1$^{2,5}$.1$^{7,10}$]dodec-3-ene,
8,9-di(t-butoxycarbonylmethoxycarbonyl)tetracyclo[4.4.0.1$^{2,5}$.1$^{7,10}$]dodec-3-ene,
8,9-di(tetrahydrofuranyloxycarbonyl)tetracyclo[4.4.0.1$^{2,5}$.1$^{7,10}$]dodec-3-ene,
8,9-di(tetrahydropyranyloxycarbonyl)tetracyclo[4.4.0.1$^{2,5}$.1$^{7,10}$]dodec-3-ene,
8,9-dimethoxycarbonyloxytetracyclo[4.4.0.1$^{2,5}$.1$^{7,10}$]dodec-3-ene,
8,9-diethoxycarbonyloxytetracyclo[4.4.0.1$^{2,5}$.1$^{7,10}$]dodec-3-ene,
8,9-di-n-propoxycarbonyloxytetracyclo[4.4.0.1$^{2,5}$.1$^{7,10}$]dodec-3-ene,
8,9-di-n-butoxycarbonyloxytetracyclo[4.4.0.1$^{2,5}$.1$^{7,10}$]dodec-3-ene,
8,9-di(methoxycarbonyloxymethyl)tetracyclo[4.4.0.1$^{2,5}$.1$^{7,10}$]dodec-3-ene,
8,9-di(ethoxycarbonyloxymethyl)tetracyclo[4.4.0.1$^{2,5}$.1$^{7,10}$]dodec-3-ene, 8,9-di(n-propoxycarbonyloxymethyl)tetracyclo[4.4.0.1$^{2,5}$.1$^{7,10}$]dodec-3-ene,
8,9-di(n-butoxycarbonyloxymethyl)tetracyclo-[4.4.0.1$^{2,5}$.1$^{7,10}$]dodec-3-ene,
8-hydroxytetracyclo[4.4.0.1$^{2,5}$.1$^{7,10}$]dodec-3-ene,
8-carboxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-(2-hydroxyethyl)tetracyclo[4.4.0.1$^{2,5}$.1$^{7,10}$]dodec-3-ene,
8-methoxytetracyclo[4.4.0.1$^{2,5}$.1$^{7,10}$]dodec-3-ene,
8-ethoxytetracyclo[4.4.0.1$^{2,5}$.1$^{7,10}$]dodec-3-ene,
8-(1-methoxyethoxy)tetracyclo[4.4.0.1$^{2,5}$.1$^{7,10}$]dodec-3-ene,
8-(1-ethoxyethoxy)tetracyclo[4.4.0.1$^{2,5}$.1$^{7,10}$]dodec-3-ene,
8-(1-n-propoxyethoxy)tetracyclo[4.4.0.1$^{2,5}$.1$^{7,10}$]dodec-3-ene,
8-(1-n-butoxyethoxy)tetracyclo[4.4.0.1$^{2,5}$.1$^{7,10}$]dodec-3-ene,
8-(-cyclohexyloxyethoxy)tetracyclo[4.4.0.1$^{2,5}$.1$^{7,10}$]dodec-3-ene,
8-(1-methoxyethoxy)methyltetracyclo[4.4.0.1$^{2,5}$.1$^{7,10}$]dodec-3-ene,
8-(1-ethoxyethoxy)methyltetracyclo[4.4.0.1$^{2,5}$.1$^{7,10}$]dodec-3-ene,
8-(1-n-propoxyethoxy)methyltetracyclo[4.4.0.1$^{2,5}$.1$^{7,10}$]dodec-3-ene,
8-(1-n-butoxyethoxy)methyltetraccyclo[4.4.0.1$^{2,5}$.1$^{7,10}$]dodec-3-ene,
8-(1-cyclohexyloxyethoxy)methyltetracyclo[4.4.0.1$^{2,5}$.1$^{7,10}$]dodec-3-ene,
8-tetrahydrofuranyloxytetracyclo[4.4.0.1$^{2,5}$.1$^{7,10}$]dodec-3-ene,
8-tetrahydropyranyloxytetracyclo[4.4.0.1$^{2,5}$.1$^{7,10}$]dodec-3-ene,
8-tetrahydrofuranyloxymethyltetracyclo[4.4.0.1$^{2,5}$.1$^{7,10}$]dodec-3-ene,
8-tetrahydropyranyloxymethyltetracyclo[4.4.0.1$^{2,5}$.1$^{7,10}$]dodec-3-ene,
8-methyl-8-hydroxytetracyclo[4.4.0.1$^{2,5}$.1$^{7,10}$]dodec-3-ene,
8-methyl-8-carboxytetracyclo[4.4.0.1$^{2,5}$.1$^{7,10}$]dodec-3-ene,
8-methyl-8-hydroxymethyltetracyclo[4.4.0.1$^{2,5}$.1$^{7,10}$]dodec-3-ene,
8-methyl-8-(2-hydroxyethyl)tetracyclo[4.4.0.1$^{2,5}$.1$^{7,10}$]dodec-3-ene,
8-methyl-8-methoxytetracyclo[4.4.0.1$^{2,5}$.1$^{7,10}$]dodec-3-ene,
8-methyl-8-ethoxytetracyclo[4.4.0.1$^{2,5}$.1$^{7,10}$]dodec-3-ene,
8-methyl-8-(1-methoxyethoxy)tetracyclo[4.4.0.1$^{2,5}$.1$^{7,10}$]dodec-3-ene,
8-methyl-8-(1-ethoxyethoxy)tetracyclo[4.4.0.1$^{2,5}$.1$^{7,10}$]dodec-3-ene,
8-methyl-8-(1-n-propoxyethoxy)tetracyclo[4.4.0.1$^{2,5}$.1$^{7,10}$]dodec-3-ene,
8-methyl-8-(1-n-butoxyethoxy)tetracyclo[4.4.0.1$^{2,5}$.1$^{7,10}$]dodec-3-ene,
8-methyl-8-(1-cyclohexyloxyethoxy)tetracyclo[4.4.0.1$^{2,5}$.1$^{7,10}$]dodec-3-ene,
8-methyl-8-(1-methoxyethoxy)methyltetracyclo[4.4.0.1$^{2,5}$.1$^{7,10}$]dodec-3-ene,
8-methyl-8-(1-ethoxyethoxy)methyltetracyclo-[4.4.0.1$^{2,5}$.1$^{7,10}$]dodec-3-ene,
8-methyl-8-(1-n-propoxyethoxy)methyltetracyclo[4.4.0.1$^{2,5}$.1$^{7,10}$]dodec-3-ene,
8-methyl-8-(1-n-butoxyethoxy)methyltetracyclo[4.4.0.1$^{2,5}$.1$^{7,10}$]dodec-3-ene,
8-methyl-8-(1-cyclohexyloxyethoxy)methyltetracyclo[4.4.0.1$^{2,5}$.1$^{7,10}$]dodec-3-ene,
8-methyl-8-tetrahydrofuranyloxytetracyclo[4.4.0.1$^{2,5}$.1$^{7,10}$]dodec-3-ene,
8-methyl-8-tetrahydropyranyloxytetracyclo[4.4.0.1$^{2,5}$.1$^{7,10}$]dodec-3-ene,
8-methyl-8-tetrahydrofuranyloxymethyltetracyclo[4.4.0.1$^{2,5}$.1$^{7,10}$]dodec-3-ene,
8-methyl-8-tetrahydropyranyloxymethyltetracyclo[4.4.0.1$^{2,5}$.1$^{7,10}$]dodec-3-ene,
8-hydroxy-9-methyltetracyclo[4.4.0.1$^{2,5}$.1$^{7,10}$]dodec-3-ene,
8-carboxyl-9-methyltetracyclo[4.4.0.1$^{2,5}$.1$^{7,10}$]dodec-3-ene,
8-hydroxymethyl-9-methyltetracyclo[4.4.0.1$^{2,5}$.1$^{7,10}$]dodec-3-ene,
8-(2-hydroxyethyl)-9-methyltetracyclo[4.4.0.1$^{2,5}$.1$^{7,10}$]dodec-3-ene,
8-methoxy-9-methyltetracyclo[4.4.0.1$^{2,5}$.1$^{7,10}$]dodec-3-ene,
8-ethoxy-9-methyltetracyclo[4.4.0.1$^{2,5}$.1$^{7,10}$]dodec-3-ene,
8,9-dihydroxytetracyclo[4.4.0.1$^{2,5}$.1$^{7,10}$]dodec-3-ene,
8,9-dicarboxytetracyclo[4.4.0.1$^{2,5}$.1$^{7,10}$]dodec-3-ene,
8,9-di(hydroxymethyl)tetracyclo[4.4.0.1$^{2,5}$.1$^{7,10}$]dodec-3-ene, 8,9-di(2-hydroxyethyl)tetracyclo[4.4.0.1$^{2,5}$.1$^{7,10}$]dodec-3-ene,
8,9-dimethoxytetracyclo[4.4.0.1$^{2,5}$.1$^{7,10}$]dodec-3-ene,
8,9-diethoxytetracyclo[4.4.0.1$^{2,5}$.1$^{7,10}$]dodec-3-ene,
8,9-di(1-methoxyethoxy)tetracyclo[4.4.0.1$^{2,5}$.1$^{7,10}$]dodec-3-ene,
8,9-di(1-ethoxyethoxy)tetracyclo[4.4.0.1$^{2,5}$.1$^{7,10}$]dodec-3-ene,
8,9-di(1-n-propoxyethoxy)tetracyclo[4.4.0.1$^{2,5}$.1$^{7,10}$]dodec-3-ene,
8,9-di(1-n-butoxyethoxy)tetracyclo[4.4.0.1$^{2,5}$.1$^{7,10}$]dodec-3-ene,
8,9-di(1-cyclohexyloxyethoxy)tetracyclo[4.4.0.1$^{2,5}$.1$^{7,10}$]dodec-3-ene,
8,9-di[(1-methoxyethoxy)methyl]tetracyclo[4.4.0.1$^{2,5}$.1$^{7,10}$]dodec-3-ene,
8,9-di[(1-ethoxyethoxy)methyl]tetracyclo[4.4.0.1$^{2,5}$.1$^{7,10}$]dodec-3-ene,
8,9-di [(-n-propoxyethoxy)methyl]tetracyclo[4.4.0.1$^{2,5}$.1$^{7,10}$]dodec-3-ene,
8,9-di[(1-n-butoxyethoxy)methyl]tetracyclo[4.4.0.1$^{2,5}$.1$^{7,10}$]dodec-3-ene,
8,9-di[(1-cyclohexyloxyethoxy)methyl]tetracyclo[4.4.0.1$^{2,5}$.1$^{7,10}$]dodec-3-ene,
8,9-di(tetrahydrofuranyloxy)tetracyclo[4.4.0.1$^{2,5}$.1$^{7,10}$]dodec-3-ene,
8,9-di(tetrahydropyranyloxy)tetracyclo[4.4.0.1$^{2,5}$.1$^{7,10}$]dodec-3-ene,
8,9-di(tetrahydrofuranyloxymethyl)tetracyclo[4.4.0.1$^{2,5}$.1$^{7,10}$]dodec-3-ene,
8,9-di(tetrahydropyranyloxymethyl)tetracyclo[4.4.0.1$^{2,5}$.1$^{7,10}$]dodec-3-ene,
8-(2,2,2-trifluoro-1-hydroxyethyl)tetracyclo[4.4.0.1$^{2,5}$.1$^{7,10}$]dodec-3-ene,
8-(2,2,2-trifluoro-1-methyl-1-hydroxyethyl)tetracyclo[4.4.0.1$^{2,5}$.1$^{7,10}$]dodec-3-ene,
8-(2,2,2-trifluoro-1-trifluoromethyl-1-hydroxyethyl)tetracyclo[4.4.0.1$^{2,5}$.1$^{7,10}$]dodec-3-ene,
8-(2,2,2-trifluoro-1-methoxyethyl)tetracyclo[4.4.0.1$^{2,5}$.1$^{7,10}$]dodec-3-ene,
8-(2,2,2-trifluoro-1-methyl-1-methoxyethyl)tetracyclo[4.4.0.1$^{2,5}$.1$^{7,10}$]dodec-3-ene,
8-(2,2,2-trifluoro-1-trifluoromethyl-1-methoxyethyl)tetracyclo[4.4.0.1$^{2,5}$.1$^{7,10}$]dodec-3-ene,
8-(2,2,2-trifluoro-1-methylcarbonyloxyethyl)tetracyclo[4.4,0.1$^{2,5}$.1$^{7,10}$]dodec-3-ene,
8-(2,2,2-trifluoro-1-methyl-1-methylcarbonyloxyethyl)tetracyclo[4.4.0.1$^{2,5}$.1$^{7,10}$]dodec-3-ene,
8-(2,2,2-trifluoro-1-trifluoromethyl-1-methylcarbonyloxyethyl)tetracyclo[4.4.0.1$^{2,5}$.1$^{7,10}$]dodec-3-ene,
8-(2,2,2-trifluoro-1-t-butoxycarbonyloxyethyl)tetracyclo[4.4.0.1$^{2,5}$.1$^{7,10}$]dodec-3-ene,
8-(2,2,2-trifluoro-1-methyl-1-t-butoxycarbonyloxyethyl)tetracyclo[4.4.0.1$^{2,5}$.1$^{7,10}$]dodec-3-ene,
8-(2,2,2-trifluoro-1-trifluoromethyl-1-t-butoxycarbonyloxyethyl)tetracyclo[4.4.0.1$^{2,5}$.1$^{7,10}$]dodec-3-ene,
8-(2-trifluoromethyl-2-hydroxyethyl)tetracyclo[4.4.0.1$^{2,5}$.1$^{7,10}$]dodec-3-ene,
8-(2-trifluoromethyl-2-methyl-2-hydroxyethyl)tetracyclo[4.4.0.1$^{2,5}$.1$^{7,10}$]dodec-3-ene,
8-[2,2-bis(trifluoromethyl)-2-hydroxyethyl]tetracyclo[4.4.0.1$^{2,5}$.1$^{7,10}$]dodec-3-ene,
8-(2-trifluoromethyl-2-methoxyethyl)tetracyclo[4.4.0.1$^{2,5}$.1$^{7,10}$]dodec-3-ene,
8-(2-trifluoromethyl-2-methyl-2-methoxyethyl)tetracyclo[4.4.0.1$^{2,5}$.1$^{7,10}$]dodec-3-ene,
8-[2,2-di(trifluoromethyl)-2-methoxyethyl]tetracyclo[4.4.0.1$^{2,5}$.1$^{7,10}$]dodec-3-ene,
8-[2-trifluoromethyl-2-methylcarbonyloxyethyl]tetracyclo[4.4.0.1$^{2,5}$.1$^{7,10}$]dodec-3-ene,
8-(2-trifluoromethyl-2-methyl-2-methylcarbonyloxyethyl)tetracyclo[4.4.0.1$^{2,5}$.1$^{7,10}$]dodec-3-ene,
8-[2,2-di(trifluoromethyl)-2-methylcarbonyloxyethyl]tetracyclo[4.4.0.1$^{2,5}$.1$^{7,10}$]dodec-3-ene,
8-[2-trifluoromethyl-2-t-butoxycarbonyloxyethyl]tetracyclo[4.4.0.1$^{2,5}$.1$^{7,10}$]dodec-3-ene,
8-(2-trifluoromethyl-2-methyl-2-t-butoxycarbonyloxyethyl)tetracyclo[4.4.0.1$^{2,5}$.1$^{7,10}$]dodec-3-ene,
8-[2,2-di(trifluoromethyl)-2-t-butoxycarbonyloxyethyl]tetracyclo[4.4.0.1$^{2,5}$.1$^{7,10}$]dodec-3-ene,
8-cyanotetracyclo[4.4.0.1$^{2,5}$.1$^{7,10}$]dodec-3-ene,
8-cyanomethyltetracyclo[4.4.0.1$^{2,5}$.1$^{7,10}$]dodec-3-ene,
8-(2-cyanoethyl)tetracyclo[4.4.0.1$^{2,5}$.1$^{7,10}$]dodec-3-ene,
8,9-dicyanotetracyclo[4.4.0.1$^{2,5}$.1$^{7,10}$]dodec-3-ene,
8,9-di(cyanomethyl)tetracyclo[4.4.0.1$^{2,5}$.1$^{7,10}$]dodec-3-ene,
8,9-di(2-cyanoethyl)tetracyclo[4.4.0.1$^{2,5}$.1$^{7,10}$]dodec-3-ene,
8-cyano-8-methyltetracyclo[4.4.0.1$^{2,5}$.1$^{7,10}$]dodec-3-ene,
8-cyano-8-ethyltetracyclo[4.4.0.1$^{2,5}$.1$^{7,10}$]dodec-3-ene,
8-cyanomethyl-8-methyltetracyclo[4.4.0.1$^{2,5}$.1$^{7,10}$]dodec-3-ene,
8-cyanomethyl-8-ethyltetracyclo-[4.4.0.1$^{2,5}$.1$^{7,10}$]dodec-3-ene,
8-(2-cyanoethyl)-8-methyltetracyclo[4.4.0.1$^{2,5}$.1$^{7,10}$]dodec-3-ene,
8-(2'-cyanoethyl)-8-ethyltetracyclo[4.4.0.1$^{2,5}$.1$^{7,10}$]dodec-3-ene,
8-cyano-9-mnethyltetracyclo[4.4.0.1$^{2,5}$.1$^{7,10}$]dodec-3-ene,
8-cyanomethyl-9-mnethyltetracyclo[4.4.0.1$^{2,5}$.1$^{7,10}$]dodec-3-ene,
8-(2-cyanoethyl)-9-methyltetracyclo[4.4.0.1$^{2,5}$.1$^{7,10}$]dodec-3-ene, and
8,9-dicarboxytetracyclo[4.4.0.1$^{2,5}$.1$^{7,10}$]dodec-3-ene.

Of the above norbornene derivatives (I),
norbornene,5-t-butoxycarbonylbicyclo[2.2.1]hept-2-ene,
5-hydroxybicyclo[2.2.1]hept-2-ene,
5-hydroxymethylbicyclo[2.2.1]hept-2-ene,
5-methyl-5-hydroxymethylbicyclo[2.2.1]hept-2-ene,
5-carboxybicyclo[2.2.1]hept-2-ene,
tetracyclo[4.4.0.1$^{2,5}$.1$^{7,10}$]dodec-3-ene,
8-t-butoxycarbonyltetracyclo[4.4.0.1$^{2,5}$.1$^{7,10}$]dodec-3-ene,
8-hydroxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-methyl-8-hydroxymethyltetracyclo[4.4.0.1$^{2,5}$.1$^{7,10}$]dodec-3-ene,
8-carboxytetracyclo[4.4.0.1$^{2,5}$.1$^{7,10}$]dodec-3-ene, and the like are preferably used.

The recurring unit (I) may be used in the resin (ii-1) and resin (ii-2) either individually or in combination of two or more.

The recurring unit (II) in the resin (ii-1) and resin (ii-2) is the unit derived from maleic anhydride. Maleic anhydride copolymerizes well with norbornene derivatives (I) and the other alicyclic unsaturated compounds which are described later. The copolymerization with maleic anhydride increases the molecular weight of the resulting resin.

Particularly preferable groups for $R^{16}$ in the recurring unit (III) of the resin (ii-2) are a hydrogen atom, methyl group, hydroxymethyl group, and the like.

As examples of the linear or branched alkylene group having 2–4 carbon atoms in the main chain of the group represented by A, methylene group, ethylene group, 1-methyl-1, 1-ethylene group, propylene group, trimethylene group, tetramethylene group, and the like can be given.

A preferable group for the group A in the recurring unit (III) is a single bond, particularly, a methylene group.

As examples of the alicyclic hydrocarbons containing 4–20 carbon atoms for $R^{18}$, $R^{19}$, $R^{20}$ in $R^{17}$, groups having a bridged skeleton such as an adamantane skeleton, norbornane skeleton, tricyclodecane skeleton, and tetracyclododecane skeleton; groups having a cycloalkane structure such as cyclobutane, cyclopentane, cyclohexane, cycloheptane, and cyclooctane; groups in which the above group containing an alicyclic ring is substituted with at least one of linear, branched, or cyclic alkyl groups having 1–10 carbon atoms such as a methyl group, ethyl group, n-propyl group, i-propyl group, n-butyl group, 2-methylpropyl group, 1-methylpropyl group, or t-butyl group; and the like can be given.

Of these alicyclic hydrocarbon groups, the groups having a bridged skeleton, particularly an adamantane skeleton, norbornane skeleton, tricyclodecane skeleton, and tetracyclododecane skeleton are preferable.

As examples of the mono- to trivalent oxygen-containing polar groups represented by $X^1$, $X^2$, or $X^3$, a hydroxyl group; a carboxyl group; an oxy group (=O), an aldo group (—CHO), a hydroxyalkyl group having 1–4 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; an alkoxyl group having 1–4 carbon atoms such as a methoxy group, ethoxy group, n-propoxy group, i-propoxy group, n-butoxy group, 2-methylpropoxy group, 1-methylpropoxy group, and t-butoxy group; and the like can be given. As examples of the mono- to trivalent nitrogen-containing polar groups, a cyano group; a cyanoalkyl group having 2–5 carbon atoms such as a cyanomethyl group, 2-cyanoethyl group, 3-cyanopropyl group, and 4-cyanobutyl group; and the like can be given.

Of these oxygen-containing polar groups and nitrogen-containing polar groups, a hydroxyl group, oxy group, aldo group, hydroxymethyl group, cyano group, cyanomethyl group, and the like are particularly preferable.

The recurring unit (III) is a group having an acid-dissociable carboxylic acid ester group.

The monomer providing the recurring unit (III) is a compound with an acrylic acid moiety of which the hydrogen atom at the α position is replaced by the group $R^{16}$ and a carboxyl moiety of which the hydrogen atom is replaced by the group —A—$R^{17}$.

Compounds shown by the following formulas (III-1) to (III-127) can be given as specific examples of the acrylic acid derivatives (III).

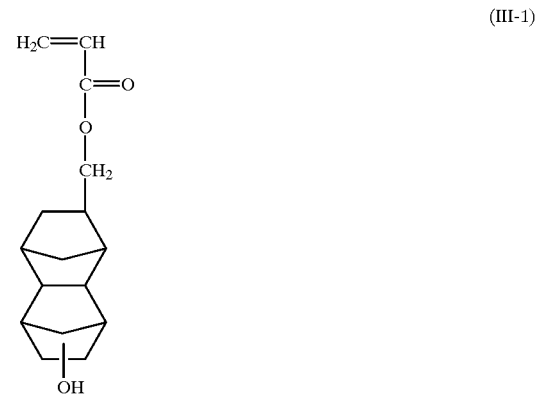

(III-1)

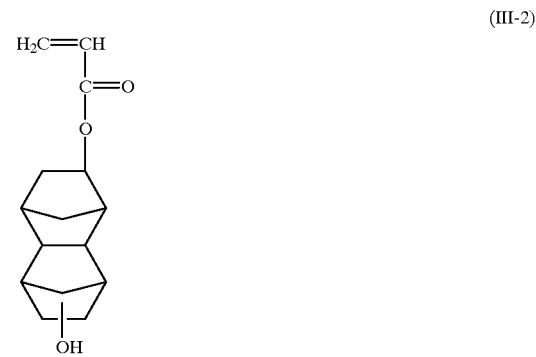

(III-2)

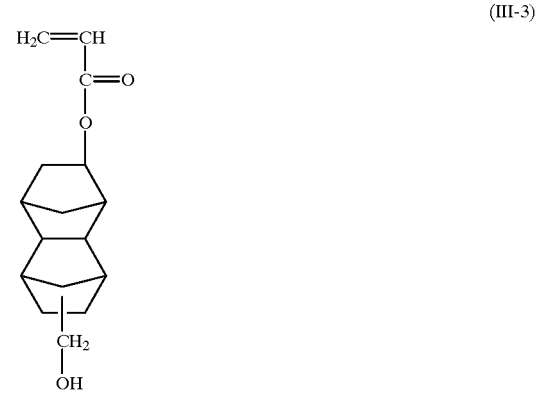

(III-3)

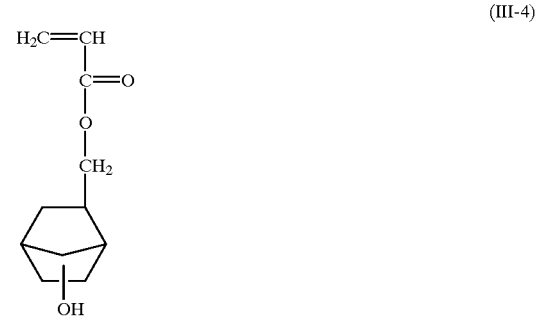

(III-4)

-continued
(III-5)
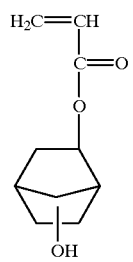
(III-6)
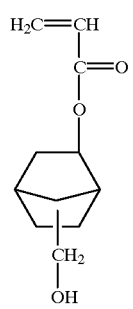
(III-7)
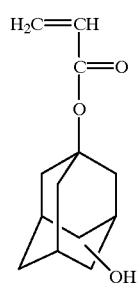
(III-8)
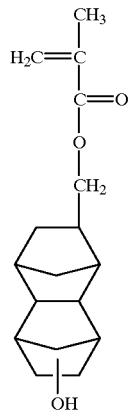
(III-9)
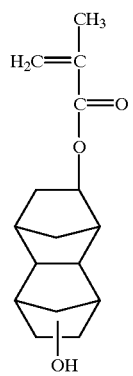
-continued
(III-10)
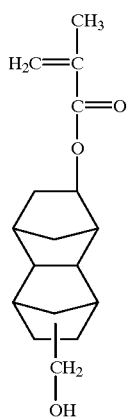
(III-11)
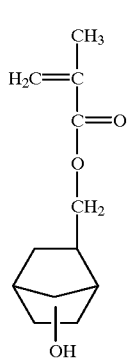
(III-12)
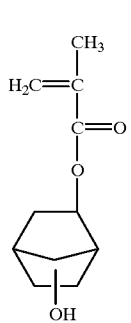
(III-13)
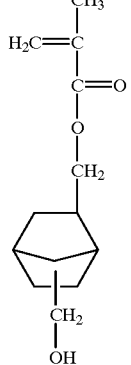

(III-14)
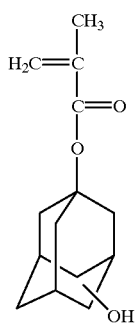
(III-15)
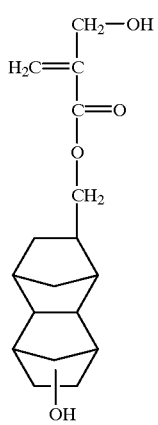
(III-16)
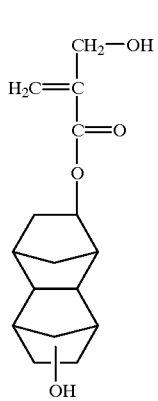
(III-17)
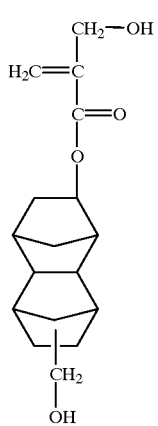
(III-18)
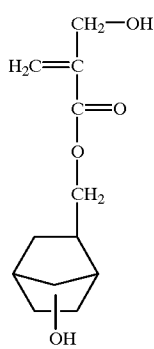
(III-19)
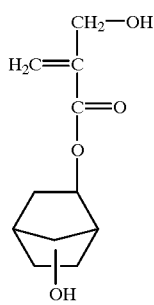
(III-20)
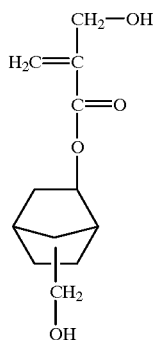
(III-21)
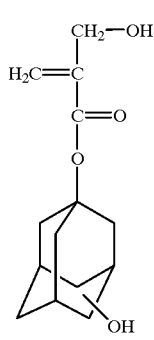

-continued
(III-22)
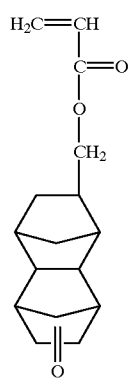
(III-23)
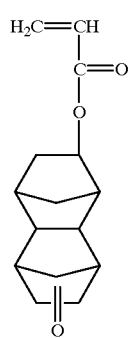
(III-24)
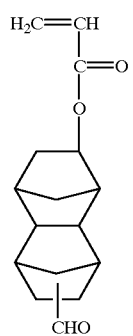
(III-25)
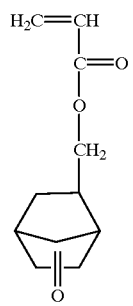
(III-26)
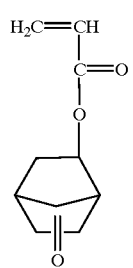
-continued
(III-27)
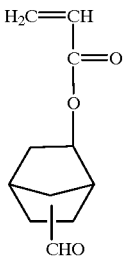
(III-28)
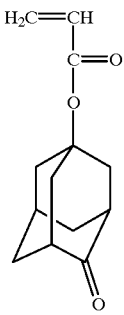
(III-29)
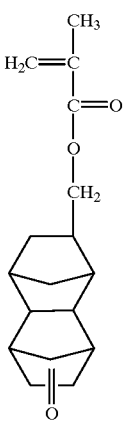
(III-30)
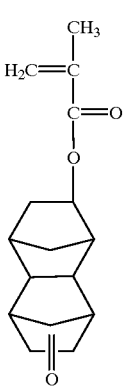

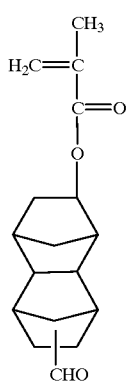
(III-31)
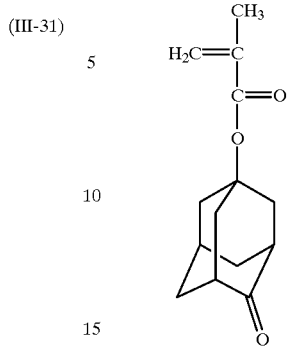
(III-35)
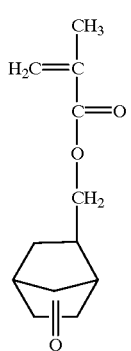
(III-32)
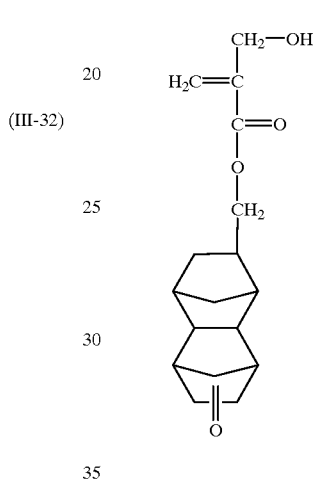
(III-36)
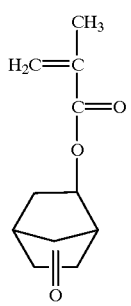
(III-33)
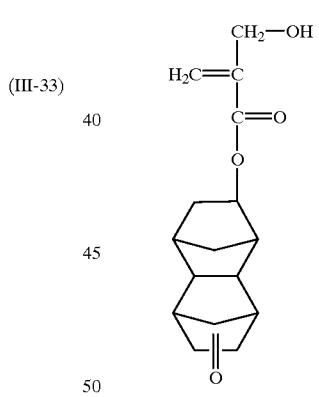
(III-37)
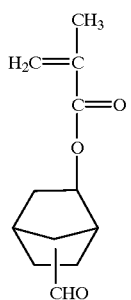
(III-34)
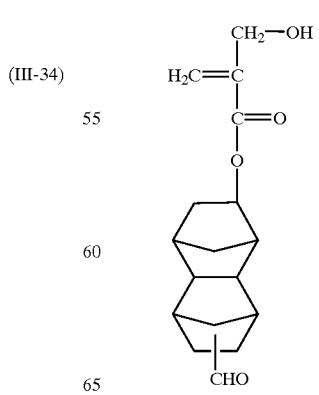
(III-38)

-continued
(III-39)
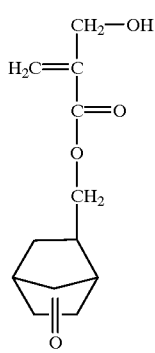
(III-40)
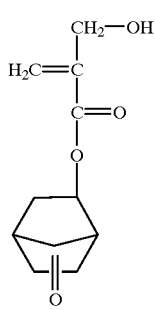
(III-41)
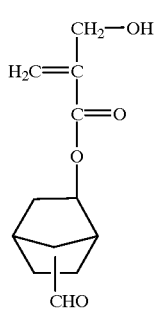
(III-42)
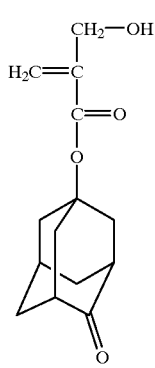
(III-43)
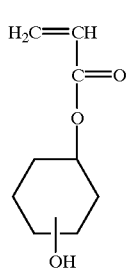
-continued
(III-44)
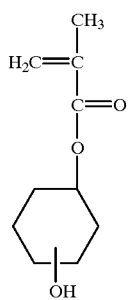
(III-45)
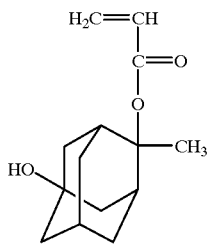
(III-46)
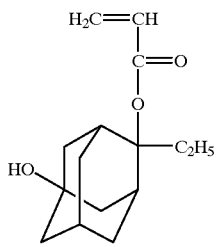
(III-47)
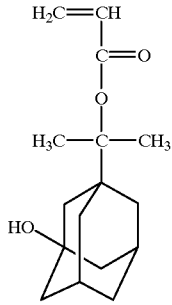
(III-48)
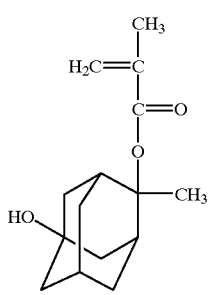

(III-49)
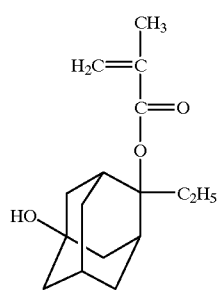
(III-50)
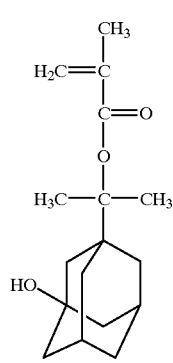
(III-51)
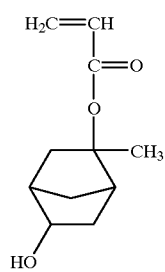
(III-52)
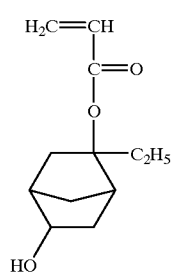
(III-53)
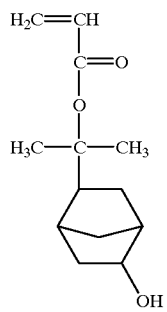
(III-54)
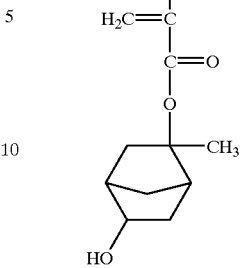
(III-55)
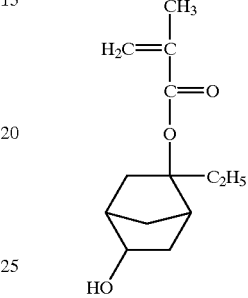
(III-56)
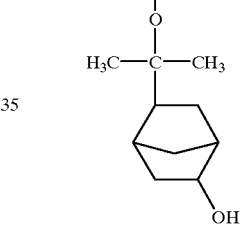
(III-57)
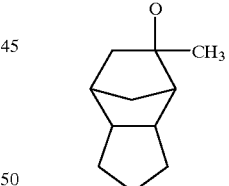
(III-58)
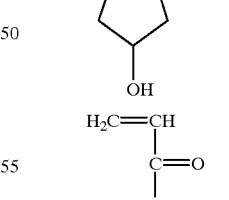

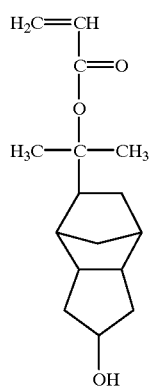 (III-59)
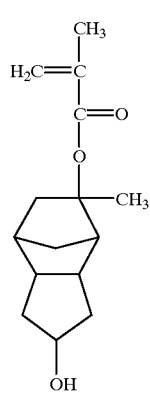 (III-60)
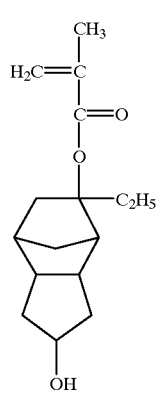 (III-61)
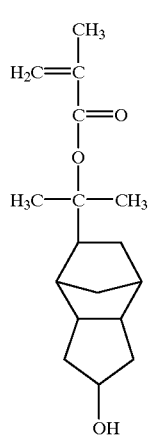 (III-62)
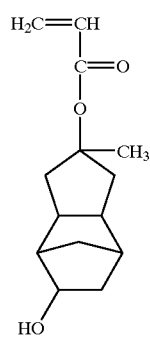 (III-63)
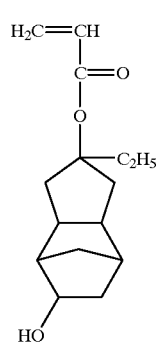 (III-64)
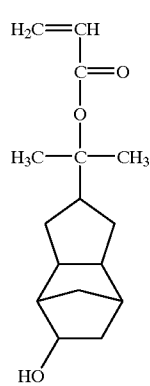 (III-65)
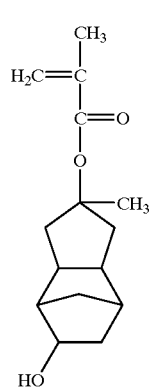 (III-66)

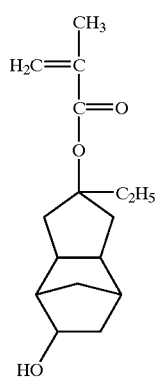 (III-67)
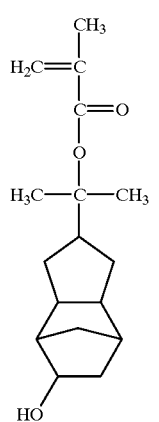 (III-68)
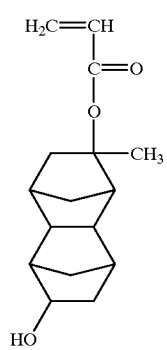 (III-69)
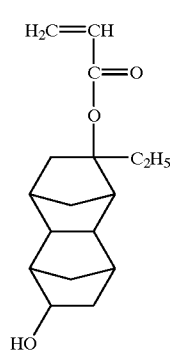 (III-70)
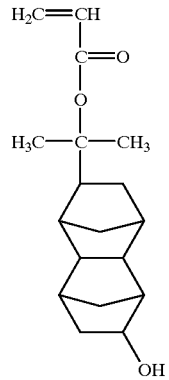 (III-71)
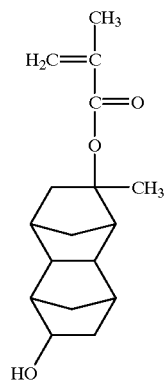 (III-72)
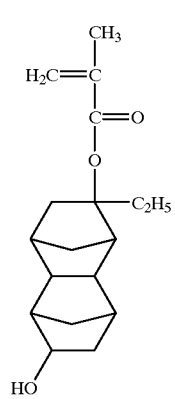 (III-73)
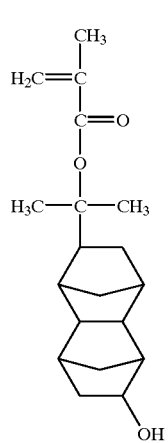 (III-74)

(III-75) 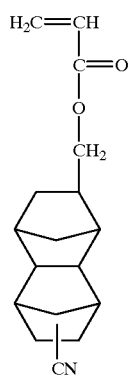
(III-76) 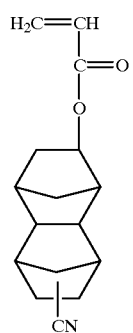
(III-77) 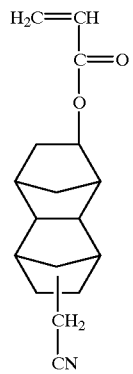
(III-78) 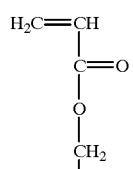
(III-79) 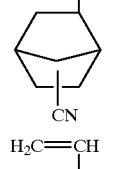
(III-80) 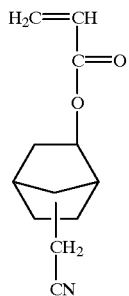
(III-81) 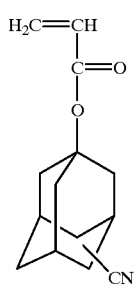
(III-82) 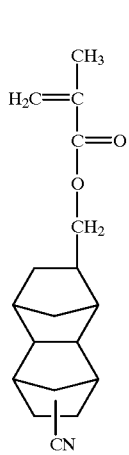
(III-83) 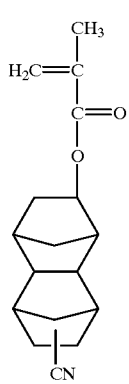

(III-84)
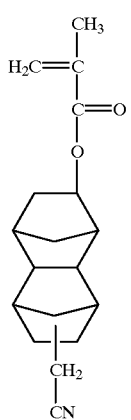
(III-85)
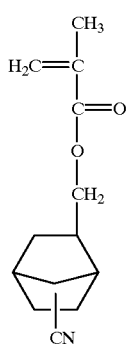
(III-86)
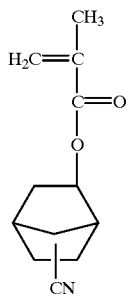
(III-87)
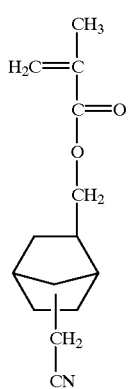
(III-88)
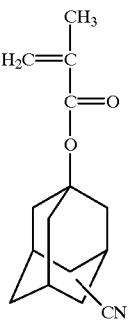
(III-89)
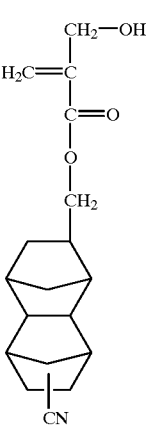
(III-90)
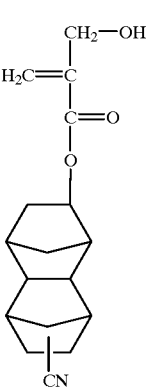
(III-91)
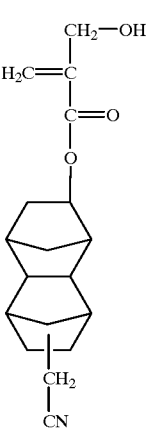

(III-92) 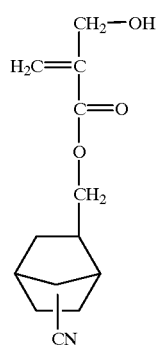
(III-93) 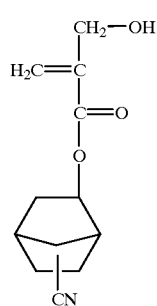
(III-94) 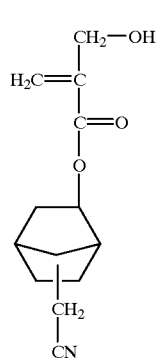
(III-95) 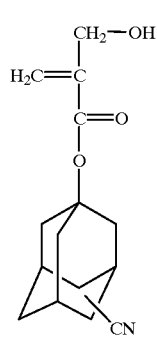
(III-96) 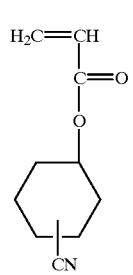
(III-97) 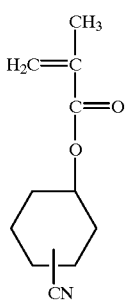
(III-98) 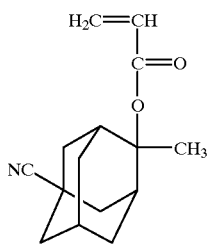
(III-99) 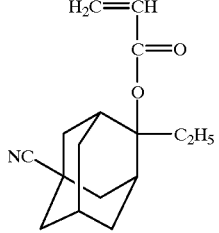
(III-100) 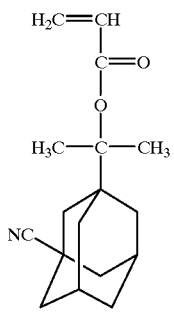
(III-101) 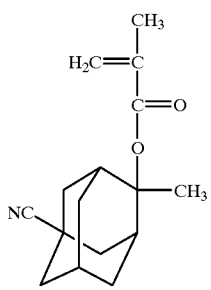

(III-102) 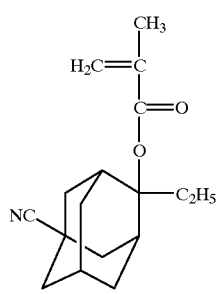
(III-103) 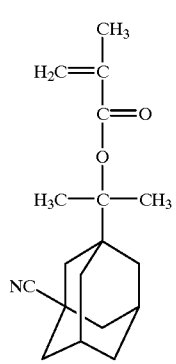
(III-104) 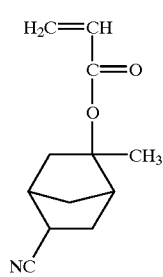
(III-105) 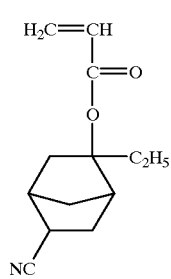
(III-106) 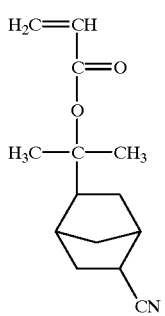
(III-107) 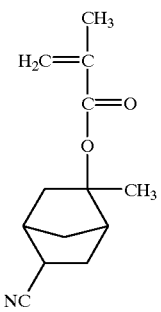
(III-108)
(III-109)
(III-110)
(III-111)

(III-112) 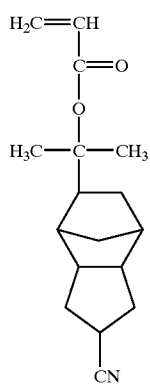
(III-113) 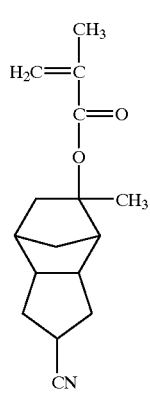
(III-114) 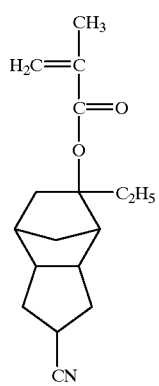
(III-115) 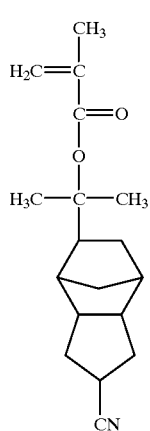
(III-116) 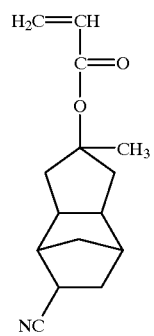
(III-117) 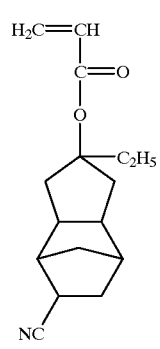
(III-118) 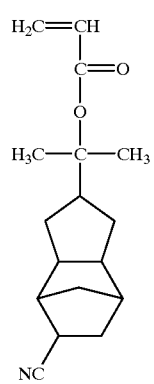
(III-119) 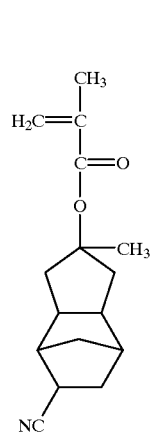

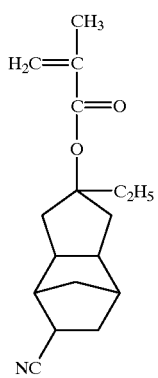 (III-119)
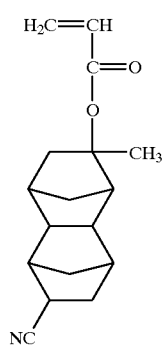 (III-121)
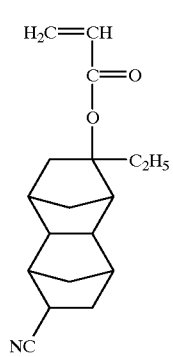 (III-122)
(III-123)
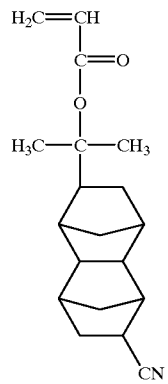 (III-120)
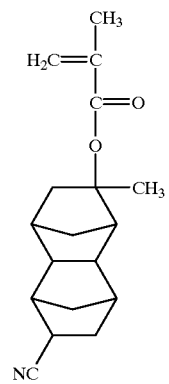 (III-124)
(III-125)
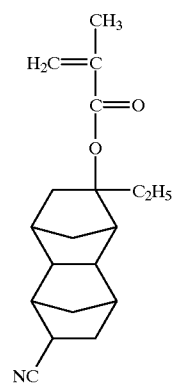 (III-126)
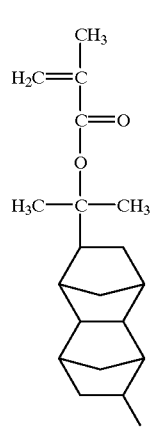 (III-127)

Of these acrylic acid derivatives (III), compounds shown by the formulas (III-1), (III-2), (III-4), (III-5), (III-7), (III-9), (III-12), (III-14), (III-28), and (III-35) are particularly preferable.

The recurring unit (III) may be used in the resin (ii-2) either individually or in combination of two or more.

As the group $R^{21}$ in the recurring unit (IV) of the resin (ii-2), a hydrogen atom, methyl group, and the like are preferable.

As examples of the monovalent alicyclic hydrocarbons containing 4–20 carbon atoms for $R^{22}$ and the divalent alicyclic hydrocarbons containing 4–20 carbon atoms formed by any two of the groups $R^{22}$s, groups having a bridged skeleton such as an adamantane skeleton, norbornane skeleton, tricyclodecane skeleton, and tetracyclododecane skeleton; groups having a cycloalkane structure such as cyclobutane, cyclopentane, cyclohexane, cycloheptane, and cyclooctane; groups in which the above group containing an alicyclic ring is substituted with at least one of linear, branched, or cyclic alkyl groups having 1–10 carbon atoms such as a methyl group, ethyl group, n-propyl group, i-propyl group, n-butyl group, 2-methylpropyl group, 1-methylpropyl group, or t-butyl group; and the like can be given.

Of these alicyclic hydrocarbon groups, the groups having a bridged skeleton, particularly an adamantane skeleton, norbornane skeleton, tricyclodecane skeleton, and tetracyclododecane skeleton are preferable.

As the linear or the branched alkyl group having 1–4 carbon atoms represented by $R^{22}$, a methyl group, ethyl group, and the like are particularly preferable.

The recurring unit (IV) is a group having an acid-dissociable carboxylic acid ester group.

The monomer providing the recurring unit (IV) is a compound with an acrylic acid moiety of which the hydrogen atom at the α position is replaced by the group $R^{21}$ and a carboxyl moiety of which the hydrogen atom is replaced by the group $-C(R^{22})_3$. Such a monomer is hereinafter referred to as an "acrylic acid derivative (IV)".

Compounds shown by the following formulas (IV-1) to (IV-30) can be given as specific examples of the acrylic acid derivatives (IV).

(IV-1)
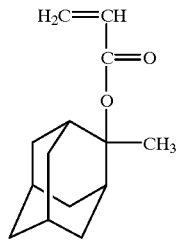

(IV-2)
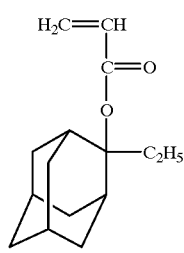

-continued (IV-3)

(IV-4)

(IV-5)

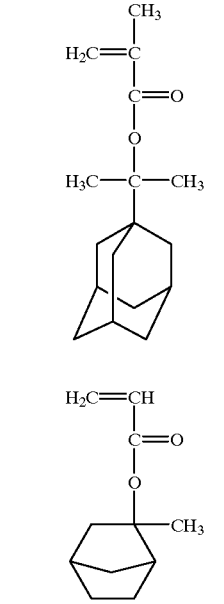

(IV-6)
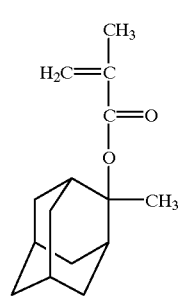

(IV-7)
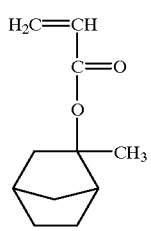

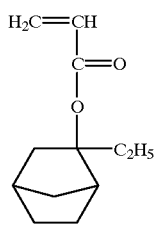 (IV-8)
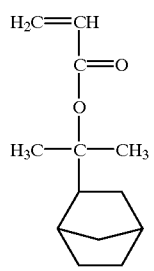 (IV-9)
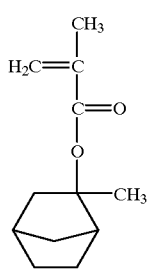 (IV-10)
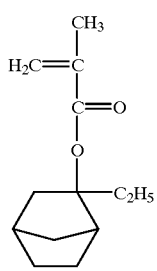 (IV-11)
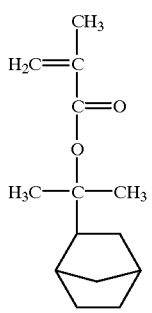 (IV-12)
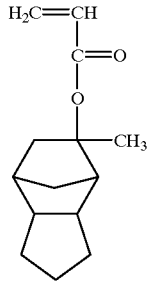 (IV-13)
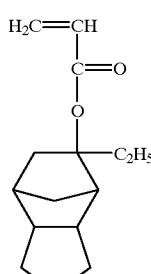 (IV-14)
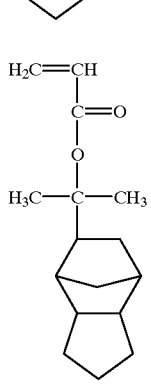 (IV-15)
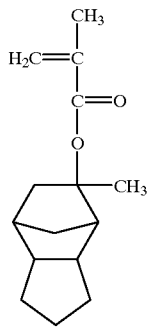 (IV-16)
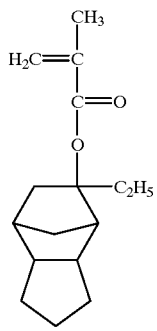 (IV-17)

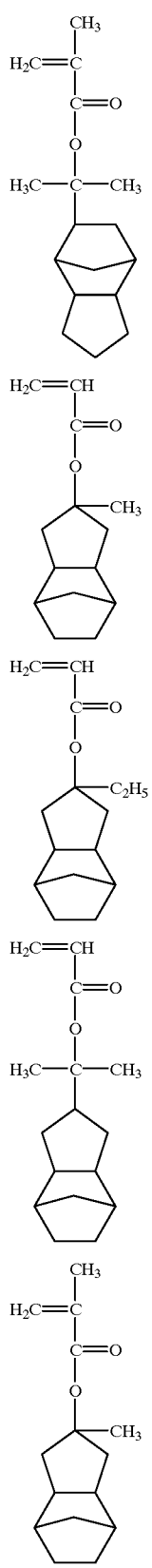
(IV-18)
(IV-19)
(IV-20)
(IV-21)
(IV-22)
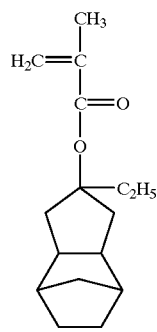
(IV-23)
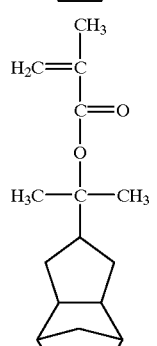
(IV-24)
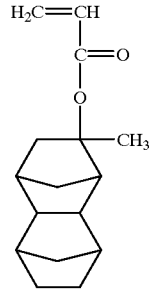
(IV-25)
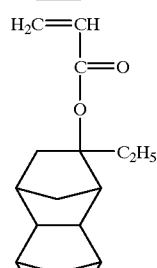
(IV-26)
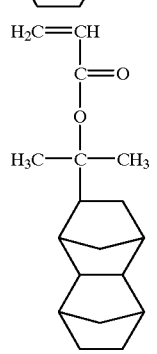
(IV-27)

-continued

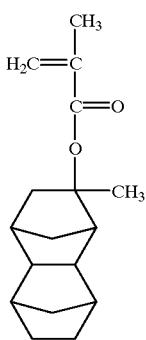
(IV-28)

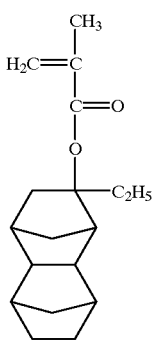
(IV-29)

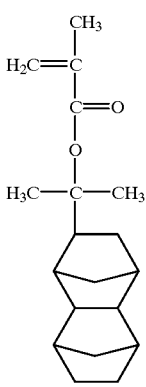
(IV-30)

Of these, compounds shown by the formulas (IV-1), (IV-2), (IV-3), (IV-5), (IV-6), (IV-7), and (IV-9) are preferable. The recurring unit (IV) may be used in the resin (ii-2) either individually or in combination of two or more.

The resin (ii-1) and resin (ii-2) may comprise one or more recurring units other than those described above (such recurring units are hereinafter referred to as "other recurring units").

As examples of monomers which provide the other recurring units, the following compounds (herein after referred to as "other monomers") can be given:

Mono-functional Monomers

Other alicyclic unsaturated compounds such as
5-fluorobicyclo[2.2.1]hept-2-ene,
5,5-difluorobicyclo[2.2.1]hept-2-ene,
5,6-difluorobicyclo[2.2.1]hept-2-ene,
5,5,6-trifluorobicyclo[2.2.1]hept-2-ene,
5,5,6,6-tetrafluorobicyclo[2.2.1]hept-2-ene,
5,5-difluoro-6,6-di(trifluoromethyl)bicyclo[2.2.1]hept-2-ene,
5,6-difluoro-5,6-di(trifluoromethyl)bicyclo[2.2.1]hept-2-ene,
5,5,6-trifluoro-6-trifluoromethylbicyclo[2.2.1]hept-2-ene,
5,5,6-trifluoro-6-trifluoromethoxybicyclo[2.2.1]hept-2-ene,
5,5,6-trifluoro-6-pentafluoro-n-propoxybicyclo[2.2.1]hept-2-ene,
5-fluoro-5-pentafluoroethyl-6,6-di(trifluoromethyl)bicyclo[2.2.1]hept-2-ene,
5,6-difluoro-5-heptafluoro-i-propyl-6-trifluoromethylbicyclo[2.2.1]hept-2-ene,
5-chloro-5,6,6-trifluorobicyclo[2.2.1]hept-2-ene,
5,6-dichloro-5,6-bis(trifluoromethyl)bicyclo[2.2.1]hept-2-ene,
5-(2,2,2-trifluorocarboethoxy)bicyclo[2.2.1]hept-2-ene,
5-methyl-5-(2,2,2-trifluorocarboethoxy)bicyclo[2.2.1]hept-2-ene,
8-fluorotetracyclo[4.4.0.1$^{2,5}$.1$^{7,10}$]dodec-3-ene,
8,8-difluorotetracyclo[4.4.0.1$^{2,5}$,1$^{7,10}$]dodec-3-ene,
8,9-difluorotetracyclo[4.4.0.1$^{2,5}$.1$^{7,10}$]dodec-3-ene,
8,8,9-trifluorotetracyclo[4.4.0.1$^{2,5}$.1$^{7,10}$]dodec-3-ene,
8,8,9,9-tetrafluorotetracyclo[4.4.0.1$^{2,5}$.1$^{7,10}$]dodec-3-ene,
8,8-difluoro-9,9-di(trifluoromethyl)tetracyclo[4.4.0.1$^{2,5}$.1$^{7,10}$]dodec-3-ene,
8,9-difluoro-8,9-di(trifluoromethyl)tetracyclo[4.4.0.1$^{2,5}$.1$^{7,10}$]dodec-3-ene,
8,8,9-trifluoro-9-trifluoromethyltetracyclo[4.4.0.1$^{2,5}$.1$^{7,10}$]dodec-3-ene,
8,8,9-trifluoro-9-trifluoromethoxytetracyclo[4.4.0.1$^{2,5}$.1$^{7,10}$]dodec-3-ene,
8,8,9-trifluoro-9-pentafluoro-n-propoxytetracyclo[4.4.0.1$^{2,5}$.1$^{7,10}$]dodec-3-ene,
8-fluoro-8-pentafluoroethyl-9,9-di(trifluoromethyl)tetracyclo[4.4.0.1$^{2,5}$.1$^{7,10}$]dodec-3-ene,
8,9-difluoro-8-heptafluoro-i-propyl-9-trifluoromethyltetracyclo[4.4.0.1$^{2,5}$.1$^{7,10}$]dodec-3-ene,
8-chloro-8,9,9-trifluorotetracyclo[4.4.0.1$^{2,5}$.1$^{7,10}$]dodec-3-ene,
8,9-dichloro-8,9-di(trifluoromethyl)tetracyclo[4.4.0.1$^{2,5}$.1$^{7,10}$]dodec-3-ene,
8-(2,2,2-trifluorocarboethoxy)tetracyclo[4.4.0.1$^{2,5}$.1$^{7,10}$]dodec-3-ene,
8-methyl-8-(2,2,2-trifluorocarboethoxy)tetracyclo[4.4.0.1$^{2,5}$.1$^{7,10}$]dodec-3-ene,
dicyclopentadiene, tricyclo[5.2.1.0$^{2,6}$]deca-8-ene,
tricyclo[5.2.1.0$^{2,6}$]dec-3-ene,
tricyclo[4.4.0.1$^{2,5}$]undec-3-ene,
tricyclo[6.2.1.0$^{1,8}$]undec-9-ene,
tricyclo[6.2.1.0$^{1,8}$]undec-4-ene,
tetracyclo[4.4.0.1$^{2,5}$.1$^{7,10}$.0$^{1,6}$]dodec-3-ene,
8-methyltetracyclo[4.4.0.1$^{2,5}$.1$^{7,10}$.0$^{1,6}$]dodec-3-ene,
8-ethylidenetetracyclo[4.4.0.1$^{2,5}$.1$^{7,12}$]dodec-3-ene,
8-ethylidenetetracyclo[4.4.0.1$^{2,5}$.1$^{7,10}$.0$^{1,6}$]dodec-3-ene,
pentacyclo[6.5.1.1$^{3,6}$.0$^{2,7}$.0$^{9,13}$]pentadec-4-ene,
pentacyclo[7.4.0.1$^{2,5}$.1$^{9,12}$.0$^{8,13}$]pentadec-3-ene, and the like;
(meth)acrylates such as methyl (meth)acrylate, ethyl (meth)acrylate, n-propyl (meth)acrylate, n-butyl (meth)acrylate, 2-methylpropyl (meth)acrylate, 2-hydroxyethyl (meth)acrylate, 2-hydroxypropyl (meth)acrylate, 3-hydroxypropyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, 2-(4'-methoxycyclohexyl)oxycarbonylethyl (meth)acrylate, norbornyl (meth)acrylate, isobornyl (meth)acrylate, tricyclodecanyl (meth)acrylate, tetracyclodecanyl(meth)acrylate, dicyclopentenyl (meth)acrylate, adamantyl (meth)acrylate, adamantylmethyl (meth)acrylate, 1-methyladamantyl (meth)acrylate, and the like; α-hydroxymethyl acrylates such as methyl α-hydroxymethyl acrylate, ethyl α-hydroxymethyl acrylate, n-propyl α-hydroxymethyl acrylate, and n-butyl α-hydroxymethyl acrylate; (meth) acryloyloxylactone compound having an acid-dissociable group such as α-(meth)acryloyloxy-β-methoxycarbonyl-γ-butyrolactone, α-(meth)acryloyloxy-β-ethoxycarbonyl-γ-butyrolactone, α-(meth)acryloyloxy-β-n-propoxycarbonyl-γ-butyrolactone, α-(meth)acryloyloxy-β-i-propoxycarbonyl-γ-butyrolactone, α-(meth)acryloyloxy-β-n-butoxycarbonyl-γ-butyrolactone, α-(meth)acryloyloxy-β-(2-methylpropoxy)carbonyl-γ-butyrolactone, α-(meth)acryloyloxy-β-(1-methylpropoxy)carbonyl-γ-butyrolactone, α-(meth)acryloyloxy-β-t-butoxycarbonyl-γ-butyrolactone, α-(meth)acryloyloxy-β-cyclohexyloxycarbonyl-γ-butyrolactone, α-(meth)acryloyloxy-β-(4-t-butylcyclohexyloxy)carbonyl-γ-butyrolactone, α-(meth)acryloyloxy-β-phenoxycarbonyl-γ-butyrolactone, α-(meth)acryloyloxy-β-(1-ethoxyethoxy)carbonyl-γ-butyrolactone, α-(meth)acryloyloxy-β-(1-cyclohexyloxyethoxy)carbonyl-γ-butyrolactone, α-(meth)acryloyloxy-β-t-butoxycarbonylmethoxycarbonyl-γ-butyrolactone, α-(meth)acryloyloxy-β-tetrahydrofuranyloxycarbonyl-γy-butyrolactone, α-(meth)acryloyloxy-β-tetrahydropyranyloxycarbonyl-γ-butyrolactone, α-methoxycarbonyl-β-(meth)acryloyloxy-γ-butyrolactone, α-ethoxycarbonyl-β-(meth)acryloyloxy-γ-butyrolactone, α-n-propoxycarbonyl-β-(meth)acryloyloxy-γ-butyrolactone, α-i-propoxycarbonyl-β-(meth)acryloyloxy-γ-butyrolactone, α-n-butoxycarbonyl-β-(meth)acryloyloxy-γ-butyrolactone, α-(2-methylpropoxy)carbonyl-β-(meth)acryloyloxy-γ-butyrolactone, α-(1-methylpropoxy)carbonyl-β-(meth)acryloyloxy-γ-butyrolactone, α-t-butoxycarbonyl-β-(meth)acryloyloxy-γ-butyrolactone, α-cyclohexyloxycarbonyl-β-(meth)acryloyloxy-γ-butyrolactone, α-(4-t-butylcyclohexyloxy)carbonyl-β-(meth)acryloyloxy-γ-butyrolactone, α-phenoxycarbonyl-β-(meth)acryloyloxy-γ-butyrolactone, α-(1-ethoxyethoxy)carbonyl-β-(meth)acryloyloxy-γ-butyrolactone, α-(1-cyclohexyloxyethoxy)carbonyl-β-(meth)acryloyloxy-γ-butyrolactone, α-t-butoxycarbonylmethoxycarbonyl-β-(meth)acryloyloxy-γ-butyrolactone, α-tetrahydrofuranyloxycarbonyl-β-(meth)acryloyloxy-γ-butyrolactone, α-tetrahydropyranyloxycarbonyl-β-(meth)acryloyloxy-γ-butyrolactone, and the like; (meth)acryloyloxylactone compound having no acid-dissociable group such as α-(meth)acryloyloxy-γ-butyrolactone, α-(meth)acryloyloxy-β-fluoro-γ-butyrolactone, α-(meth)acryloyloxy-β-hydroxy-γ-butyrolactone, α-(meth)acryloyloxy-β-methyl-γ-butyrolactone, α-(meth)acryloyloxy-β-ethyl-γ-butyrolactone, α-(meth)acryloyloxy-β,β-dimethyl-γ-butyrolactone, α-(meth)acryloyloxy-β-methoxy-γ-butyrolactone, β-(meth)acryloyloxy-γ-butyrolactone, α-fluoro-β-(meth)acryloyloxy-γ-butyrolactone, α-hydroxy-β-(meth)acryloyloxy-γ-butyrolactone, α-methyl-β-(meth)acryloyloxy-γ-butyrolactone, α-ethyl-β-(meth)acryloyloxy-γ-butyrolactone, α,α-dimethyl-β-(meth)acryloyloxy-γ-butyrolactone, α-methoxy-β-(meth)acryloyloxy-γ-butyrolactone, α-(meth)acryloyloxy-δ-mevalonolactone, and the like; vinyl esters such as vinyl acetate, vinyl propionate, and vinyl butyrate; unsaturated nitrile compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl (meth)acrylamide, crotonamide, maleinamide, fumaramide, mesaconamide, citraconamide, and itaconamide; other nitrogen-containing vinyl compounds such as N-vinyl-ε-caprolactam, N-vinylpyrrolidone, vinylpyridine, and vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acids such as 2-carboxyethyl (meth)acrylate, 2-carboxypropyl (meth)acrylate, 3-carboxypropyl (meth)acrylate, 4-carboxybutyl (meth)acrylate, 4-carboxycyclohexyl (meth)acrylate, carboxytricyclodecanyl (meth)acrylate, and carboxytetracyclodecanyl (meth)acrylate; and compounds in which a carboxyl group in the above unsaturated carboxylic acids or carboxyl group-containing esters of unsaturated carboxylic acids is converted into an acid-dissociable organic group (hereinafter referred to as "other acid-dissociable group-containing monomers"); polyfunctional monomers such as methylene glycol di(meth)acrylate, ethylene glycol di(meth)acrylate, propylene glycol di(meth)acrylate, 1,6-hexanediol di (meth) acrylate, 2,5-dimethyl-2,5-hexanediol di(meth)acrylate, 1,8-octanediol di(meth)acrylate, 1,9-nonanediol di(meth) acrylate, 1,4-bis(2-hydroxypropyl)benzene di(meth) acrylate, 1,3-bis(2-hydroxypropyl)benzene di(meth) acrylate, 1,2-adamantanediol di(meth)acrylate, 1,3-adamantanediol di(meth)acrylate, 1,4-adamantanediol di(meth)acrylate, and tricyclodecanyldimethylol di(meth) acrylate.

The following resins are given as the resin (ii-2) of the present invention: a resin containing the recurring unit (III) in which $R^{17}$ is a group shown by the formula (i) wherein $R^{18}$ representing an alicyclic hydrocarbon group is a group having a skeleton selected from the group consisting of an adamantane skeleton, norbornane skeleton, tricyclodecane skeleton, and tetracyclododecane skeleton, and $X^1$ is a hydroxyl group; and a resin containing the recurring unit (IV) in which $R^{22}$s representing an alicyclic hydrocarbon group or its derivative are independently a group having a skeleton selected from the group consisting of an adamantane skeleton, norbornane skeleton, tricyclodecane skeleton, and tetracyclododecane skeleton. Both of the above requirements for $R^{17}$ in the recurring unit (III) and $R^{22}$ in the recurring unit (IV) are satisfied when the resin (ii-2) has both the recurring unit (III) and the recurring unit (IV).

The amount of the recurring unit (I) in the resin (ii-1) is 5–95 mol %, preferably 10–70 mol %, and still more preferably 20–50 mol % of the total amount of the recurring units. If the amount of the recurring unit (I) is less than 5 mol %, dry etching resistance as a resist tends to decrease. If the amount exceeds 95 mol %, developability and adhesion to substrates as a resist tend to decrease.

The amount of the recurring unit (II) is usually 5–85 mol %, preferably 10–50 mol %, and still more preferably 10–45 mol % of the total amount of the recurring units. If the amount of the recurring unit (II) is less than 5 mol %, adhesion to substrates as a resist tends to decrease. If the amount exceeds 85 mol %, on the other hand, dry etching resistance as a resist tends to decrease.

The amount of other recurring units is usually 20 mol % or less, and preferably 10 mol % or less.

When the recurring unit (I) in the resin (ii-1) does not have an acid-dissociable group, the resin (ii-1) must contain another recurring unit derived from an acid-dissociable group.

When the resin (ii-1) has such another recurring unit derived from an acid-dissociable group, the total amount of the recurring units having an acid-dissociable group is 5–85 mol %, preferably 10–70 mol %, and still more preferably 15–50 mol %. If the amount of the above recurring units is less than 5 mol %, resolution as a resist tends to decrease. If the amount exceeds 85 mol %, on the other hand, developability as a resist tends to decrease.

The amount of the recurring unit (I) in the resin (ii-2) is usually 5–95 mol %, preferably 10–70 mol %, and still more preferably 20–50 mol % of the total amount of the recurring units. The amount of the recurring unit (II) is usually 5–85 mol %, preferably 10–50 mol %, and still more preferably 10–45 mol % of the total amount of the recurring units. The amount of the recurring unit (III) and/or the recurring unit (IV) is usually 5–85 mol %, preferably 10–50 mol %, and still more preferably 10–40 mol % of the total amount of the recurring units. If the amount of the recurring unit (I) is less than 5 mol %, dry etching resistance as a resist tends to decrease; if more than 95 mol %, developability and adhesion to substrates as a resist tend to decrease. If the amount of the recurring unit (II) is less than 5 mol %, adhesion to substrates as a resist tends to decrease; if more than 85 mol %, on the other hand, dry etching resistance as a resist tends to decrease. If the amount of the recurring unit (III) and/or the recurring unit (IV) is less than 5 mol %, resolution as a resist tends to decrease; if more than 85 mol %, developability as a resist tends to decrease.

The amount of the other recurring units is usually 20 mol % or less, and preferably 10 mol % or less.

The total amount of the recurring units having an acid-dissociable group in the resin (ii-2) is 5–85 mol %, preferably 10–70 mol %, and still more preferably 20–50 mol % of the total amount of the recurring units. If the amount of the above recurring units is less than 5 mol %, resolution as a resist tends to decrease. If the amount exceeds 85 mol %, on the other hand, adhesion to substrates tends to decrease.

The resin (ii-1) and the resin (ii-2) are prepared by copolymerizing the norbornene derivatives (I) and maleic anhydride (in the case of the resin (ii-1)) or the norbornene derivatives (I), maleic anhydride, and acrylic acid derivatives (III) and/or acrylic acid derivatives (IV) (in the case of the resin (ii-2)), together with other optional monomers in an appropriate solvent using a radical polymerization initiator such as hydroperoxides, dialkyl peroxides, diacyl peroxides, or azo compounds and, as required, in the presence of a chain-transfer agent.

As examples of the solvent used for copolymerization of the components, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, and diethoxyethanes; and the like can be given.

These solvents may be used either individually or in combination of two or more.

The copolymerization is carried out at a temerature of usually 40–120° C., and preferably 50–90° C. for usually 1–48 hours, and preferably 1–24 hours.

The polystyrene-reduced weight average molecular weight of the acid-dissociable group-containing resin by gel permeation chromatography (GPC) (hereinafter referred to as "Mw") is as follows. The Mw of the acid-dissociable group-containing resin having no branched structure is usually 1,000–300,000, preferably 1,000–200,000, and still more preferably 3,000–100,000.

Mw of the acid-dissociable group-containing resin having a branched structure is preferably 5,000–500,000, and more preferably 8,000–300,000.

In the positive-tone radiation-sensitive resin composition of the present invention, the acid-dissociable group-containing resins can be used either individually or in combination of two or more.

The acid-dissociable group-containing resins also exhibit characteristics of controlling alkali solubility of the alkali-soluble resin. The acid-dissociable group-containing resins dissociate in the presence of an acid, and reduce or eliminate the effect of controlling alkali solubility of the alkali-soluble resin, thereby accelerating alkali solubility of the alkali-soluble resin. The acid-dissociable group-containing resins thus function in the same manner as the alkali solubility control agent of the component (C-2) in the first invention.

Alkali-soluble Resin

The alkali-soluble resin used in the first invention (as the component (C-1)) and second invention (as the component (D)) is a resin having at least one functional group exihibiting affinity with an alkaline developing solution, for example, an acidic functional group such as a carboxyl group or phenolic hydroxyl group.

As examples of such an alkali-soluble resin, an addition polymerization resin having at least one recurring unit shown by the following formula (2), (3), or (4), a polycon densation resin having at least one recurring unit shown by the following formula (5), and the like can be given.

(2)

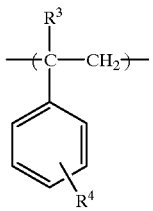

wherein $R^3$ represents a hydrogen atom or a methyl group and $R^4$ represents a hydroxyl group, a carboxyl group, —$R^5COOH$, —$OR^5COOH$, —$OCOR^5COOH$, or —$COOR^5COOH$ ($R^5$ is a group —$(CH_2)_g$— wherein g is an integer of 1–4).

(3)

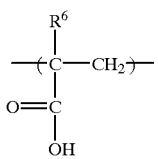

wherein $R^6$ represents a hydrogen atom or a methyl group.

(4)

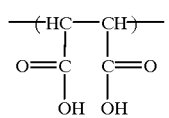

(5)

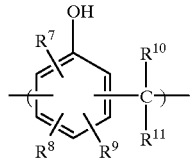

wherein $R^7$, $R^8$, $R^9$, $R^{10}$, and $R^{11}$ individually represent a hydrogen atom or an alkyl group having 1–4 carbon atoms.

In the case where the alkali-soluble resin is an addition polymerization resin, such a resin may be formed only from the recurring units shown by the formulas (2) to (4), or may further contain one or more other recurring units inasmuch as the resin is soluble in alkali.

Given as examples of such other recurring units are unit is obtained by cleavage of a polymerizable unsaturated bond of a compound such as styrene, α-methylstyrene, maleic anhydride, (meth)acrylonitrile, crotonitrile, maleinitrile, fumarnitrile, mesaconitrile, citraconitrile, itaconitrile, (meth)acrylamide, crotonamide, maleinamide, fumaramide, mesaconamide, citraconamide, itaconamide, vinyl aniline, vinylpyridine, vinyl-ε-caprolactam, vinyl pyrrolidone, vinyl imidazole, or the like.

The addition polymerization resin can be prepared by (co)polymerization of monomers corresponding to the recurring unit shown by the formula (2), (3), or (4), optionally together with monomers which form the above other recurring units.

Such (co)polymerization is carried out by block polymerization, solution polymerization, precipitation polymerization, emulsion polymerization, suspension polymerization, block-suspension polymerization, or the like using an appropriate polymerization initiator or catalyst such as a radical polymerization initiator, anionic polymerization catalyst, conjugated anionic polymerization catalyst, cationic polymerization catalyst, or the like according to the type of monomers or reaction media.

In the case where the alkali-soluble resin is a polycondensation resin, such a resin may be formed only from the recurring unit shown by the formula (5), or may further contain one or more other recurring units inasmuch as the resin is soluble in alkali. The polycondensation resin can be prepared by (co)polymerization of phenols and aldehydes corresponding to the recurring unit shown by the formula (5), optionally together with monomers which form the other recurring units, in the presence of an acid catalyst using an aqueous medium or a mixture of water and a hydrophilic solvent.

As the phenols, o-cresol, m-cresol, p-cresol, 2,3-xylenol, 2,4-xylenol, 2,5-xylenol, 3,4-xylenol, 3,5-xylenol, 2,3,5-trimethyl phenol, 3,4,5-trimethyl phenol, and the like can be given. As the aldehydes, formaldehyde, trioxane, paraformaldehyde, benzaldehyde, acetaldehyde, propyl aldehyde, phenyl acetaldehyde, and the like can be given.

Although the amount of the recurring units shown by the above formulas (2) to (5) in the alkali-soluble resin may vary according to the types of the other optional recurring units, such an amount is preferably 10–100 mol %, and more preferably 20–100 mol %.

The alkali soluble resin may be used as the hydrogenate when the resin has a recurring unit which contains a carbon—carbon unsaturated bond shown by the formulas (2) and (5), for example. In this instance, the hydrogenation degree is usually 70% or less, preferably 50% or less, and still more preferably 40% or less of the total amount of the carbon—carbon unsaturated bonds in the recurring units shown by the formulas (2), (5), and the other similar recurring units. If the hydrogenation degree is more than 70%, developability of the alkali-soluble resin by an alkaline developer may decrease.

As an alkali-soluble resin in the first invention and the second invention, a resin containing poly (p-hydroxystyrene), p-hydroxystyrene/p-hydroxy-α-methylstyrene copolymer, p-hydroxystyrene/styrene copolymer, or the like as a major component is particularly preferable.

Although Mw of the alkali-soluble resin varies according to the characteristics desired for the radiation-sensitive resin composition, a preferable range is 1,000–150,000, with the range of 3,000–100,000 being more preferable.

The alkali-soluble resin can be used either individually or in combination of two or more in the first invention and the second invention.

Alkali Solubility Control Agent

As the alkali solubility control agent used as the component (C-2) in the first invention, a compound having an acid functional group such as a phenolic hydroxyl group, carboxyl group, or the like, of which at least one hydrogen atom is replaced by a substitution group capable of dissociating in the presence of an acid (hereinafter referred to as "acid-dissociable substituent") can be given.

As examples of such an acid-dissociable substituent, the same groups as the acid-dissociable group as mentioned in connection with the acid-dissociable group-containing resin, such as a substituted methyl group, 1-substituted ethyl group, 1-substituted n-propyl group, 1-branched alkyl group, silyl group, germyl group, alkoxycarbonyl group, acyl group, cyclic acid-dissociable group, and the like, can be given.

The alkali solubility control agent may be either a low molecular weight compound or a high molecular weight compound. The compounds shown by the following formulas (18) to (22) can be given as specific examples of the low molecular weight compound.

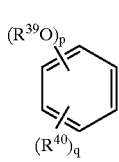

(18)

wherein $R^{39}$s individually indicate an acid-dissociable substituent, $R^{40}$s individually represent an alkyl group having 1–4 carbon atoms, a phenyl group, or a 1-naphthyl group, p is an integer of 1 or more, and q is an integer of 0 or more, provided that $p+q \leq 6$.

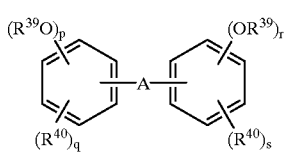

(19)

wherein $R^{39}$ and $R^{40}$ are the same as defined in the formula (18) A is a single bond, —O—, —S—, —CO—, —COO—, —SO—, —SO$_2$—, —C($R^{41}$)($R^{42}$)— (wherein $R^{41}$ and $R^{42}$ individually represent a hydrogen atom, alkyl group having 1–6 carbon atoms, acyl group having 2–11 carbon atoms, phenyl group, or 1-naphthyl group), or a group shown by the following formula,

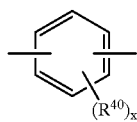

(wherein $R^{40}$ is the same as defined above and x is an integer of 0–4), and p, q, r, and s are integers of 0 or more, provided that $p+q \leq 5$, $r+s \leq 5$, and $p+r \geq 1$ are satisfied.

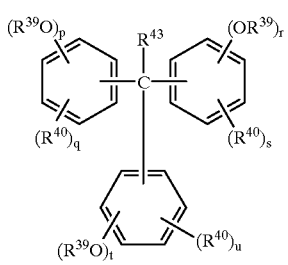

(20)

wherein $R^{39}$ and $R^{40}$ are the same as defined in the formula (18), $R^{43}$ represents a hydrogen atom, alkyl group having 1–4 carbon atoms, or phenyl group, and p, q, r, s, t, and u are integers of 0 or more, provided that $p+q \leq 5$, $r+s \leq 5$, $t+u \leq 5$, and $p+r+t \geq 1$ are satisfied.

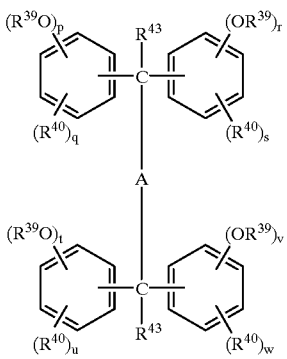

(21)

wherein $R^{39}$ and $R^{40}$ are the same as defined in the formula (18), A is the same as defined in the formula (19), $R^{43}$ is the same as defined in the formula (20), and p, q, r, s, t, u, v, and w are integers of 0 or more, provided that $p+q \leq 5$, $r+s \leq 5$, $t+u \leq 5$, $v+w \leq 5$, and $p+r+t+v \geq 1$ are satisfied.

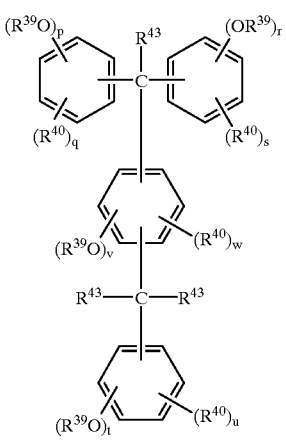

(22)

wherein $R^{39}$ and $R^{40}$ are the same as defined in the formula (18), $R^{43}$ is the same as defined in the formula (20), and p, q, r, s, t, u, v, and w are integers of 0 or more, provided that $p+q \leq 5$, $r+s \leq 5$, $t+u \leq 5$, $v+w \leq 4$, and $p+r+t+v \geq 1$ are satisfied.

As a high molecular weight alkali solubility control agent, the above-described acid-dissociable group-containing resins, for example, can be used.

The compounds shown by the following formula (23) or (24) are particularly preferable as the alkali solubility control agent used in the first invention.

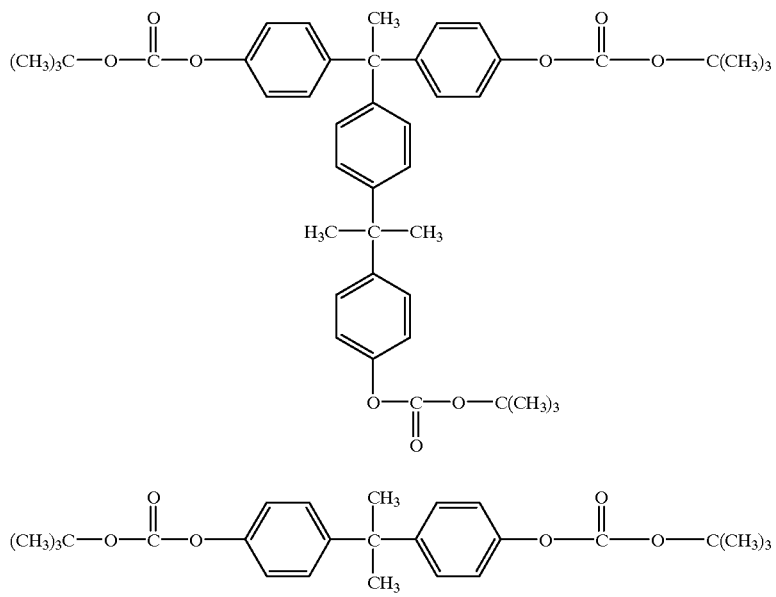

(23)

(24)

In the first invention, the low molecular weight compounds and high molecular weight compounds (i.e. acid-dissociable group-containing resins) can be used as a dissolution control agent either individually or in combination of two or more. In addition, the low molecular weight compounds and high molecular weight compounds may be used in combination.

Crosslinking Agent

As an example of the crosslinking agent used in the second invention as the component (E), which is a compound crosslinkable with an alkali-soluble resin in the presence of an acid (an acid generated by exposure, for example), a compound having at least one functional group exhibiting crosslinking reactivity with an alkali-soluble resin can be given (such a functional group is hereinafter referred to as "a crosslinkable functional group").

The groups shown by the following formulas (6) to (10) can be given as examples of the crosslinkable functional group.

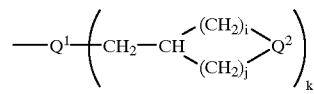

(6)

wherein k is an integer 1 or 2, $Q^1$ indicates a single bond, —O—, —S—, —COO—, or —NH— when k=1 and a trivalent nitrogen atom when k=2, $Q^2$ is —O— or —S—, i is an integer of 0–3, and j is an integer of 1–3, provided that i+j=1l-4.

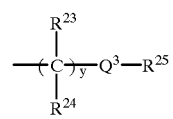

(7)

wherein $Q^3$ is —O—, —CO—, or —COO—, $R^{23}$ and $R^{24}$ individually represent a hydrogen atom or alkyl group having 1–4 carbon atoms, $R^{25}$ represents an alkyl group having 1–5 carbon atoms, aryl group having 6–12 carbon atoms, or aralkyl group having 7–14 carbon atoms, and y is an integer of 1 or more.

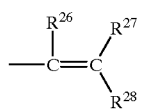

(8)

wherein $R^{26}$, $R^{27}$, and $R^{28}$ individually represent a hydrogen atom or an alkyl group having 1–4 carbon atoms.

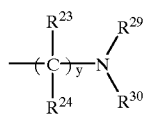

(9)

wherein $R^{23}$ and $R^{24}$ are the same as defined in the formula (7), $R^{29}$ and $R^{30}$ individually represent an alkyl group having 1–5 carbon atoms or an alkylol group having 1–5 carbon atoms, and y is an integer of 1 or more.

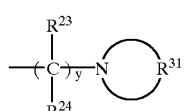

(10)

wherein $R^{23}$ and $R^{24}$ are the same as defined in the formula (7), $R^{31}$ represents a divalent organic group having a hetero atom selected from oxygen atom, sulfur atom, and nitrogen atom, and y is an integer of 1 or more.

As specific examples of such a crosslinkable functional group, a glycidyl ether group, glycidyl ester group, glycidyl amino group, methoxymethyl group, ethoxymethyl group, benzyloxymethyl group, acetoxymethyl group, benzoiloxy methyl group, formyl group, acetyl group, vinyl group, iso-propenyl group, dimethylaminomethyl group, diethylolaminomethyl group, morpholinomethyl group, and the like can be given.

As examples of the compound having such a crosslinkable functional group, a bisphenol A epoxy compound, bisphenol F epoxy compound, bisphenol S epoxy compound, novolac resin epoxy compound, resol resin epoxy compound, poly(hydroxystyrene) epoxy compound, methylol group-containing melamine compound, methylol group-containing benzoquanamine compound, methylol group-containing urea compound, methylol group-containing phenol compound, alkoxyalkyl group-containing melamine compound, alkoxyalkyl group-containing benzoquanamine compound, alkoxyalkyl group-containing urea compound, alkoxyalkyl group-containing phenol compound, carboxymethyl group-containing melamine resin, carboxymethyl group-containing benzoquanamine resin, carboxymethyl group-containing urea resin, carboxymethyl group-containing phenol resin, carboxymethyl group-containing melamine compound, carboxymethyl group-containing benzoquanamine compound, carboxymethyl group-containing urea compound, carboxymethyl group-containing phenol compound, and the like can be given.

Of these compounds having a crosslinkable functional groups, a methylol group-containing phenol compound, methoxymethyl group-containing melamine compound, methoxymethyl group-containing phenol compound, methoxymethyl group-containing glycoluril compound, methoxymethyl group-containing urea compound, and acetoxymethyl group-containing phenol compound are preferable, with particularly preferable compounds being a methoxymethyl group-containing melamine compound (for example, hexamethoxymethylmelamine), methoxymethyl group-containing glycoluril compound, methoxymethyl group-containing urea compound, and the like. Methoxymethyl group-containing melamine compounds are commercially available under the trademarks CYMEL300, CYMEL301, CYMEL303, and CYMEL305 (manufactured by Mitsui Cyanamid Co., Ltd.), methoxymethyl group-containing glycoluril compounds are commercially available under the trademark CYMEL 1174 (manufactured by Mitsui Cyanamid Co., Ltd.) and the like; and methoxymethyl group-containing urea compounds are commercially available under the trademark MX290 (manufactured by Sanwa Chemical Co., Ltd.) and the like.

A compound provided with crosslinking agent characteristics by replacing a hydrogen atom of an acid functional group in an alkali-soluble resin with the above-mentioned crosslinkable functional group can also be suitably used as a crosslinking agent. The amount of the crosslinkable functional group introduced is usually 5–60 mol %, preferably 10–50 mol %, and still more preferably 15–40 mol % of the total acid functional groups in the alkali-soluble resin, although the specific percentage varies depending on types of crosslinkable functional group and the alkali-soluble resin into which the crosslinkable functional group is introduced. The amount of crosslinkable functional group less than 5 mol % may decrease the rate of residual coatings and tends to induce meandering and swelling of the patterns. If the amount exceeds 60 mol %, developability of exposed areas tends to decrease.

Methoxymethyl group-containing compounds such as dimethoxymethyl urea and tetramethoxymethyl glycoluril are particularly preferable as the crosslinking agent in the second invention.

The crosslinking agent can be used either individually or in combination of two or more in the second invention.

Although the proportion of the components in the positive tone radiation-sensitive resin composition of the first invention and the negative tone radiation-sensitive resin composition of the second invention varies according to the characteristics desired for the resist, a preferable proportion is are as follows.

In the first invention, the amount of the compound (A) is preferably 0.001–15 parts by weight, more preferably 0.005–10 parts by weight, and particularly preferably 0.01–5 parts by weight, for 100 parts by weight of the acid-dissociable group-containing resin or alkali-soluble resin. The amount of the compound (A) less than 0.001 part by weight may impair resolution and cause pattern configurations to be deteriorated. If the amount exceeds 15 parts by weight, sensitivity and developability of exposed areas tend to decrease.

The amount of the acid generator (B) to be added is preferably 0.01–70 parts by weight, still more preferably 0.1–50 parts by weight, and particularly preferably 0.5–20 parts by weight for 100 parts by weight of the acid-dissociable group-containing resin or alkali-soluble resin. The amount of the acid generator (B) less than 0.01 part by weight may impair sensitivity and resolution. If the amount exceeds 70 parts by weight, resist coating properties and pattern configuration tend to be affected.

The amount of the alkali solubility control agent to be added is preferably 5–150 parts by weight, still more preferably 5–100 parts by weight, and particularly preferably 5–50 parts by weight for 100 parts by weight of the alkali-soluble resin. The amount of alkali solubility control agent less than 5 parts by weight may decrease the rate of residual coatings and induce swelling of patterns. If the amount exceeds 150 parts by weight, coating surface roughening and decrease in the coating surface strength tends to occur.

More specific proportion of each component in the first invention is as follows.

A preferable proportion is as follows:
(1-1) Compound (A): 0.001–15 parts by weight, acid generator (B): 0.01–70 parts by weight, and acid-dissociable group-containing resin: 100 parts by weight, or
(1-2) Compound (A): 0.001–15 parts by weight, acid generator (B): 0.01–70 parts by weight, alkali-soluble resin: 100 parts by weight, and alkali solubility control agent: 5–150 parts by weight.

A more preferable proportion is as follows:
(1-3) Compound (A): 0.005–10 parts by weight, acid generator (B): 0.1–50 parts by weight, and acid-dissociable group-containing resin: 100 parts by weight, or
(1-4) Compound (A): 0.005–10 parts by weight, acid generator (B): 0.1–50 parts by weight, alkali-soluble resin: 100 parts by weight, and alkali solubility control agent: 5–100 parts by weight.

A particularly preferable proportion is as follows:
(1-5) Compound (A): 0.01–3 parts by weight, acid generator (B): 0.5–20 parts by weight, and acid-dissociable group-containing resin: 100 parts by weight, or
(1-6) Compound (A): 0.01–3 parts by weight, acid generator (B): 0.5–20 parts by weight, alkali-soluble resin: 100 parts by weight, and alkali solubility control agent: 5–50 parts by weight.

In the second invention, the amount of the compound (A) is preferably 0.001–15 parts by weight, more preferably 0.005–10 parts by weight, and particularly preferably 0.01–3 parts by weight, for 100 parts by weight of the acid-dissociable group-containing resin or alkali-soluble resin. The amount of the compound (A) less than 0.001 part by weight may impair resolution and cause pattern configurations to be deteriorated. If the amount exceeds 15 parts by weight, sensitivity and developability of exposed areas tend to decrease.

The amount of the acid generator (B) to be added is preferably 0.01–70 parts by weight, still more preferably 0.1–50 parts by weight, and particularly preferably 0.5–20 parts by weight for 100 parts by weight of the alkali-soluble resin. The amount of the acid generator (B) less than 0.01 part by weight may impair sensitivity and resolution. If the amount exceeds 70 parts by weight, resist coating properties and pattern configuration tend to be affected.

The amount of the crosslinking agent to be added is preferably 5–95 parts by weight, still more preferably 15–85 parts by weight, and particularly preferably 20–75 parts by weight for 100 parts by weight of the alkali-soluble resin. The amount of the crosslinking agent less than 5 parts by weight may decrease the rate of residual coatings and tends to induce meandering and swelling of the patterns. If the amount exceeds 95 parts by weight, developability of exposed areas tends to decrease.

More specific proportion of each component in the second invention is as follows.

A preferable proportion is as follows:
(2-1) Compound (A): 0.001–15 parts by weight, acid generator (B): 0.01–70 parts by weight, alkali-soluble resin: 100 parts by weight, and crosslinking agent: 5–95 parts by weight.

A more preferable proportion is as follows:
(2-2) Compound (A): 0.005–10 parts by weight, acid generator (B): 0.1–50 parts by weight, alkali-soluble resin: 100 parts by weight, and crosslinking agent: 15–85 parts by weight.

A particularly preferable proportion is as follows:
(2-3) Compound (A): 0.01–3 parts by weight, acid generator (B): 0.5–20 parts by weight, alkali-soluble resin: 100 parts by weight, and crosslinking agent: 20–75 parts by weight.

Additives

Additives such as acid diffusion control agents other than the compound (A) (hereinafter referred to as "other acid diffusion control agents"), surfactants, and sensitizers may be optionally added to the positive tone radiation-sensitive resin composition of the first invention and the negative tone radiation-sensitive resin composition of the second invention. In addition, the above-described alkali-soluble resins and/or alkali solubility control agents may be added to the positive tone radiation-sensitive resin composition of the first invention in which an acid-dissociable group-containing resin is used.

As examples of the other acid diffusion control agents, a compound shown by the following formula (25) (hereinafter referred to as "nitrogen-containing compound (I')"),

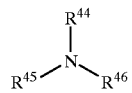

(25)

wherein $R^{44}$, $R^{45}$, and $R^{46}$ individually represent a hydrogen atom or a linear, branched, or cyclic alkyl group, aryl group, or aralkyl group which are either substituted or unsubstituted, a compound having two nitrogen atoms in the molecule (hereinafter referred to as "nitrogen-containing compound (II')"), a compound having three or more nitrogen atoms in the molecule (hereinafter referred to as "nitrogen-containing compound (III')"), an amide group-containing compound, urea compound, nitrogen-containing heterocyclic compound, and the like can be given.

Given as examples of the nitrogen-containing compound (I') are, in addition to the nitrogen-containing compounds (I) described previously in connection with the amino compound (a), trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethyamine, methyldicyclohexylamine, and tricyclohexylamine; alkanolamines such as ethanolamine, diethanolamine, and triethanolamine; and the like.

As examples of the nitrogen-containing compound (II'), in addition to the nitrogen-containing compounds (II) described previously in connection with the amino compound (a),
N,N,N'N'-tetramethylethylenediamine,
N,N,N'N'-tetrakis(2-hydroxyethyl)ethylenediamine,
N,N,N'N'-tetrakis(2-hydroxypropyl)ethylenediamine, and the like can be given.

As examples of the nitrogen-containing compound (III'), in addition to the nitrogen-containing compounds (III) described above in connection with the amino compound (a), polymers of polyethylene imine or N-(2-dimethylaminoethyl)acrylamide, and the like can be given.

As examples of the amide group-containing compound, N,N-dimethylformamide, N,N-dimethylacetamide, N-methylpyrrolidone, and the like can be given.

As examples of the urea compound, in addition to the urea compounds previously given as examples of the amino compound (a), 1,1,3,3-tetramethylurea and the like can be given.

Examples of the nitrogen-containing heterocyclic compounds include, in addition to the nitrogen-containing heterocyclic compounds previously given as examples of the amino compound (a), pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 8-oxyquinoline, and acridine; pyrazine, pyridazine, quinoxaline, 4-methylmorpholine, 1,4-dimethylpiperazine, 1,4-diazabicyclo[2.2.2]octane; and the like.

Of these other acid diffusion control agents, the nitrogen-containing compounds (I'), the nitrogen-containing compound (II') and the nitrogen-containing heterocyclic compounds are preferable.

These other acid diffusion control agents may be used either individually or in combination of two or more.

The proportion of the other acid diffusion control agents to be added is 90 wt % or less, preferably 70 wt % or less, and still more preferably 50 wt % or less of the total amount of acid diffusion control agents. If the proportion of other acid diffusion control agents exceeds 90 wt %, the desired effects of the present invention may be impaired.

Surfactants improve applicability, striation, and developability of the radiation-sensitive resin composition. As surfactants, any of anionic-type surfactants, cationic-type surfactants, nonionic-type surfactants, and ampholytic-type surfactants may be used. Of these, nonionic-type surfactants are preferable.

As examples of nonionic-type surfactants, polyoxyethylene higher alkyl ethers, polyoxyethylene higher alkyl phenyl ethers, higher fatty acid diesters of polyethylene glycol, commercially available products such as KP (manufactured by Shin-Etsu Chemical Co., Ltd.), Poly flow (manufactured by Kyoeisha Chemical Co., Ltd.), EFTOP (manufactured by TOHKEM PRODUCTS CORPORATION), MEGAFAC (manufactured by Dainippon Ink and Chemicals, Inc.), Fluorad (manufactured by Sumitomo 3M, Ltd.), Asahi Guard, Surflon (manufactured by Asahi Glass Co., Ltd.), and the like can be given.

These surfactants may be used either individually or in combination of two or more. The proportion of the surfactants to be added is 2 parts by weight or less, as an effective component, for 100 parts by weight of the total resin component in the radiation-sensitive resin composition.

Sensitizers absorb energy of radiation and transmit the energy to the acid generator (B), thereby increasing the amount of an acid to be generated upon exposure. The sensitizers improve apparent sensitivity of the radiation-sensitive resin composition.

As examples of preferable sensitizers, acetophenones, benzophenones, naphthalenes, biacetyl, Eosine, Rose Bengale, pyrenes, anthracenes, phenothiazines, and the like can be given.

These sensitizers may be used either individually or in combination of two or more.

The amount of sensitizers to be added is 50 parts by weight or less, and preferably 30 parts by weight or less, for 100 parts by weight of the total amount of resins in the radiation-sensitive resin composition.

In addition, alicyclic additives which further improve dry etching resistance, pattern shape, adhesion to substrate, or the like may be added to the radiation-sensitive resin composition in which the above resin (ii) is used.

Examples of such alicyclic additives include adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like.

These alicyclic additives may be used either individually or in combination of two or more.

The amount of the alicyclic additives to be added is 50 parts by weight or less, and preferably 30 parts by weight or less for 100 parts by weight of the resin (ii). If the amount of alicyclic additives exceeds 50 parts by weight, heat resistance as a resist tends to decrease.

The addition of dyes and/or pigments visualizes the latent image of the exposed area to relax the effect of halation at the time of exposure. Use of adhesion adjuvants improves adhesiveness to the substrate.

As other additives, halation inhibitors, preservation stabilizers, antifoaming agents, form improvers, and the like can be added. Specific additives include 4-hydroxy-4'-methylchalcone, and the like.

Solvent

The positive tone radiation-sensitive resin composition of the first invention and negative tone radiation-sensitive resin composition of the second invention can be prepared as a solution composition by dissolving the components in a solvent so that the solid content is 2–50 wt %, for example, and filtering the mixture through a filter with a pore diameter of about 0.2 $\mu$m.

As examples of solvents, ethers, esters, ether esters, ketones, ketoneesters, amides, amideesters, lactams, lactones, (halogenated) hydrocarbons, and the like can be given. Specific examples include ethylene glycol monoalkyl ethers, diethylene glycol dialkyl ethers, propylene glycol monoalkyl ethers, propylene glycol dialkyl ethers, ethylene glycol monoalkyl ether acetates, propylene glycolmonoalkyl ether acetates, acetic acid esters, hydroxyacetates, alkoxyacetates, acetoacetates, propionates, lactates, alkoxypropionate, butyrates, pyruvates, (non)cyclic ketones, N,N-dialkylformamides, N,N-dialkylacetamides, N-alkylpyrrolidones, y-lactones, (halogenated) aliphatic hydrocarbons, (halogenated) aromatic hydrocarbons, and the like.

Examples of specific compounds used as a solvent include ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycolmono-n-propyl ether acetate, propylene glycol monomethyl ether acetate, propylene glycol monoethyl ether acetate, propylene glycol mono-n-propyl ether acetate, ethyl acetate, n-propyl acetate, n-butyl acetate, isopropenyl acetate, 3-methoxybutyl acetate, 3-methyl-3-methoxybutyl acetate, hydroxyethyl acetate, ethoxyethyl acetate, methyl acetoacetate, ethyl acetoacetate, isopropenyl propionate, 3-methyl-3-methoxybutyl propionate, ethyl lactate, ethyl 2-hydroxy-2-methyl propionate, methyl 3-methoxy propionate, ethyl 3-methoxy propionate, 3-methyl-3-methoxybutyl butyrate, methyl 2-hydroxy-3-methyl butyrate, cyclohexanone, methyl ethyl ketone, 2-heptanone, 3-heptanone, 4-heptanone, N,N-dimethylformamide, N,N-dimethylacetamide, N-methylpyrrolidone, toluene, xylene, and the like.

Of these solvents, propylene glycol monoalkyl ether acetates, lactates, 3-alkoxypropionates, cyclic or non-cyclic ketones, and the like are preferable.

These solvents may be used either individually or in combination of two or more.

One or more solvents with a high boiling point may be added to the solvent. Examples of such solvents with a high boiling point include benzyl ethyl ether, di-n-hexyl ether, diethylene glycolmonomethyl ether, diethylene glycolmonoethyl ether, acetonylacetone, isophorone, caproicacid, caprylicacid, 1-octanol, 1-nonanol, benzyl alcohol, benzyl acetate, ethyl benzoate, diethyl oxalate, diethyl maleate, y-butyrolactone, ethylene carbonate, propylene carbonate, ethylene glycol monophenyl ether acetate, and the like.

Formation of Resist Patterns

When a resist pattern is formed from the positive tone radiation-sensitive resin composition of the first invention or the negative tone radiation-sensitive resin composition of the second invention, the solution composition prepared as described above is applied to, for example, substrates such as a silicon wafer and a wafer coated with aluminum by rotational coating, cast coating, roll coating, or the like to form a resist coating. After the resist coating is treated with heat (pre-baking, hereinafter referred to as "PB"), the coating is exposed to radiation through a specific mask pattern. As radiation which can be used here, far ultraviolet rays such as a bright line spectrum of a mercury lamp (wavelength: 254 nm), KrF excimer laster (wavelength: 248 nm), and ArF excimer laser (wavelength: 193 nm) are preferable. In addition, X-rays such as synchrotron radiation, charged particle rays such as electron beams, and the like can be used according to the types of acid generator (b). The exposure conditions such as the dose of radiation are appropriately determined according to the composition of the radiation-sensitive resin composition, types of additives, and the like.

After exposure, a post exposure bake (hereinafter referred to as "PEB") is preferably performed in order to improve the apparent sensitivity of the resist. PEB is performed at a temperature of 30–200° C., and preferably 50–150° C., although the temperature varies depending on the composition of the radiation-sensitive resin composition, types of additives, and the like.

The resist coating is then developed using an alkaline developer to form a specific resist pattern.

As the alkaline developer, an alkaline aqueous solution in which one or more alkaline compounds such as an alkaline metal hydroxide, aqueous ammonia, alkylamines, alkanolamines, heterocyclic amines, tetraalkylammonium hydroxides, choline, 1,8-diazabicyclo[5.4.0]-7-undecene, and 1,5-diazabicyclo[4.3.0]-5-nonene are dissolved at a concentration of 1–10 wt %, and preferably 2–5 wt % is used. Of these, an aqueous solution of tetraalkylammonium hydroxides is particularly preferable. An appropriate amount of a water-soluble organic solvent such as methanol and ethanol, surfactants, and the like may be added to a developer consisting of an alkaline aqueous solution.

When using a developer consisting of an alkaline aqueous solution, the resist coating is generally washed with water after development.

EXAMPLES

The embodiments of the present invention will be described in more detail by examples. However, these examples should not be construed as limiting the present invention.

Positive tone radiation-sensitive resin composition (compositions comprising resin (i))

Examples 1–11 and Comparative Examples 1–2

Components shown in Table 1 (part(s) indicates part(s) by weight) were mixed to prepare homogeneous solutions. The solutions were filtered through a membrane filter with a pore diameter of 0.2 μm to prepare solution compositions. The solution composition was spin-coated on a silicon wafer. PB was then performed under the conditions shown in Table 2 to form a resist coating with a thickness of 0.5 μm.

In Example 1–10 and Comparative Examples 1–2, the resist coatings were exposed to excimer laser with a wavelength of 248 nm using a KrF excimer laser irradiation apparatus "NSR-2205 EX12B" (manufactured by Nikon Corp., numerical aperture: 0.55) through a mask pattern while changing the dose of radiation. In Example 11, the resist coatings were exposed to electron beams through a mask pattern while changing the dose of radiation using an electron beam lithography system "HL700" (manufactured by Hitachi, Ltd., acceleration voltage: 30 KeV) in which the acceleration voltage was remodeled to 50 KeV. Then, PEB was performed under the conditions shown in Table 2. The resist coatings were developed at 23° C. for 60 seconds by a paddle method using a 2.38 wt % tetramethyl ammonium hydroxide aqueous solution. The resist coatings were then washed with deionized water for 30 seconds and dried to form a resist pattern. The evaluation results are shown in Table 3.

TABLE 1

| | Acid diffusion control agent (part) | Acid generator (B) (part) | Acid dissociable group-containing resin (part) | Solvent (part) |
|---|---|---|---|---|
| Example 1 | A-1 (0.20) | B-1 (6) | C1-1 (100) | S-1 (400) S-2 (200) |
| Example 2 | A-5 (0.15) | B-1 (6) B-2 (3) | C1-2 (100) | S-1 (400) S-3 (200) |
| Example 3 | A-3 (0.10) α-3 (0.10) | B-6 (6) | C1-3 (100) | S-4 (600) |
| Example 4 | A-5 (0.20) | B-1 (12) | C1-4 (100) | S-1 (400) S-3 (200) |
| Example 5 | A-3 (0.20) | B-1 (3) B-2 (6) | C1-6 (100) | S-3 (600) |
| Example 6 | A-2 (0.20) | B-1 (5) | C1-1 (50) C1-7 (50) | S-1 (200) S-3 (400) |
| Example 7 | A-2 (0.10) A-3 (0.15) | B-1 (4) B-3 (3) | C1-2 (100) | S-1 (600) |
| Example 8 | A-5 (0.25) | B-1 (4) B-4 (4) | C1-5 (100) | S-1 (400) S-2 (200) |
| Example 9 | A-2 (0.15) α-2 (0.15) | B-4 (5) | C1-2 (50) C1-6 (50) | S-1 (200) S-3 (400) |
| Example 10 | A-4 (0.30) | B-4 (2) B-5 (2) | C1-6 (100) | S-1 (400) S-2 (200) |
| Example 11 | A-2 (0.15) | B-7 (4) | C1-2 (100) | S-1 (100) S-2 (500) |
| Comparative Example 1 | α-1 (0.30) | B-4 (3) B-5 (1) | C1-6 (100) | S-1 (400) S-4 (200) |
| Comparative Example 2 | α-3 (0.20) | B-1 (10) | C1-2 (100) | S-1 (400) S-2 (200) |

TABLE 2

| | PB | | | PEB | |
|---|---|---|---|---|---|
| | Temp. (° C.) | Time (sec) | Light source | Temp. (° C.) | Time (sec) |
| Example 1 | 100 | 60 | KrF excimer laser | 90 | 60 |
| Example 2 | 130 | 60 | KrF excimer laser | 130 | 60 |
| Example 3 | 90 | 90 | KrF excimer laser | 100 | 90 |
| Example 4 | 130 | 60 | KrF excimer laser | 130 | 60 |
| Example 5 | 120 | 60 | KrF excimer laser | 130 | 60 |
| Example 6 | 100 | 90 | KrF excimer laser | 110 | 90 |
| Example 7 | 130 | 60 | KrF excimer laser | 130 | 60 |
| Example 8 | 130 | 60 | KrF excimer laser | 130 | 60 |
| Example 9 | 130 | 60 | KrF excimer laser | 130 | 60 |
| Example 10 | 130 | 60 | KrF excimer laser | 140 | 60 |
| Example 11 | 130 | 60 | Electron beams | 130 | 60 |
| Comparative Example 1 | 140 | 90 | KrF excimer laser | 140 | 90 |
| Comparative Example 2 | 130 | 60 | KrF excimer laser | 130 | 60 |

TABLE 3

| | Sensitivity | Resolution (μm) 1L1S | Resolution (μm) 1L5S | DOF (μm) 1L5S | Storage stability |
|---|---|---|---|---|---|
| Example 1 | $3.5 \times 10^2$ J/m$^2$ | 0.18 | 0.18 | 0.8 | AAA |
| Example 2 | $3.3 \times 10^2$ J/m$^2$ | 0.17 | 0.18 | 0.8 | AAA |
| Example 3 | $3.6 \times 10^2$ J/m$^2$ | 0.18 | 0.18 | 0.8 | AAA |
| Example 4 | $3.4 \times 10^2$ J/m$^2$ | 0.17 | 0.18 | 0.8 | AAA |
| Example 5 | $3.5 \times 10^2$ J/m$^2$ | 0.17 | 0.18 | 0.7 | AAA |
| Example 6 | $3.2 \times 10^2$ J/m$^2$ | 0.18 | 0.18 | 0.8 | AAA |
| Example 7 | $3.5 \times 10^2$ J/m$^2$ | 0.17 | 0.18 | 0.7 | AAA |
| Example 8 | $3.4 \times 10^2$ J/m$^2$ | 0.16 | 0.18 | 0.8 | AAA |
| Example 9 | $3.3 \times 10^2$ J/m$^2$ | 0.18 | 0.18 | 0.7 | AAA |

TABLE 3-continued

|  | Sensitivity | Resolution (μm) 1L1S | Resolution (μm) 1L5S | DOF (μm) 1L5S | Storage stability |
|---|---|---|---|---|---|
| Example 10 | $3.2 \times 10^2$ J/m² | 0.18 | 0.18 | 0.7 | AAA |
| Example 11 | $4 \times 10^{-2}$ C/m² | 0.17 | 0.18 | — | — |
| Comparative Example 1 | $3.3 \times 10^2$ J/m² | 0.18 | 0.20 | 0.6 | BBB |
| Comparative Example 2 | $3.5 \times 10^2$ J/m² | 0.17 | 0.22 | 0.6 | CCC* |

*Highly sensitive to the optimum dose of irridiation.

Evaluation of resists was carried out as follows.

Sensitivity

An optimum dose at which a line-and-space (1L1S) pattern with a line width of 0.20 μm was formed was taken as sensitivity. The evaluation was carried out at this optimum dose.

Resolution (1L1S)

The minimum dimension (μm) resolved at the optimum dose on the line-and-space pattern (1L1S) of a designed width of 0.20 μm was taken as the resolution (1L1S).

Resolution (1L5S)

An isolated line pattern (1L5S) with a designed dimension of 0.20 μm was exposed to the optimum dose for the above line-and-space pattern (1L1S). The minimum dimension (μm) in which the resolved line width is within the range of "designed dimension +10%" was taken as the resolution (1L5S). The difference between the resolution (1L1S) and the resolution (1L5S) indicates the difference in dimensions due to different thickness of patterns, specifically, the degree of an optical proximity effect.

DOF(1L5S)

A dose required for an isolated line pattern (1L5S) with a designed dimension of 0.20 μm to form a 1:5 line width was taken as the optimum dose for the isolated line pattern (1L5S). A focus depth was taken at this optimum dose to determine the range of the depth of focus in which the line width of the pattern was within the range of "design dimensions +10%". The range of the depth of focus as determined was taken as a standard for the depth of focus (DOF) (1L5S) of the isolated line pattern (1L5S) The wider the range of DOF, the greater the process margin and higher the yield of device production.

Storage Stability

The evaluation results of the resist when the solution composition was stored at 23° C. for six months after the preparation was compared with the results obtained immediately after the preparation. The storage stability was evaluated according to the following standard.

A sample exhibiting no change in the resolution and pattern configuration and exhibiting a change in the optimum dose for a line-and-space pattern (1L1S) with a designed dimension of 0.20 μm of less than ±2% was rated as "AAA".

A sample exhibiting no change in the resolution and pattern configuration and exhibiting the change in the optimum dose for a line-and-space pattern (1L1S) with a designed dimension of 0.20 μm in the range of ±2–5% was rated as "BBB".

A sample exhibiting a change in at least either of the resolution or the pattern configuration and exhibiting the change in the optimum dose for a line-and-space pattern (1L1S) with a designed dimension of 0.20 μm of greater than ±5% was rated as "CCC".

The following components were used in Examples and Comparative Examples.

Acid Diffusion Control Agent

Compound (A)
- A-1: N-t-butoxycarbonyl-1-adamantylamine
- A-2: N-t-butoxycarbonyldi-n-octylamine
- A-3: N-t-butoxycarbonyldicyclohexylamine
- A-4: N-t-butoxycarbonyl-4,4'-diaminodiphenylmethane
- A-5: N-t-butoxycarbonyl-2-phenylbenzimidazole Other Compounds
- α-1: Methyldicyclohexylamine
- α-2: N,N,N',N'-Tetrakis(2-hydroxypropyl)ethylenediamine
- α-3: 2-Phenylbenzimidazole Acid generator (B)
- B-1: N-(trifluoromethanesulfonyloxy)bicyclo[2.2.1]hept-5-ene-2,3-dicarboxyimide
- B-2: N-{(5-methyl-5-carboxymethanebicyclo[2,2,1]hept-2-yl)sulfonyloxy}succinimide
- B-3: N-(10-Camphorsulfonyloxy)succinimide
- B-4: Bis(4-t-butylphenyl)iodonium 10-camphorsulfonate
- B-5: Bis(4-t-butylphenyl)iodonium nonafluoro-n-butanesulfonate
- B-6: Bis(cyclohexanesulfonyl)diazomethane
- B-7: Triphenylsulfonium trifluoromethanesulfonate Acid-dissociable Group-containing Resin (i)
- C1-1: Resin having a structure in which 26 mol % of the hydrogen atoms of phenolic hydroxyl groups in poly(p-hydroxystyrene) has been replaced by t-butoxycarbonyl groups (Mw=9,000)
- C1-2: t-Butoxystyrene/p-hydroxystyrene/styrene copolymer (monomer ratio: 25:60:5, Mw=15,000)
- C1-3: Resin having a structure in which 10 mol % of the hydrogen atoms of phenolic hydroxyl groups in poly(p-hydroxystyrene) has been replaced by t-butyl groups and 20 mol % has been replaced by 1-ethoxyethyl groups (Mw=12,000)
- C1-4: t-Butoxystyrene/p-hydroxystyrene/2,5-dimethyl-2,5-hexanedioldiacrylate copolymer (monomer ratio: 25:72:3, Mw=30,000)
- C1-5: t-Butoxystyrene/t-butylacrylate/p-hydroxystyrene copolymer (monomer ratio: 15:15:70, Mw=16,000)
- C1-6: t-Butylacrylate/p-hydroxystyrene/styrene copolymer (monomer ratio: 20:60:20, Mw=13,000)
- C1-7: Resin having a structure in which 30 mol % of the hydrogen atoms of phenolic hydroxyl groups in poly(p-hydroxystyrene) has been replaced by 1-cyclohexyloxyethyl groups (Mw=12,000)

Solvent
- S-1: Ethyl lactate
- S-2: Ethyl 3-ethoxypropionate
- S-3: Propylene glycol monomethyl ether acetate
- S-4: 2-Heptanone Negative tone radiation-sensitive resin composition Examples 12–13 and Comparative Example 3

Components shown in Table 4 (part(s) indicates part(s) by weight) were mixed to prepare homogeneous solutions. The solutions were filtered through a membrane filter with a pore diameter of 0.2 μm to prepare solution compositions. The solution composition was spin-coated on a silicon wafer. PB was then performed under the conditions shown in Table 5 to form a resist coating with a thickness of 0.5 μm.

The resist coatings were exposed to excimer laser with a wavelength of 248 nm using a KrF excimer laser irradiation apparatus "NSR-2205 EX12B" (manufactured by Nikon Corp., numerical aperture: 0.55) through a mask pattern while changing the dose of radiation, following which PEB was performed under the conditions shown in Table 5. The resist coatings were developed at 23° C. for 60 seconds by a paddle method using a 2.38 wt % tetramethyl ammonium hydroxide aqueous solution. The resist coatings were then washed with deionized water for 30 seconds and dried to form a resist pattern. The evaluation results are shown in Table 6.

TABLE 4

| | Acid diffusion control agent (part) | Acid generator (B) (part) | Alkali-soluble resin (part) | Cross-linking agent (part) | Solvent (part) |
|---|---|---|---|---|---|
| Example 12 | A-3 (0.45) | B-6 (2.5) | D-1 (50) D-2 (50) | E-1 (7) | S-1 (600) |
| Example 13 | A-5 (0.45) | B-6 (2.5) | D-1 (50) D-2 (50) | E-2 (7) | S-1 (600) |
| Comparative Example 3 | α-1 (0.45) | B-6 (2.5) | D-1 (50) D-2 (50) | E-1 (7) | S-1 (600) |

TABLE 5

| | PB | | | PEB | |
|---|---|---|---|---|---|
| | Temp. (° C.) | Time (sec) | Light source | Temp. (° C.) | Time (sec) |
| Example 12 | 90 | 90 | KrF excimer laser | 110 | 90 |
| Example 13 | 80 | 90 | KrF excimer laser | 120 | 90 |
| Comparative Example 3 | 90 | 90 | KrF excimer laser | 110 | 90 |

TABLE 6

| | | Resolution ($\mu$m) | | DOF ($\mu$m) | Storage |
|---|---|---|---|---|---|
| | Sensitivity | 1L1S | 1L5S | 1L5S | stability |
| Example 12 | $4.3 \times 10^2$ J/m$^2$ | 0.18 | 0.18 | 0.8 | AAA |
| Example 13 | $4.7 \times 10^2$ J/m$^2$ | 0.18 | 0.18 | 0.8 | AAA |
| Comparative Example 3 | $4.5 \times 10^2$ J/m$^2$ | 0.18 | 0.20 | 0.6 | CCC |

Evaluation of resists was carried out in the same manner as in the above Examples.

The following components were used.
Acid diffusion control agent
  (I) The same compounds used for the positive tone radiation-sensitive resin compositions were used.
Acid generator (B)
  (I) The same compounds used for the positive tone radiation-sensitive resin compositions were used.
Alkali-soluble resin
  D-1: Poly(p-hydroxystyrene) (Mw=7,500)
  D-2: p-Hydroxystyrene/styrenecopolymer (monomer ratio: 8:2, Mw=4,000)
Crosslinking agent
  E-1: Dimethoxymethylurea ("MX290" manufactured by Sanwa Chemical Co., Ltd.)
  E-2: Tetramethoxymethyl glycoluril ("CYMEL 1174" manufactured by Mitsui Cyanamid Co., Ltd.)

Solvent
  (I) The same solvents used for the positive tone radiation-sensitive resin compositions were used.

Positive tone radiation-sensitive resin composition (compositions comprising resin (ii))

Synthesis Example 1

A separable flask equipped with a reflux condenser was charged with 135.2 g of 5-t-butoxycarbonylbicyclo[2.2.1]hept-2-ene, 68.3 g of maleic anhydride, 77.4 g of 3-hydroxy-1-adamantylacrylate, 28 g of azobisisobutyronitrile, and 280 g of n-butyl acetate under nitrogen stream. The polymerization reaction was carried out at 70° C. for 6 hours. After the polymerization, the reaction mixture was cooled to room temperature and poured into a large amount of a 1:4 (by weight) mixture of n-butyl acetate and n-hexane to cause the resin to coagulate. The coagulated resin was washed with n-hexane several times and dried under vacuum to obtain a resin containing 40 mol % of the recurring unit (Ia), 40 mol % of the recurring unit (II), and 20 mol % of the recurring unit (IIIa), shown by the following formulas, and having Mw of 7,000 at a yield of 70 wt %. This resin is referred to as Resin (C2-1)

(Ia)

(II)

(IIIa)

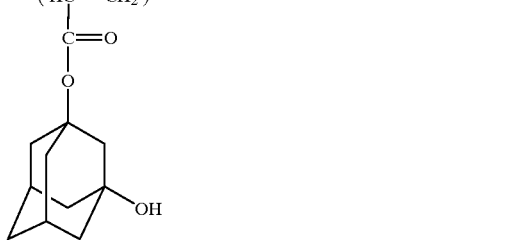

Synthesis Example 2

A separable flask equipped with a reflux condenser was charged with 16.2 g of bicyclo[2.2.1]hept-2-ene, 46.3 g of 8-hydroxytetracyclo[4.4.0.1$^{2,5}$.1$^{7,10}$]dodec-3-ene, 45.1 g of maleic anhydride, 92.4 g of 2-methyl-2-adamantylmethacrylate, 40 g of azobisisobutyronitrile, and 200 g of n-butyl acetate under nitrogen stream. The polymerization reaction was carried out at 70° C. for 6 hours. After the polymerization, the reaction mixture was cooled to room temperature and poured into a large amount of a 1:4 (by weight) mixture of n-butyl acetate and n-hexane to cause the resin to coagulate. The coagulated resin was washed with n-hexane several times and dried under vacuum to obtain a resin containing 15 mol % of the recurring unit (Ib), 20 mol % of the recurring unit (Ic), 35 mol % of the recurring unit (II), and 30 mol % of the recurring unit (IVa), shown by the following formulas, and having Mw of 6,500 at a yield of 65 wt %. This resin is referred to as Resin (C2-2).

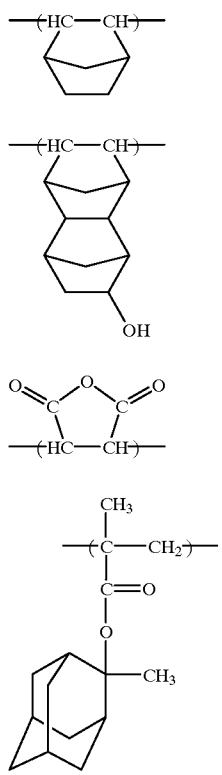

(Ib)

(Ic)

(II)

(IVa)

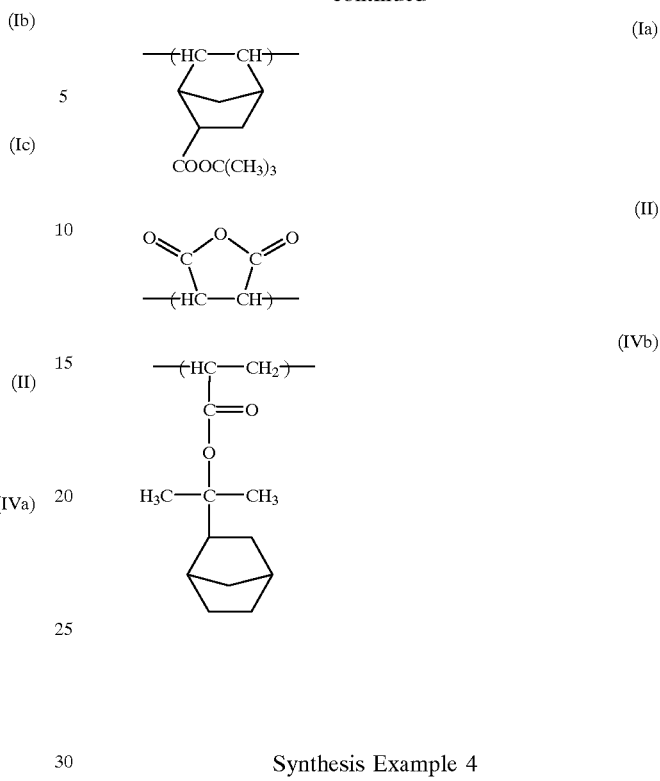

(Ia)

(II)

(IVb)

Synthesis Example 3

A separable flask equipped with a reflux condenser was charged with 50.3 g of 8-hydroxymethyltetracyclo-[4.4.0.1$^{2,5}$.1$^{7,10}$]dodec-3-ene, 38.5 g of 5-t-butoxycarbonylbicyclo[2.2.1]hept-2-ene, 45.3 g of maleic anhydride, 65.9 g of 2-(2-acryloyloxy-2'-propyl)bicyclo[2.2.1]heptane, 20 g of azobisisobutyronitrile, and 200 g of n-butyl acetate under nitrogen stream. The polymerization reaction was carried out at 70° C. for 6 hours. After the polymerization, the reaction mixture was cooled to room temperature and poured into a large amount of a 1:4 (by weight) mixture of n-butyl acetate and n-hexane to cause the resin to coagulate. The coagulated resin was washed with n-hexane several times and dried under vacuum to obtain a resin containing 20 mol % of the recurring unit (Id), 15 mol % of the recurring unit (Ia), 35 mol % of the recurring unit (II), and 30 mol % of the recurring unit (IVb), shown by the following formulas, and having Mw of 9,000 at a yield of 75 wt %. This resin is referred to as Resin (C2-3).

(Id)

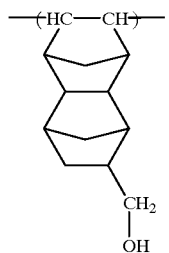

Synthesis Example 4

A separable flask equipped with a reflux condenser was charged with 89.3 g of 8-t-butoxycarbonyltetracyclo-[4.4.0.1$^{2,5}$.1$^{7,10}$]dodec-3-ene, 33.6 g of maleic anhydride, 77.1 g of the compound shown by the formula (III-1), 20 g of azobisisobutyronitrile, and 200 g of n-butyl acetate under nitrogen stream. The polymerization reaction was carried out at 70° C. for 6 hours. After the polymerization, the reaction mixture was cooled to room temperature and poured into a large amount of a 1:4 (by weight) mixture of n-butyl acetate and n-hexane to cause the resin to coagulate. The coagulated resin was washed with n-hexane several times and dried under vacuum to obtain a resin containing 35 mol % of the recurring unit (Ie), 35 mol % of the recurring unit (II), and 30 mol % of the recurring unit (IIIb), shown by the following formulas, and having Mw of 5,500 at a yield of 60 wt %. This resin is referred to as Resin (C2-4)

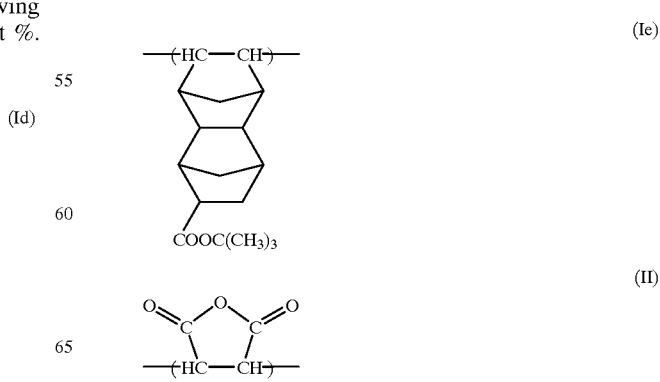

(Ie)

(II)

-continued

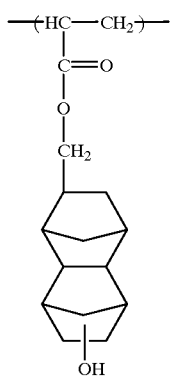
(IIIb)

Examples 14–21 and Comparative Example 4

Each composition solution having components shown in Table 7 was evaluated. The evaluation results are shown in Table 9.

Measurement and evaluation of each composition were carried out as follows.

Mw

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Radiation Transmittance A solution composition was applied to a quartz plate and the coating was post-baked on a hot plate at 90° C. for 60 seconds to obtain a resist coating with a thickness of 1 μm. Radiation transmittance of the resist coating was calculated from absorbance at a wavelength of 193 nm and was adopted as a standard for transparency in the deep UV ray region.

Sensitivity

A solution composition was applied to a silicon wafer with a 520 Å thickness Deep UV30 film (manufactured by Brewer Science Corp.) coated on the surface by spin coating and post-baked on a hot plate under the conditions shown in Table 8 to obtain a resist coating with a thickness of 0.3 μm. The coating was exposed to radiation through a mask pattern using an ArF excimer laser exposure apparatus (manufactured by Nikon Corp., lens numerical aperture: 0.55, wavelength: 193 nm). After PEB under the conditions shown in Table 8, the resist coatings were developed in a 2.38 wt % tetramethylammonium hydroxide aqueous solution (Examples 14–21) or 2.38×1/50 wt % tetramethylammonium hydroxide aqueous solution (Comparative Example 4) at 25° C. for 1 minute, washed with water, and dried to form a positive-tone resist pattern. An optimum dose at which a line-and-space (1L1S) pattern with a line width of 0.18 μm was formed was taken as sensitivity.

Resolution

Minimum dimensions of the resist pattern resolved at the optimum dose was taken as the resolution of the resist coating.

Pattern Configuration

The length of the bottom (Lb) and top (Lt) of a square cross-section of a line-and-space (1L1S) pattern with a line width of 0.20 μm was measured by a scanning electron microscope. The pattern configuration was judged as "Good" when $0.85 \leq Lt/Lb \leq 1$ was satisfied and the pattern did not have a skirt-like extension.

Storage Stability

Resist coatings were formed and evaluated under the above-described conditions using the solution compositions stored at 23° C. after preparation, and compared with the resist coatings formed immediately after the preparation. A measure of storage stability of a sample was indicated by the maximum number of days during which the sample (i) exhibited no change in the resolution and pattern configuration, (ii) did not exhibit a change in sensitivity exceeding 5%, and did not exhibit a coating thickness increase of more than 50% of the thickness of the coating formed immediately after the preparation of the solution composition when the coating was formed from the solution composition after storing by applying and drying the composition under the same conditions.

Components other than the resins (C2-1) to (C2-4) shown in Tables 1 are as follows.

Acid diffusion control agent
Compound (A)
(I) The same compounds as used for the positive tone radiation-sensitive resin compositions were used.

Other compounds
α-4: 1-Piperidine ethanol

Acid generator (B)
B-5: Bis(4-t-butylphenyl)iodonium nonafluoro-n-butanesulfonate
B-8: Triphenylsulfonium nonafluoro-n-butanesulfonate Other additives
F-1: Di-t-butyl 1,3-adamantanedicarboxylate
F-2: t-Butoxycarbonylmethyl deoxycholate Solvent
S-3: Propylene glycol monoethyl ether acetate
S-4: 2-Heptanone
S-5: Cyclohexanone

TABLE 7

| | Acid diffusion control agent (part) | Acid generator (B) (part) | Resin (C) (part) | Other additive (part) | Solvent (part) |
|---|---|---|---|---|---|
| Example 14 | A-3 (0.04) | B-8 (1.5) | C2-1 (100) | — | S-4 (530) |
| Example 15 | A-3 (0.04) | B-8 (1.5) | C2-1 (90) | F-1 (10) | S-4 (530) |
| Example 16 | A-3 (0.05) | B-8 (2.0) | C2-2 (100) | — | S-4 (480) S-5 (50) |
| Example 17 | A-5 (0.06) | B-8 (2.0) | C2-1 (90) | F-1 (10) | S-4 (530) |
| Example 18 | A-5 (0.06) | B-5 (3.0) | C2-1 (85) | F-2 (15) | S-4 (530) |
| Example 19 | A-5 (0.06) | B-8 (2.0) | C2-2 (90) | F-1 (10) | S-4 (480) S-5 (50) |
| Example 20 | A-2 (0.05) | B-8 (1.5) | C2-3 (85) | F-2 (15) | S-3 (530) |
| Example 21 | A-4 (0.05) | B-5 (2.0) | C2-3 (85) | F-2 (15) | S-3 (265) S-4 (265) |
| Comparative Example 4 | α-4 (0.03) | B-8 (2.0) | C2-1 (100) | — | S-4 (530) |

TABLE 8

| | Thickness of resist coating (μm) | Substrate | PB Temp. (° C.) | PB Time (sec) | PEB Temp. (° C.) | PEB Time (sec) |
|---|---|---|---|---|---|---|
| Example 14 | 0.3 | ARC | 130 | 90 | 130 | 90 |
| Example 15 | 0.3 | ARC | 130 | 90 | 130 | 90 |
| Example 16 | 0.3 | ARC | 130 | 90 | 130 | 90 |
| Example 17 | 0.3 | ARC | 130 | 90 | 130 | 90 |
| Example 18 | 0.3 | ARC | 130 | 90 | 130 | 90 |

TABLE 8-continued

| | Thickness of resist coating (μm) | Substrate | PB Temp. (° C.) | PB Time (sec) | PEB Temp. (° C.) | PEB Time (sec) |
|---|---|---|---|---|---|---|
| Example 19 | 0.3 | ARC | 130 | 90 | 130 | 90 |
| Example 20 | 0.3 | ARC | 130 | 90 | 130 | 90 |
| Example 21 | 0.3 | ARC | 130 | 90 | 130 | 90 |
| Comparative Example 4 | 0.3 | ARC | 130 | 90 | 130 | 90 |

TABLE 9

| | Radiation transmittance (193 nm, %) | Sensitivity (J/m²) | Resolution (μm) | Pattern configuration | Storage stability |
|---|---|---|---|---|---|
| Example 14 | 68 | 160 | 0.15 | Good | 60 days or more |
| Example 15 | 69 | 160 | 0.15 | Good | 60 days or more |
| Example 16 | 66 | 150 | 0.15 | Good | 60 days or more |
| Example 17 | 65 | 150 | 0.15 | Good | 60 days or more |
| Example 18 | 70 | 120 | 0.15 | Good | 60 days or more |
| Example 19 | 65 | 150 | 0.15 | Good | 60 days or more |
| Example 20 | 72 | 160 | 0.15 | Good | 60 days or more |
| Example 21 | 72 | 150 | 0.15 | Good | 60 days or more |
| Comparative Example 4 | 68 | 150 | 0.18 | Good | 30 days or more |

Use of the specific compound (A) as an acid diffusion control agent makes it possible for the positive tone radiation-sensitive resin composition and negative tone radiation-sensitive resin composition of the present invention to form a resist which not only excels in sensitivity and resolution, but also exhibits only a minimal optical proximity effect and is capable of forming fine patterns at a high precision and in a stable manner even if the patterns are isolated line patterns, thereby providing isolated line patterns with a sufficient focusing allowance are desired. The compositions also exhibit superior storage stability. In addition, the both radiation-sensitive resin compositions effectively respond to various radiations such as deep ultraviolet rays, X-rays, charged electron beams, and the like.

Therefore, the positive tone radiation-sensitive resin composition and negative tone radiation-sensitive resin composition of the present invention are extremely useful as a resist for manufacturing semiconductor devices which are anticipated to become miniaturized in the future.

Obviously, numerous modifications and variations of the present invention are possible in light of the above teachings. It is therefore to be understood that, within the scope of the appended claims, the invention may be practiced otherwise than as specifically described herein.

What is claimed is:

1. A positive-tone radiation-sensitive resin composition comprising: (A) a low molecular weight compound having at least one amino group in which the nitrogen atom has at least one t-butoxycarbonyl substituent, (B) a photoacid generator, and (C-1) a resin insoluble or scarcely soluble in alkali which is protected by an acid-dissociable group and becomes soluble in alkali when the acid-dissociable group dissociates or (C-2) an alkali-soluble resin and an alkali solubility control agent.

2. The positive tone radiation-sensitive resin composition according to claim 1, wherein the low molecular weight compound (A) is at least one compound selected from the group consisting of: compounds represented by the following formula (1),

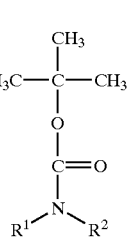

(1)

wherein $R^1$ and $R^2$ individually represent a hydrogen atom, a linear, branched, or cyclic alkyl group, aryl group, or aralkyl group which are either substituted or unsubstituted; compounds having two nitrogen atoms in the molecule; compounds having three or more nitrogen atoms in the molecule; amide group-containing compounds; urea compounds; and nitrogen-containing heterocyclic compounds.

3. The positive tone radiation-sensitive resin composition according to claim 1, wherein the low molecular weight compound (A) is a compound of which the conjugated acid has a pKa determined at 25° C. of 0 or more.

4. The positive tone radiation-sensitive resin composition according to claim 1, wherein the photoacid generator (B) is selected from the group consisting of onium salt compounds, sulfone compounds, sulfonate compounds, sulfonimide compounds, diazomethane compounds, and disulfonylmethane compounds.

5. The positive tone radiation-sensitive resin composition according to claim 1, further comprising an acid diffusion control agent which is a compound other than the low molecular weight compound (A).

6. The positive tone radiation-sensitive resin composition according to claim 5, wherein the acid diffusion control agent is a nitrogen-containing compound.

7. The positive tone radiation-sensitive resin composition according to claim 1, wherein the resin (C-1) is a resin derived from an alkali-soluble resin having any recurring unit represented by the following formulas (2)–(5), in which the hydrogen atom of an acid functional group is replaced by at least one acid-dissociable group which dissociates in the presence of an acid:

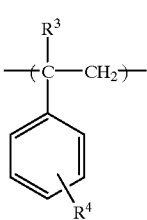

(2)

wherein $R^3$ represents a hydrogen atom or a methyl group, $R^4$ represents a hydroxyl group, a carboxyl group, $-R^5COOH$, $-OR^5COOH$, $-OCOR^5COOH$, or $-COOR^5COOH$, $R^5$ is a group $-(CH_2)_g-$, wherein g is an integer of 1–4, (3)

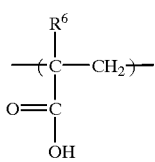

wherein $R^6$ represents a hydrogen atom or a methyl group, (4)

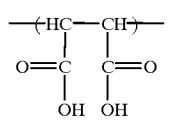

(5)

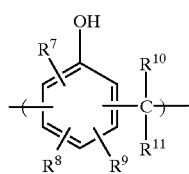

wherein $R^7$, $R^8$, $R^9$, $R^{10}$, and $R^{11}$ individually represent a hydrogen atom or an alkyl group having 1–4 carbon atoms.

8. The positive tone radiation-sensitive resin composition according to claim 7, wherein the acid-dissociable group is selected from the group consisting of a substituted methyl group, 1-substituted ethyl group, 1-substituted n-propyl group, 1-branched alkyl group, silyl group, germyl group, alkoxycarbonyl group, acyl group, and cyclic acid-dissociable group.

9. The positive tone radiation-sensitive resin composition according to claim 1, wherein the resin (C-1) is an acid-dissociable group-containing resin having the following recurring unit (I) and recurring unit (II):

(I)

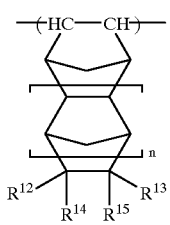

(II)

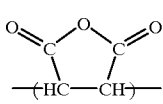

wherein $R^{12}$ and $R^{13}$ individually represent a hydrogen atom, a linear or branched alkyl group having 1–10 carbon atoms, or a linear or branched fluoroalkyl group having 1–10 carbon atoms, $R^{14}$ and $R^{15}$ individually represent a. hydrogen atom, a linear or branched alkyl group having 1–10 carbon atoms, a linear or branched fluoroalkyl group having 1–10 carbon atoms, a monovalent oxygen-containing polar group, or a monovalent nitrogen-containing polar group, or $R^{14}$ and $R^{15}$ in combination form a carboxylic acid anhydride group, and n is an integer of 0–2; and at least one of the following recurring unit (III) and recurring unit (IV):

(III)

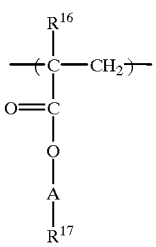

wherein $R^{16}$ represents a hydrogen atom, a linear or branched alkyl group having 1–4 carbon atoms, a linear or branched alkoxyl group having 1–4 carbon atoms, or a linear or branched hydroxyalkyl group having 1–4 carbon atoms, A represents a single bond, a methylene group, or a linear or branched alkylene group with the main chain having 2–4 carbon atoms, $R^{17}$ represents any one of the groups shown by the following formula (i) (ii), or (iii), (i)

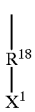

(ii)

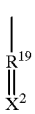

(iii)

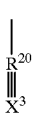

wherein $R^{18}$ represents a divalent alicyclic hydrocarbon group having 4–20 carbon atoms, $X^1$ represents a monovalent oxygen-containing polar group or a monovalent nitrogen-containing polar group, $R^{19}$ represents a trivalent alicyclic hydrocarbon group having 4–20 carbon atoms, $X^2$ represents a divalent oxygen-containing polar group or a divalent nitrogen-containing polar group, $R^{20}$ represents a tetravalent alicyclic hydrocarbon group having 4–20 carbon atoms, and $X^3$ represents a trivalent oxygen-containing polar group or a trivalent nitrogen-containing polar group, (IV)

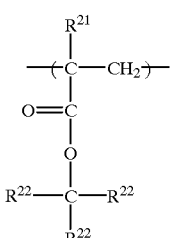

wherein $R^{21}$ represents a hydrogen atom, a linear or branched alkyl group having 1–4 carbon atoms, a linear or branched alkoxyl group having 1–4 carbon atoms, or a linear or branched hydroxyalkyl group having 1–4 carbon atoms, and $R^{22}$s individually represent a monovalent alicyclic hydrocarbon group having 4–20 carbon atoms, its derivative, or a linear or branched alkyl group having 1–4 carbon atoms, with at least one $R^{22}$ being an alicyclic hydrocarbon group or its derivative, or any two of the $R^{22}$s bond to each other to form a divalent alicyclic hydrocarbon group having 4–20 carbon atoms or its derivative, with the remaining $R^{22}$s being a monovalent alicyclic hydrocarbon group having 4–20 carbon atoms, its derivative, or a linear or branched alkyl group having 1–4 carbon atoms.

10. The positive tone radiation-sensitive resin composition according to claim 9, wherein the resin (C-1) is a resin containing the above recurring unit (III) in which $R^{17}$ is a group shown by the above formula (i) wherein $R^{18}$ represents an alicyclic hydrocarbon group having a skeleton selected from the group consisting of an adamantane skeleton, norbornane skeleton, tricyclodecane skeleton, and tetracyclododecane skeleton, and $X^1$ is a hydroxyl group, or a resin containing the above recurring unit (IV) in which each $R^{22}$ represents an alicyclic hydrocarbon group or its derivative having a skeleton independently selected from the group consisting of adamantane skeleton, norbornane skeleton, tricyclodecane skeleton, and tetracyclododecane skeleton.

11. The positive tone radiation-sensitive resin composition according to claim 9, further comprising an alicyclic additive selected from a group consisting of adamantane derivatives, deocycholates, and lithocholates.

12. The positive-tone radiation-sensitive resin composition of claim 1, wherein the low molecular weight compound is selected from the group consisting of: dialkylamines; 1-adamantylamines; hexamethylenediamine; 1,7-diaminoheptane; 1,8-diaminooctane; 1,9-diaminononane; 1,10-diaminodecane; 1,12-diaminododecane; 4,4'-diaminophenylmethane; and an imidazole; and wherein at least one amino hydrogen substituent of the low molecular weight compound is substituted by a t-butoxycarbonyl group.

* * * * *